(12) United States Patent
Moriyama et al.

(10) Patent No.: US 12,125,542 B2
(45) Date of Patent: Oct. 22, 2024

(54) SEMICONDUCTOR MEMORY DEVICE

(71) Applicant: KIOXIA CORPORATION, Tokyo (JP)

(72) Inventors: Wataru Moriyama, Yokohama (JP); Hayato Konno, Yokohama (JP); Takao Nakajima, Yamato (JP); Fumihiro Kono, Yokohama (JP); Masaki Fujiu, Yokohama (JP); Kiyoaki Iwasa, Yokohama (JP); Tadashi Someya, Edogawa (JP)

(73) Assignee: KIOXIA CORPORATION, Tokyo (JP)

( * ) Notice: Subject to any disclaimer, the term of this patent is extended or adjusted under 35 U.S.C. 154(b) by 155 days.

(21) Appl. No.: 17/695,529

(22) Filed: Mar. 15, 2022

(65) Prior Publication Data

US 2023/0056494 A1 Feb. 23, 2023

(30) Foreign Application Priority Data

Aug. 18, 2021 (JP) .................................. 2021-133721

(51) Int. Cl.
| | |
|---|---|
| *G11C 16/04* | (2006.01) |
| *G11C 16/16* | (2006.01) |
| *H01L 23/528* | (2006.01) |
| *H01L 23/535* | (2006.01) |
| *H10B 41/27* | (2023.01) |
| *H10B 43/27* | (2023.01) |

(52) U.S. Cl.
CPC .......... *G11C 16/16* (2013.01); *G11C 16/0483* (2013.01); *H01L 23/528* (2013.01); *H01L 23/535* (2013.01); *H10B 41/27* (2023.02); *H10B 43/27* (2023.02)

(58) Field of Classification Search
CPC ..... H01L 23/535; H01L 23/528; H10B 43/27; H10B 41/27
See application file for complete search history.

(56) References Cited

U.S. PATENT DOCUMENTS

| 10,276,585 B2 | 4/2019 | Utsumi |
| 2021/0118862 A1* | 4/2021 | Maejima ................ G11C 16/26 |
| 2021/0241837 A1* | 8/2021 | Date ................... G11C 11/5642 |

FOREIGN PATENT DOCUMENTS

JP 2018-26518 A 2/2018

* cited by examiner

*Primary Examiner* — Alfredo Bermudez Lozada
(74) *Attorney, Agent, or Firm* — Oblon, McClelland, Maier & Neustadt, L.L.P.

(57) ABSTRACT

A semiconductor memory device includes a plurality of word lines, a first select gate line, a second select gate line, a first semiconductor layer, a third select gate line, a fourth select gate line, a second semiconductor layer, and a word line contact electrode. The first select gate line and the third select gate line are farther from the substrate than the plurality of word lines. The second select gate line and the fourth select gate line are closer to the substrate than the plurality of word lines. The first semiconductor layer is opposed to the plurality of word lines, the first select gate line, and the second select gate line. The second semiconductor layer is opposed to the plurality of word lines, the third select gate line, and the fourth select gate line. The word line contact electrode is connected to one of the plurality of word lines.

20 Claims, 45 Drawing Sheets

BACKGROUND ART

BACKGROUND ART

SEMICONDUCTOR MEMORY DEVICE

CROSS-REFERENCE TO RELATED APPLICATIONS

This application is based upon and claims the benefit of Japanese Patent Application No. 2021-133721, filed on Aug. 18, 2021, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of word lines stacked in a direction intersecting with a surface of this substrate, a semiconductor layer opposed to these plurality of word lines, and a gate insulating layer disposed between the word lines and the semiconductor layer. The gate insulating layer includes a memory unit that can store data, and the memory unit is, for example, an insulating electric charge accumulating layer of, for example, silicon nitride ($Si_3N_4$), or a conductive electric charge accumulating layer, such as a floating gate.

DETAILED DESCRIPTION

Figure 1:
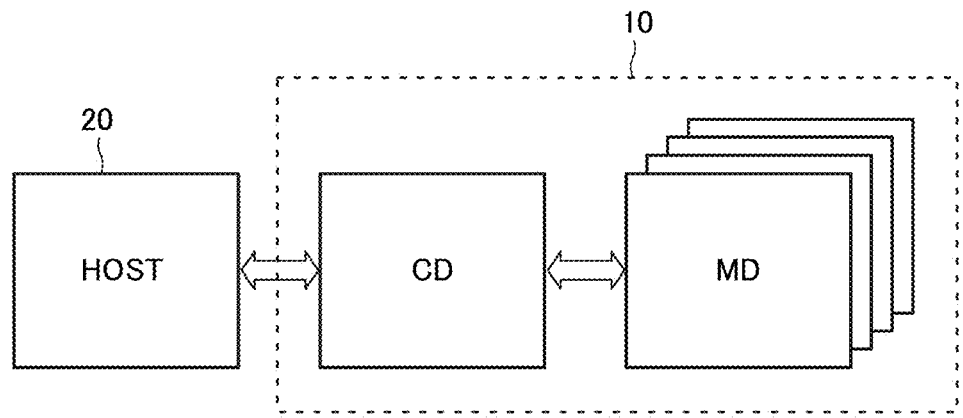
FIG. 1 is a schematic block diagram illustrating a configuration of a memory system 10 according to a first embodiment.

A semiconductor memory device according to one embodiment includes a substrate, a plurality of word lines, a first select gate line, a second select gate line, a first semiconductor layer, a first bit line, a third select gate line, a fourth select gate line, a second semiconductor layer, a second bit line, and a word line contact electrode. The substrate includes a first region and a second region arranged in a first direction and a third region disposed between the first region and the second region. The plurality of word lines extend in the first direction across the first region, the second region, and the third region. The plurality of word lines are arranged in a second direction intersecting with the first direction. The first select gate line is disposed in the first region and farther from the substrate than the plurality of word lines. The second select gate line is disposed in the first region and closer to the substrate than the plurality of word lines. The first semiconductor layer is disposed in the first region. The first semiconductor layer extends in the second direction and is opposed to the plurality of word lines, the first select gate line, and the second select gate line. The first bit line extends in a third direction intersecting with the first direction and the second direction. The first bit line is disposed at a position overlapping with the first semiconductor layer viewed in the second direction. The third select gate line is disposed in the second region and farther from the substrate than the plurality of word lines. The fourth select gate line is disposed in the second region and closer to the substrate than the plurality of word lines. The second semiconductor layer is disposed in the second region. The second semiconductor layer extends in the second direction and is opposed to the plurality of word lines, the third select gate line, and the fourth select gate line. The second bit line extends in the third direction. The second bit line is disposed at a position overlapping with the second semiconductor layer viewed in the second direction. The word line contact electrode is disposed in the third region. The word line contact electrode extends in the second direction and is connected to one of the plurality of word lines.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

A "control circuit" in this specification may mean a peripheral circuit, such as a sequencer, disposed in a memory die, may mean a controller die, a controller chip, or the like connected to a memory die, and may mean a configuration including both of them.

In this specification, when it is referred that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Memory System 10]

FIG. 1 is a schematic block diagram illustrating a configuration of a memory system 10 according to the first embodiment.

The memory system 10 performs a read operation, a write operation, an erase operation, and the like of user data according to signals transmitted from a host computer 20. The memory system 10 is, for example, any system that can store the user data including a memory chip, a memory card, and an SSD. The memory system 10 includes a plurality of memory dies MD and a controller die CD. The memory die MD stores the user data. The controller die CD is connected to the plurality of memory dies MD and the host computer 20. The controller die CD includes, for example, a processor and a RAM. The controller die CD performs processes, such as conversion between a logical address and a physical address, bit error detection/correction, a garbage collection (compaction), and a wear leveling.

Figure 2:
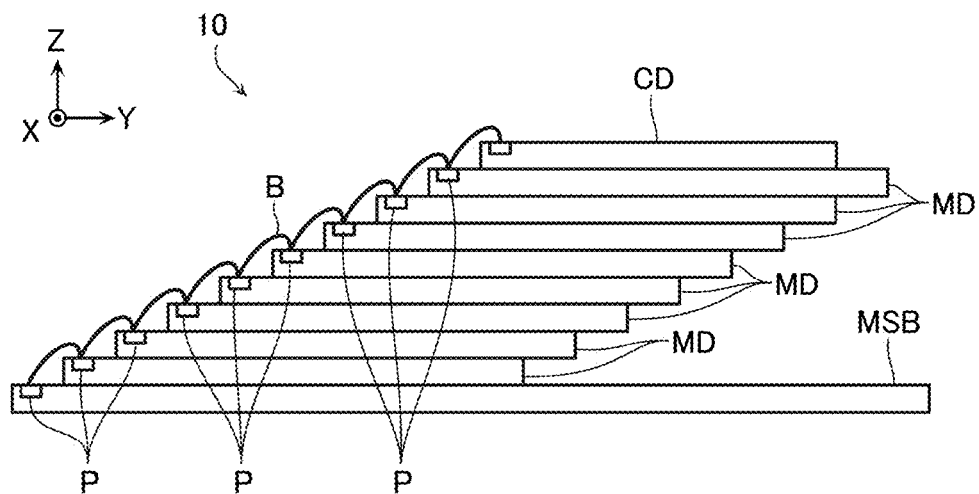
FIG. 2 is a schematic side view illustrating an exemplary configuration of the memory system 10 according to the first embodiment.
Figure 3:
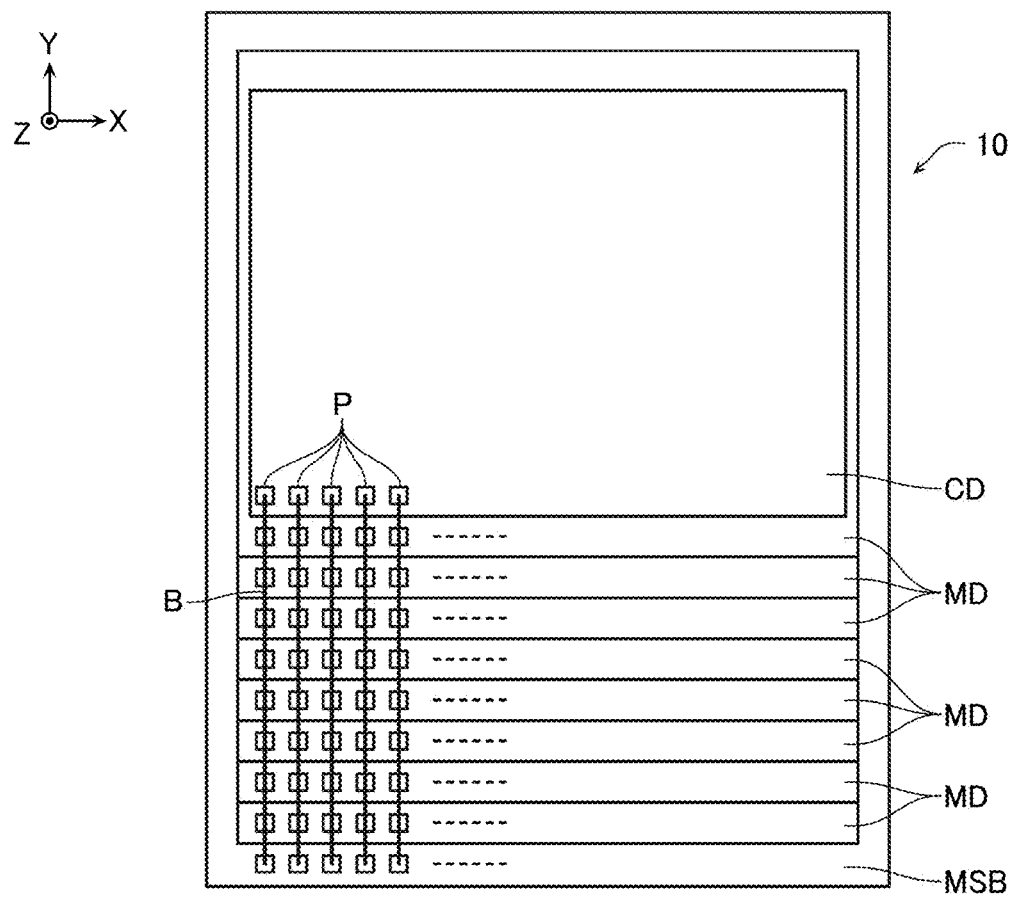
FIG. 3 is a schematic plan view illustrating the exemplary configuration.

FIG. 2 is a schematic side view illustrating an exemplary configuration of the memory system 10 according to this embodiment. FIG. 3 is a schematic plan view illustrating the exemplary configuration. For sake of convenience of the description, FIG. 2 and FIG. 3 omit a part of the configuration.

As illustrated in FIG. 2, the memory system 10 according to this embodiment includes a mounting substrate MSB, the plurality of memory dies MD, and the controller die CD. Pad electrodes P are disposed in a region at an end portion in the Y-direction in an upper surface of the mounting substrate MSB. The region other than the end portion in the Y-direction in the upper surface of the mounting substrate MSB is bonded to a lower surface of the memory die MD via an adhesive or the like. The plurality of memory dies MD are stacked on the mounting substrate MSB. The pad electrodes P are disposed in a region at an end portion in the Y-direction in an upper surface of the memory die MD. The region other than the end portion in the Y-direction in the upper surface of the memory die MD is bonded to another memory die MD or a lower surface of the controller die CD via an adhesive or the like. The controller die CD is stacked on the memory die MD. The pad electrodes P are disposed in a region at an end portion in the Y-direction in an upper surface of the controller die CD.

As illustrated in FIG. 3, the mounting substrate MSB, the plurality of memory dies MD, and the controller die CD each include the plurality of pad electrodes P arranged in the X-direction. The respective plurality of pad electrodes P disposed on the mounting substrate MSB, the plurality of memory dies MD, and the controller die CD are connected to one another via bonding wires B.

Note that the configurations illustrated in FIG. 2 and FIG. 3 are merely examples, and the specific configurations are appropriately adjustable. For example, in the examples illustrated in FIG. 2 and FIG. 3, the controller die CD is stacked on the plurality of memory dies MD. Additionally, the memory dies MD and the controller die CD are connected with the bonding wires B. The plurality of memory dies MD and the controller die CD are included in one package. However, the controller die CD may be included in a package different from the memory dies MD. The plurality of memory dies MD and the controller die CD may be connected to one another via through electrodes and the like, not via the bonding wires B.

[Circuit Configuration of Memory Die MD]

Figure 4:
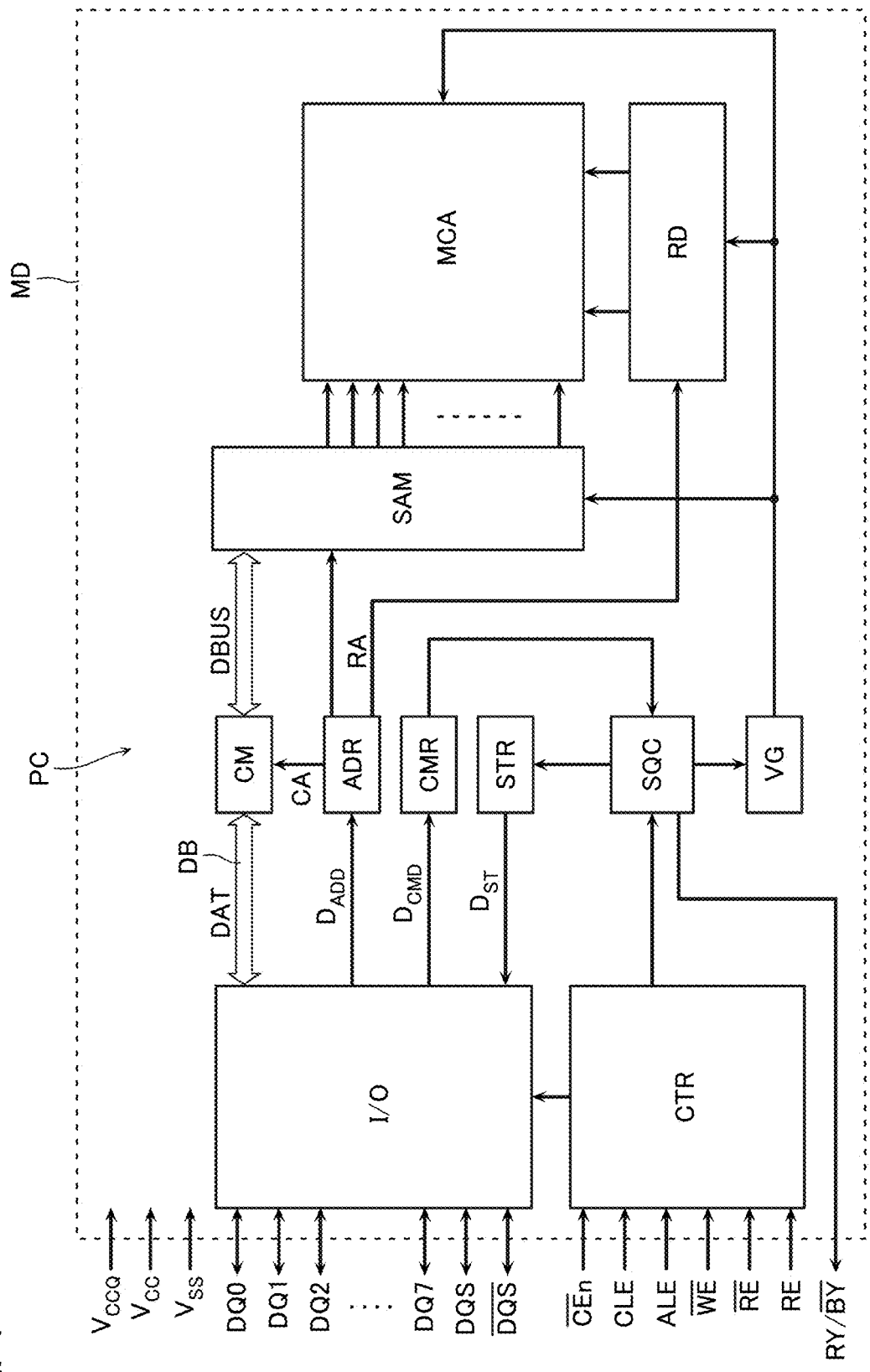
FIG. 4 is a schematic block diagram illustrating a configuration of a memory die MD according to the first embodiment.
Figure 5:
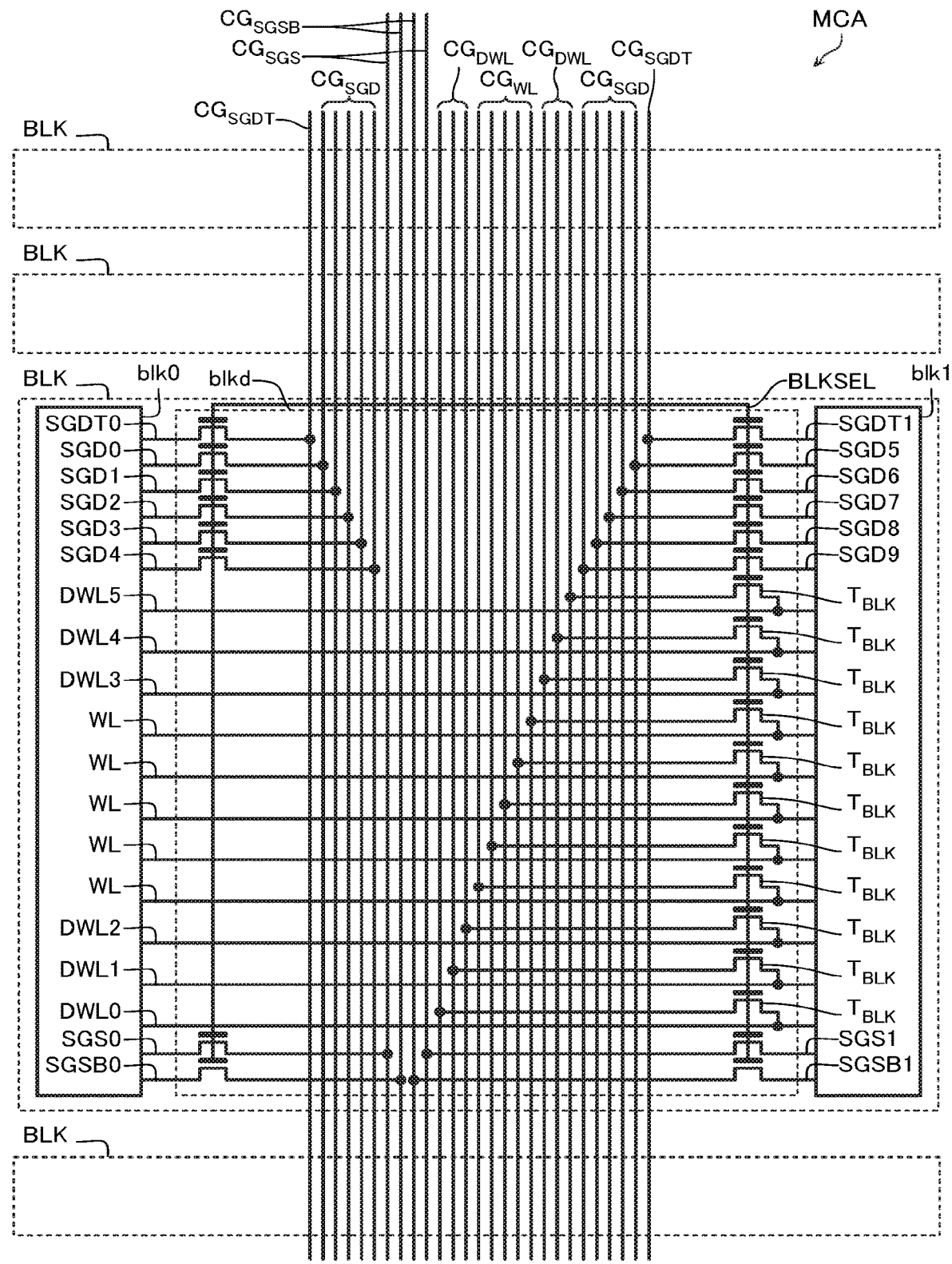
FIG. 5 is a schematic circuit diagram illustrating a configuration of a part of the memory die MD.
Figure 6:
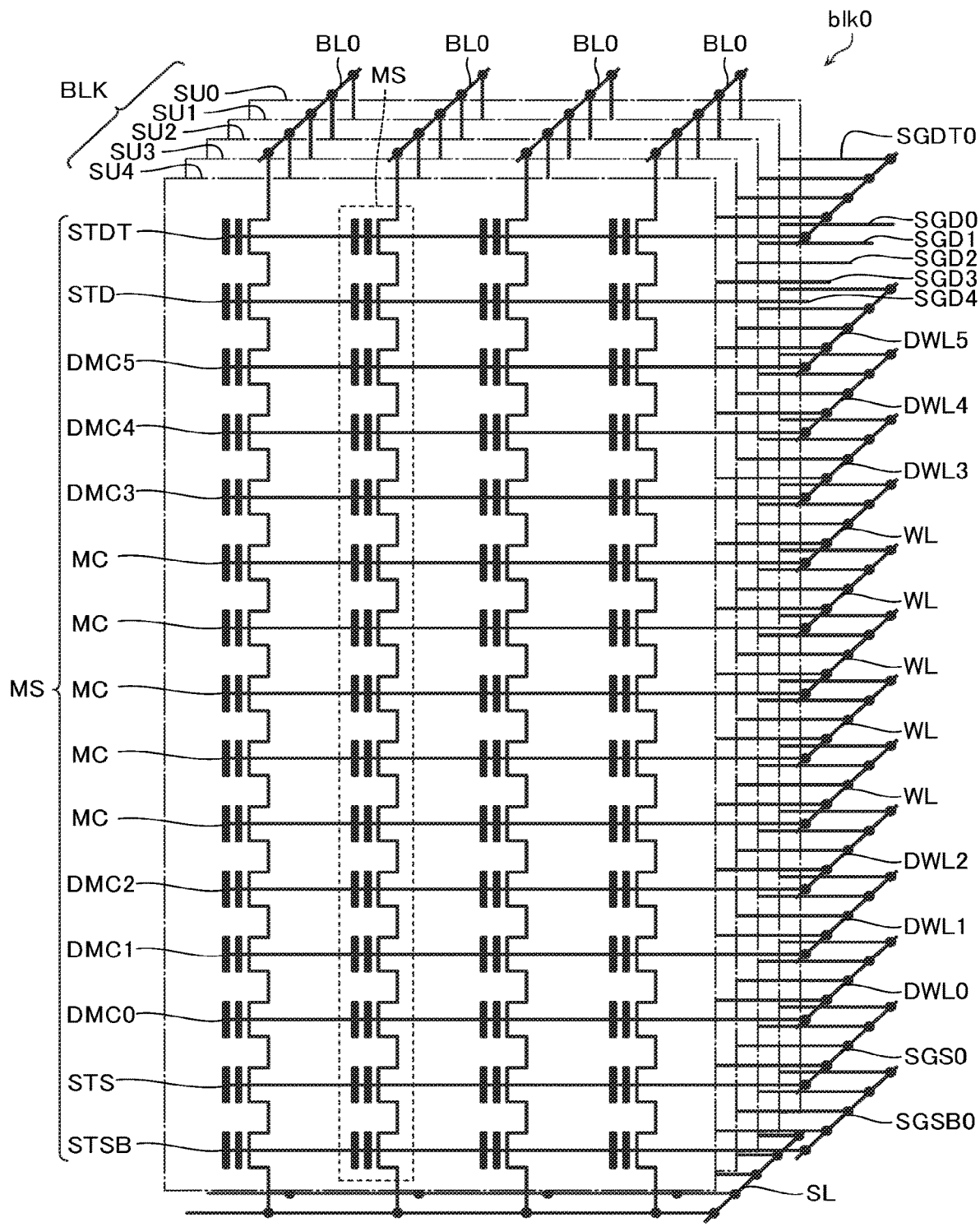
FIG. 6 is a schematic circuit diagram illustrating a configuration of a part of the memory die MD.
Figure 7:
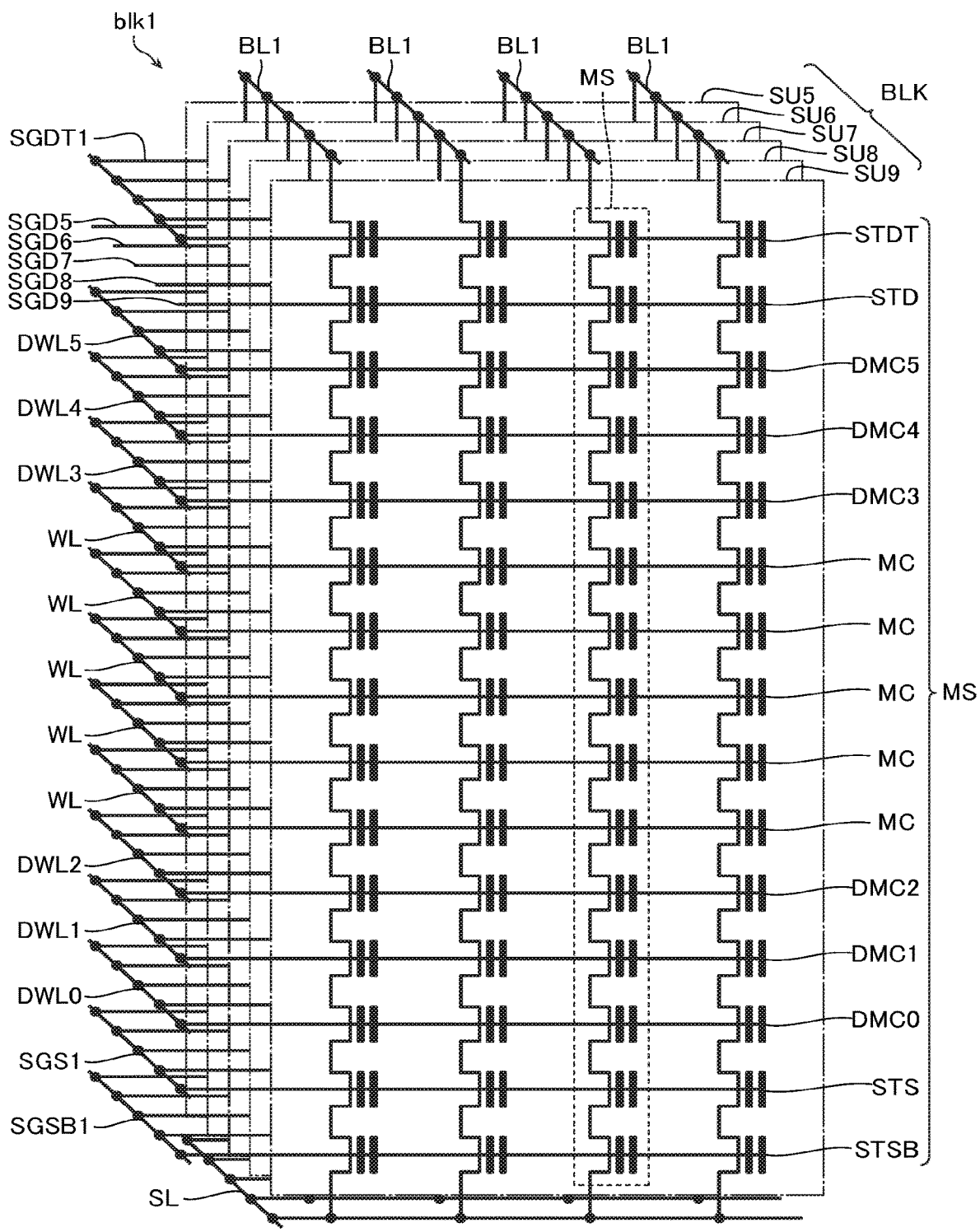
FIG. 7 is a schematic circuit diagram illustrating a configuration of a part of the memory die MD.

FIG. 4 is a schematic block diagram illustrating the configuration of the memory die MD according to the first embodiment. FIG. 5 to FIG. 7 are schematic circuit diagrams illustrating the configuration of a part of the memory die MD.

Note that FIG. 4 illustrates, for example, a plurality of control terminals. These plurality of control terminals are expressed as control terminals corresponding to high active signals (positive logic signals) in some cases. The plurality of control terminals are expressed as control terminals corresponding to low active signals (negative logic signals) in some cases. The plurality of control terminals are expressed as control terminals corresponding to both of the high active signals and the low active signals in some cases. In FIG. 4, reference numerals of the control terminals corresponding to the low active signals include overlines (overbars). In this specification, a reference numeral of the control terminal corresponding to the low active signal includes a slash ("/"). Note that the description in FIG. 4 is an example, and the specific aspect is appropriately adjustable. For example, a part of or all of the high active signals can be changed to the low active signals, or a part of or all of the low active signals can be changed to the high active signals.

As illustrated in FIG. 4, the memory die MD includes a memory cell array MCA and a peripheral circuit PC. The peripheral circuit PC includes a voltage generation circuit VG, a row decoder RD, a sense amplifier module SAM, and a sequencer SQC. The peripheral circuit PC includes a cache memory CM, an address register ADR, a command register CMR, and a status register STR. The peripheral circuit PC includes an input/output control circuit I/O and a logic circuit CTR.

[Circuit Configuration of Memory Cell Array MCA]

As illustrated in FIG. 5, the memory cell array MCA includes a plurality of memory blocks BLK. These plurality of memory blocks BLK each include a circuit blk0 and a circuit blk1.

For example, as illustrated in FIG. 6, the circuit blk0 includes five string units SU0 to SU4. These five string units SU0 to SU4 each include a plurality of memory strings MS. One ends of these plurality of memory strings MS are each connected to the peripheral circuit PC (FIG. 4) via bit lines BL0. The respective other ends of these plurality of memory strings MS are connected to the peripheral circuit PC (FIG. 4) via a common source line SL.

The memory string MS includes drain-side select transistors STDT and STD, dummy memory cells DMC5 to DMC3, a plurality of memory cells MC (memory transistors), dummy memory cells DMC2 to DMC0, and source-side select transistors STS and STSB. These configurations are connected in series between the bit line BL0 and the source line SL. Hereinafter, the drain-side select transistors STDT and STD, and the source-side select transistors STS and STSB are simply referred to as select transistors (STDT, STD, STS, and STSB) or the like in some cases.

The memory cell MC is a field-effect type transistor. The memory cell MC includes a semiconductor layer, a gate insulating film, and a gate electrode. The semiconductor layer functions as a channel region. The gate insulating film includes an electric charge accumulating film. The memory cell MC has a threshold voltage that changes according to an electric charge amount in the electric charge accumulating film. The memory cell MC stores 1 bit or a plurality of bits of data. Word lines WL are connected to respective gate electrodes of the plurality of memory cells MC corresponding to one memory string MS. These respective word lines WL are connected to all of the memory strings MS in one memory block BLK in common.

The dummy memory cells DMC0 to DMC5 are field-effect type transistors. The dummy memory cells DMC0 to DMC5 are basically configured similarly to the memory cell MC. However, the dummy memory cells DMC0 to DMC5 are not used to store data. Dummy word lines DWL0 to DWL5 are connected to gate electrodes of the dummy memory cells DMC0 to DMC5 corresponding to one memory string MS, respectively. These respective dummy word lines DWL0 to DWL5 are connected to all of the memory strings MS in one memory block BLK in common.

The select transistor (STDT, STD, STS, or STSB) is a field-effect type transistor. The select transistor (STDT, STD, STS, or STSB) includes a semiconductor layer, a gate insulating film, and a gate electrode. The semiconductor layer functions as a channel region. Select gate lines SGDT0, SGD0 to SGD4, SGS0, and SGSB0 are connected to gate electrodes of the select transistors (STDT, STD, STS, and STSB), respectively. One drain-side select gate line SGDT0 is connected to all of the memory strings MS in the circuit blk0 in common. The drain-side select gate lines SGD0 to SGD4 are connected to all of the memory strings MS in common in the string units SU0 to SU4, respectively. One source-side select gate line SGS0 is connected to all of the memory strings MS in the circuit blk0 in common. One source-side select gate line SGSB0 is connected to all of the memory strings MS in the circuit blk0 in common.

For example, as illustrated in FIG. 7, the circuit blk1 includes five string units SU5 to SU9. These five string units SU5 to SU9 each include the plurality of memory strings MS. One ends of these plurality of memory strings MS are each connected to the peripheral circuit PC via bit lines BL1. The respective other ends of these plurality of memory strings MS are connected to the peripheral circuit PC via the common source line SL.

The memory string MS in the circuit blk1 is basically configured similarly to the memory string MS in the circuit blk0. However, select gate lines SGDT1, SGD5 to SGD9, SGS1, and SGSB1 are connected to gate electrodes of the select transistors (STDT, STD, STS, and STSB) in the circuit blk1, respectively. One drain-side select gate line SGDT1 is connected to all of the memory strings MS in the circuit blk1 in common. The drain-side select gate lines SGD5 to SGD9 are connected to all of the memory strings MS in common in the string units SU5 to SU9, respectively. One source-side select gate line SGS1 is connected to all of the memory strings MS in the circuit blk1 in common. One source-side select gate line SGSB1 is connected to all of the memory strings MS in the circuit blk1 in common.

Note that as illustrated as an example in FIG. 5, the select gate lines SGDT1, SGD5 to SGD9, SGS1, and SGSB1 corresponding to the circuit blk1 are electrically independent from the select gate lines SGDT0, SGD0 to SGD4, SGS0, and SGSB0 corresponding to the circuit blk0 and are configured such that different voltages are applicable. On the other hand, the word lines WL and the dummy word lines DWL0 to DWL5 are electrically common between the circuits blk0, blk1.

[Circuit Configuration of Voltage Generation Circuit VG]

The voltage generation circuit VG (FIG. 4) includes, for example, a step-down circuit and a step-up circuit. The step-down circuit is, for example, a regulator. The step-up circuit is, for example, a charge pump circuit. These step-down circuit and step-up circuit are each connected to a power supply voltage supply line. A power supply voltage $V_{CC}$ and a ground voltage $V_{SS}$ are applied to the power supply voltage supply lines. The power supply voltage supply line is connected to, for example, the pad electrode P described with reference to FIG. 2 and FIG. 3. The voltage generation circuit VG generates a plurality of patterns of operating voltages, and simultaneously outputs them to the plurality of voltage supply lines. These plurality of patterns of the operating voltage are, for example, applied to the bit lines BL0 and BL1, the source line SL, the word line WL, and the select gate lines SGDT0, SGDT1, SGD0 to SGD9, SGS0, SGS1, SGSB0, and SGSB1 when a read operation, a write operation, and an erase operation are performed on the memory cell array MCA. The operating voltage is appropriately adjusted in accordance with a control signal from the sequencer SQC.

[Circuit Configuration of Row Decoder RD]

The row decoder RD includes a plurality of circuits blkd (FIG. 5) disposed corresponding to the plurality of memory blocks BLK. The circuit blkd includes a plurality of transistors $T_{BLK}$. The plurality of transistors $T_{BLK}$ are disposed corresponding to the drain-side select gate lines SGDT0, SGDT1, and SGD0 to SGD9, the plurality of word lines WL, the dummy word lines DWL0 to DWL5, and the source-side select gate lines SGS0, SGS1, SGSB0, and SGSB1 (hereinafter referred to as the "word lines WL and the like"). The transistor $T_{BLK}$ is, for example, a field-effect type NMOS transistor. A drain electrode of the transistor $T_{BLK}$ is connected to the word line WL and the like. A source electrode of the transistor $T_{BLK}$ is connected to a wiring CG. The respective wirings CG are connected to all of the memory blocks BLK via the plurality of circuits blkd. A gate electrode of the transistor $T_{BLK}$ is connected to a signal supply line BLKSEL. A plurality of the signal supply lines BLKSEL are disposed corresponding to all of the circuits blkd. The signal supply line BLKSEL is connected to all of the transistors $T_{BLK}$ in the circuit blkd.

Note that the wirings CG include two wirings $CG_{SGDT}$ corresponding to the drain-side select gate lines SGDT0 and SGDT1, ten wirings $CG_{SGD}$ corresponding to the drain-side select gate lines SGD0 to SGD9, a plurality of wirings $CG_{WL}$ corresponding to the plurality of word lines WL, six wirings $CG_{DWL}$ corresponding to the plurality of dummy word lines DWL0 to DWL5, two wirings $CG_{SGS}$ corresponding to the source-side select gate lines SGS0 and SGS1, and two wirings $CG_{SGSB}$ corresponding to the source-side select gate lines SGSB0 and SGSB1.

In the read operation, the write operation, and the like, for example, one signal supply line BLKSEL corresponding to a row address RA in the address register ADR (FIG. 4) becomes an "H" state, and the other signal supply lines BLKSEL become an "L" state. For example, a predetermined driving voltage having a positive magnitude is applied to one signal supply line BLKSEL, and the ground voltage $V_{SS}$ or the like is applied to the other signal supply lines BLKSEL. Accordingly, all of the word lines WL and the like in one memory block BLK corresponding to this row address RA are electrically conducted to all of the wirings CG. All of the word lines WL and the like in the other memory blocks BLK become a floating state.

[Circuit Configuration of Sense Amplifier Module SAM]

The sense amplifier module SAM (FIG. 4) includes, for example, a plurality of sense amplifier units that correspond to the plurality of bit lines BL0 and BL1. The sense amplifier units each include a sense amplifier connected to the bit line BL0 or BL1. The sense amplifier includes a sense circuit, a latch circuit, and a voltage transfer circuit. The sense circuit includes a sense transistor and a data wiring. Gate electrodes of the sense transistors are connected to the bit lines BL0 and BL1. A drain electrode of the sense transistor is connected to the data wiring. The sense transistors enter an ON state according to voltages or currents of the bit lines BL0 and BL1. The data wiring is charged or discharged according to the ON/OFF state of the sense transistor. The latch circuit latches data of "1" or "0" according to the voltage of the data wiring. The voltage transfer circuit electrically conducts the bit lines BL0 and BL1 with any of the two voltage supply lines according to the data latched by the latch circuit.

[Circuit Configuration of Cache Memory CM]

The cache memory CM (FIG. 4) includes a plurality of the latch circuits. The plurality of latch circuits are connected to latch circuits in the sense amplifier module SAM via a wiring DBUS. Data DAT included in the plurality of latch circuits in the cache memory CM are sequentially transferred to the sense amplifier module SAM or the input/output control circuit I/O.

To the cache memory CM, a decode circuit and a switch circuit (not illustrated) are connected. The decode circuit decodes a column address CA latched in the address register ADR (FIG. 4). The switch circuit electrically conducts the latch circuit corresponding to the column address CA with a bus DB (FIG. 4) according to an output signal from the decode circuit.

[Circuit Configuration of Sequencer SQC]

The sequencer SQC (FIG. 4) outputs an internal control signal to the row decoder RD, the sense amplifier module SAM, and the voltage generation circuit VG in response to command data $D_{CMD}$ latched in a command register CMR. The sequencer SQC outputs status data $D_{ST}$ indicating its own state to the status register STR as necessary.

The sequencer SQC generates a ready/busy signal and outputs the ready/busy signal to a terminal RY//BY. In a period where the terminal RY//BY is in an "L" state (a busy period), access to the memory die MD is basically inhibited. In a period where the terminal RY//BY is in an "H" state (a ready period), the access to the memory die MD is permitted. The terminal RY//BY is achieved by, for example, the pad electrode P described with reference to FIG. 2 and FIG. 3.

[Circuit Configuration of Input/Output Control Circuit I/O]

The input/output control circuit I/O includes data signal input/output terminals DQ0 to DQ7, toggle signal input/output terminals DQS and/DQS, a plurality of input circuits, a plurality of output circuits, a shift register, and a buffer circuit. The plurality of input circuits, the plurality of output circuits, the shift register, and the buffer circuit are each connected to a terminal to which a power supply voltage $V_{CCQ}$ or the ground voltage $V_{SS}$ is applied.

The data signal input/output terminals DQ0 to DQ7, the toggle signal input/output terminals DQS and /DQS, and the terminal to which the power supply voltage $V_{CCQ}$ is applied are achieved by, for example, the pad electrodes P described with reference to FIG. 2 and FIG. 3. The data input via the data signal input/output terminals DQ0 to DQ7 are output from the buffer circuit to the cache memory CM, the address register ADR, or the command register CMR according to the internal control signal from the logic circuit CTR. The data output via the data signal input/output terminals DQ0 to DQ7 are input to the buffer circuit from the cache memory CM or the status register STR according to the internal control signal from the logic circuit CTR.

The plurality of input circuits include, for example, comparators connected to any of the data signal input/output terminals DQ0 to DQ7 or both of the toggle signal input/output terminals DQS and/DQS. The plurality of output circuits include, for example, Off Chip Driver (OCD) circuits connected to any of the data signal input/output terminals DQ0 to DQ7 or any of the toggle signal input/output terminals DQS and/DQS.

[Circuit Configuration of Logic Circuit CTR]

The logic circuit CTR (FIG. 4) receives an external control signal from the controller die CD via external control terminals /CEn, CLE, ALE, /WE, /RE, or RE and outputs the internal control signal to the input/output control circuit I/O according to this. Note that the external control terminals /CEn, CLE, ALE, /WE, /RE, and RE are achieved by, for example, the pad electrodes P described with reference to FIG. 2 and FIG. 3.

[Structure of Memory Die MD]

Figure 8:
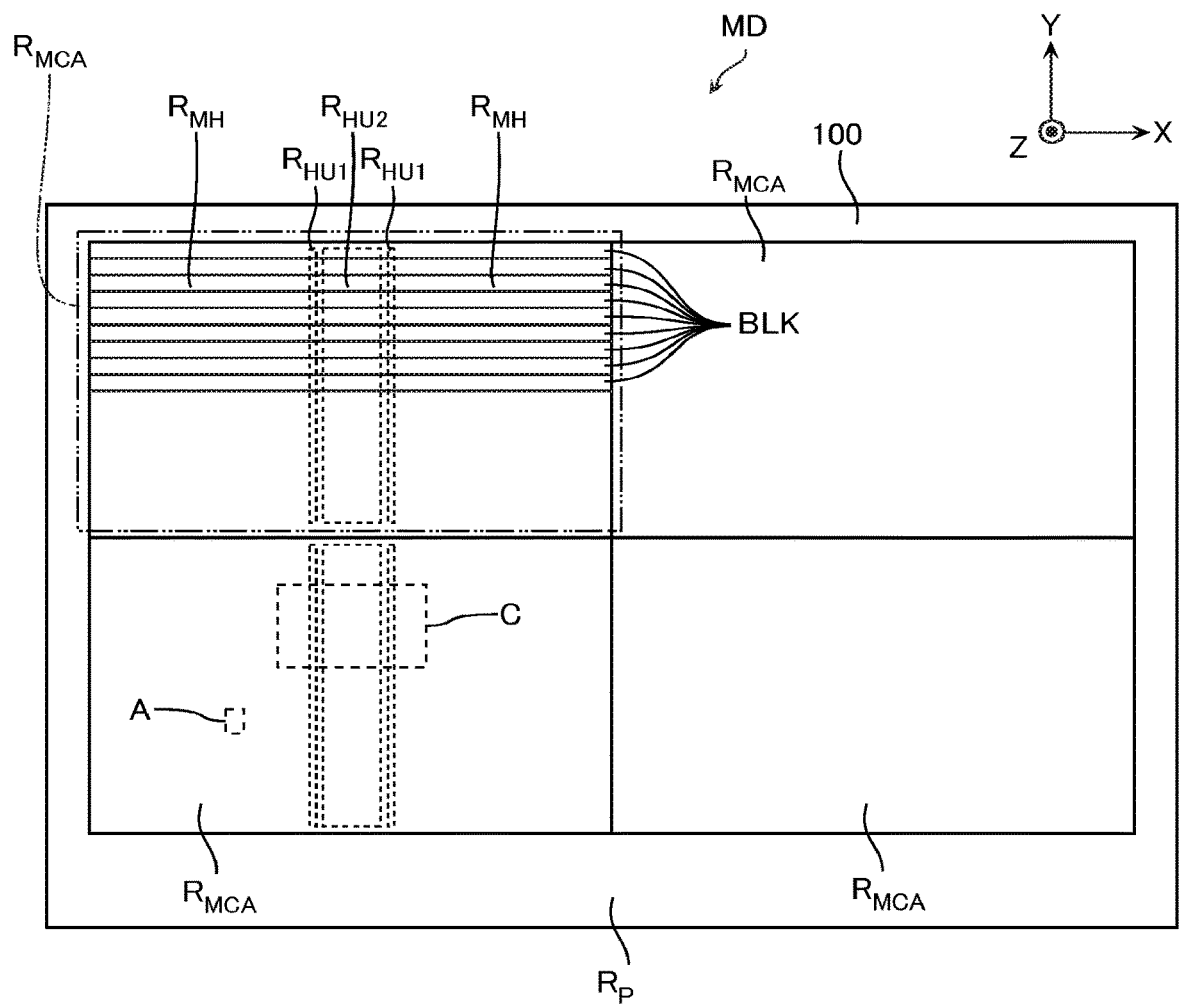
FIG. 8 is a schematic plan view of the memory die MD.
Figure 9:
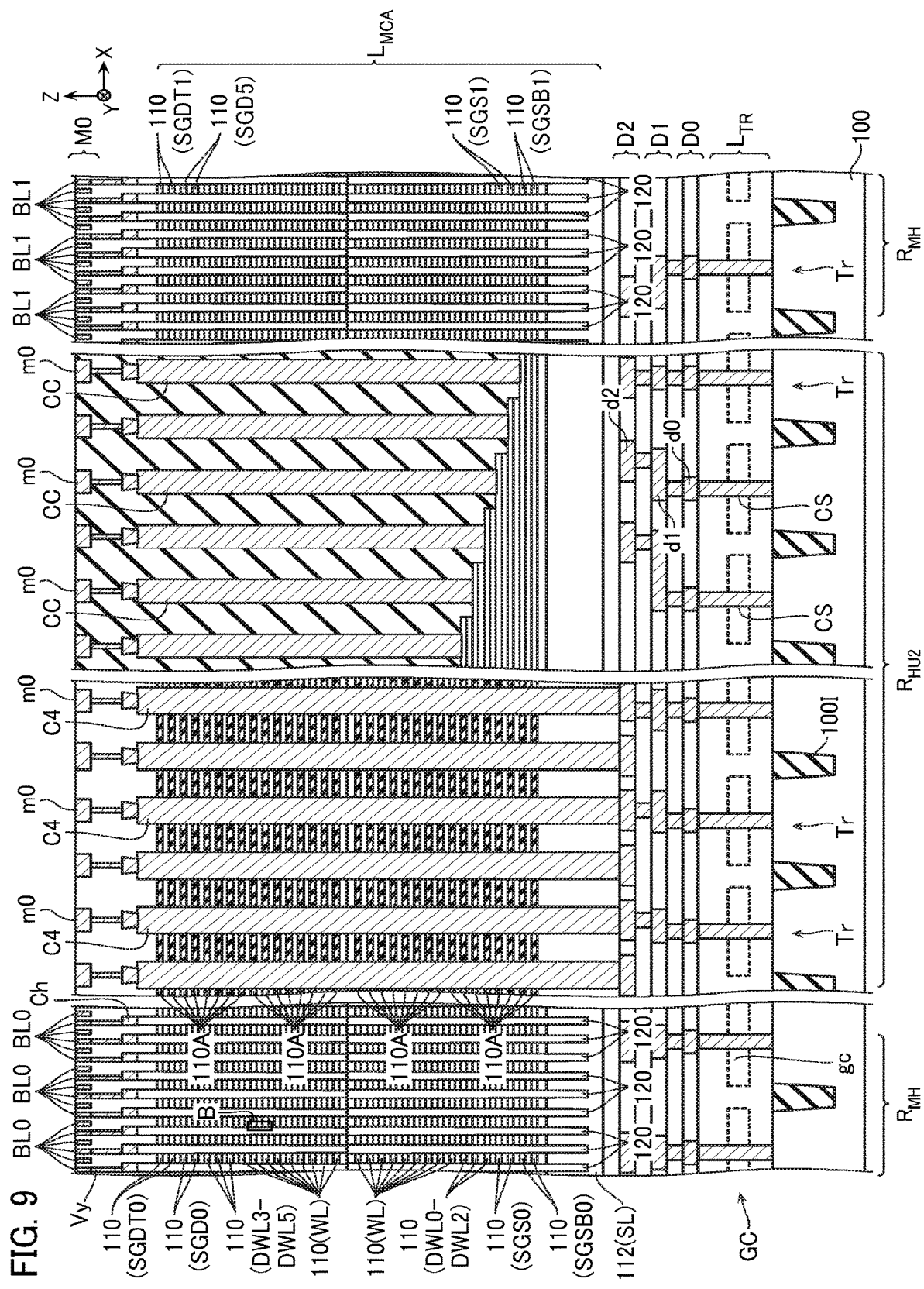
FIG. 9 is a schematic cross-sectional view of the memory die MD.
Figure 10:
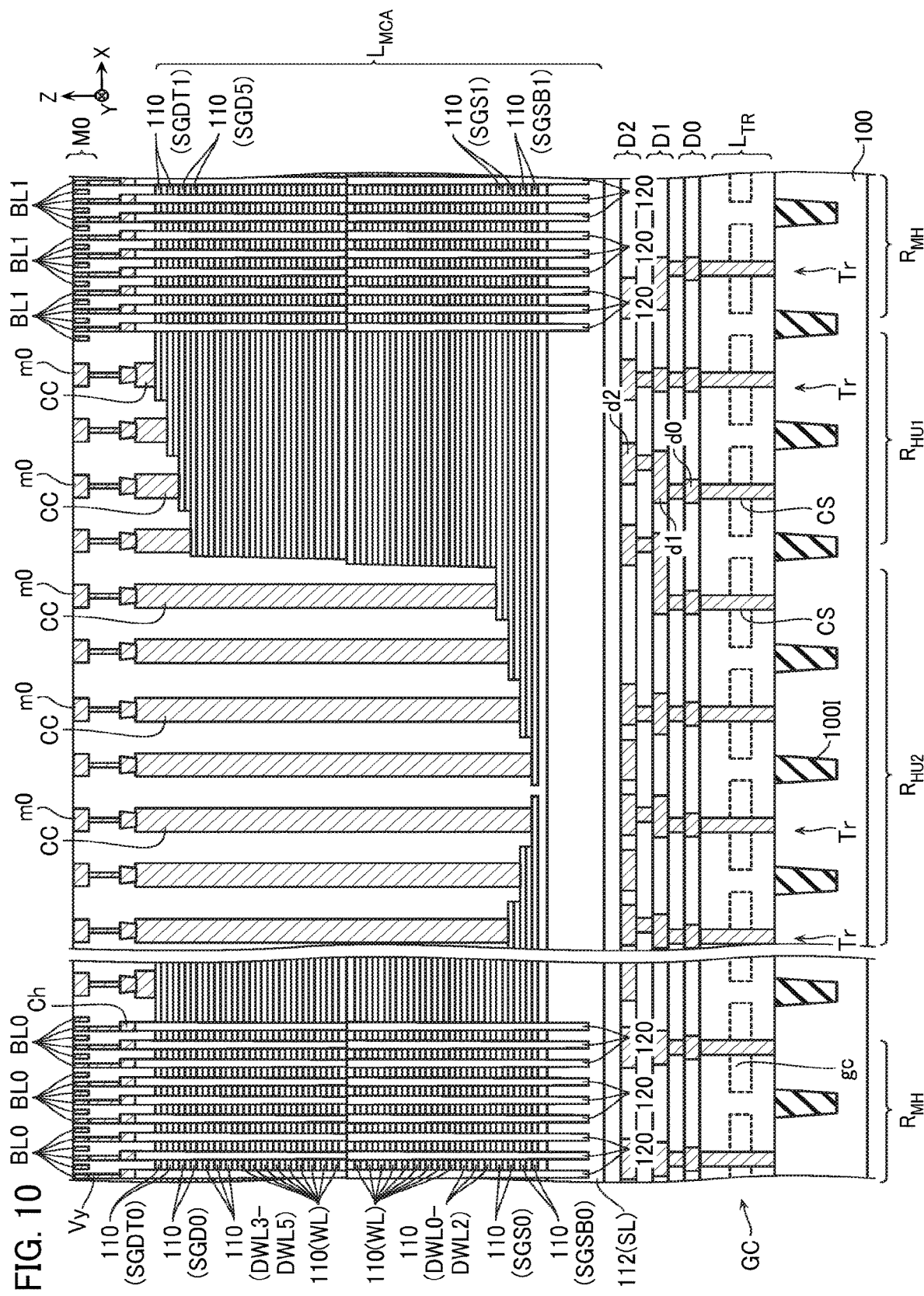
FIG. 10 is a schematic cross-sectional view of the memory die MD.
Figure 11:
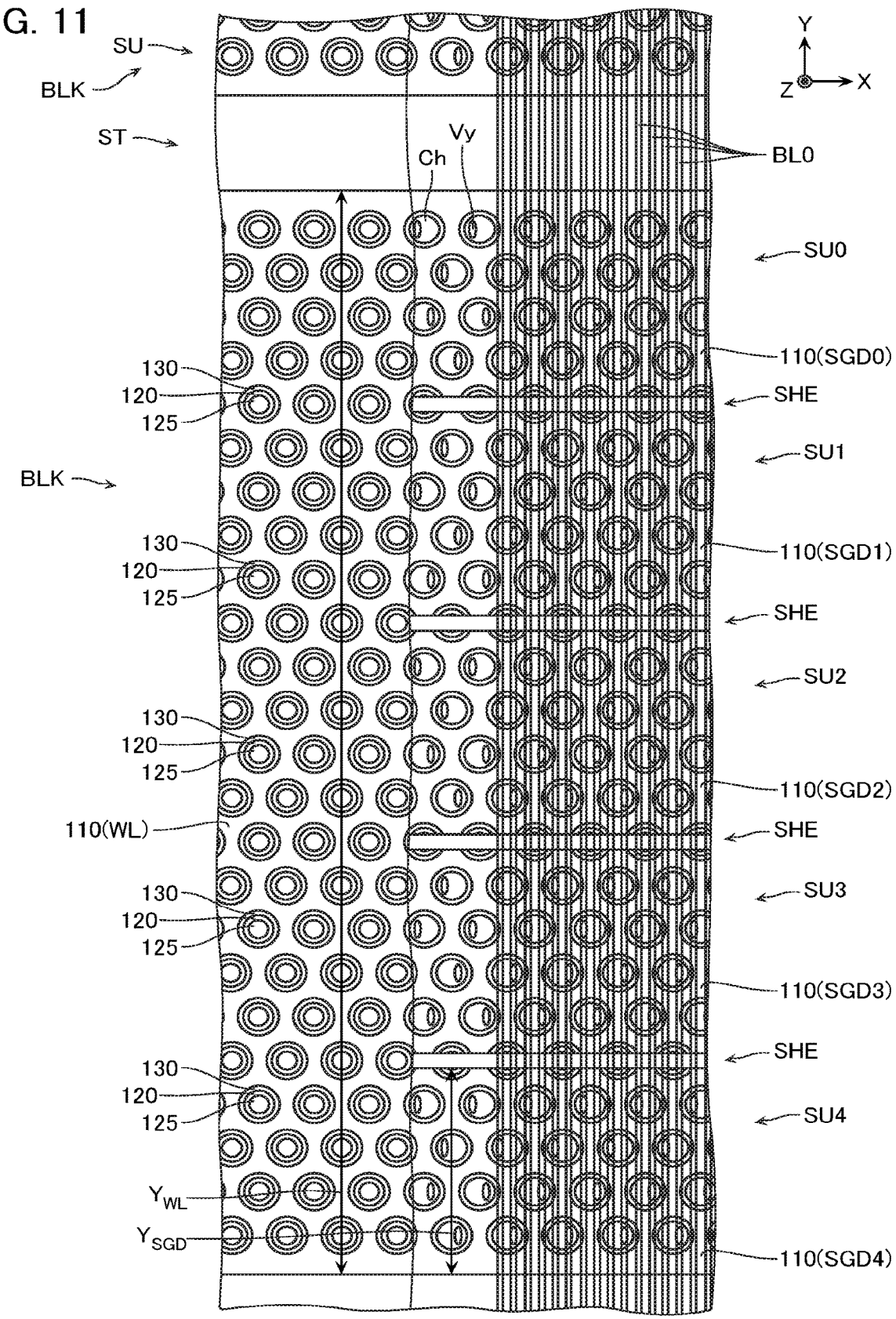
FIG. 11 is a schematic enlarged view of a part indicated by A in FIG. 8.
Figure 12:
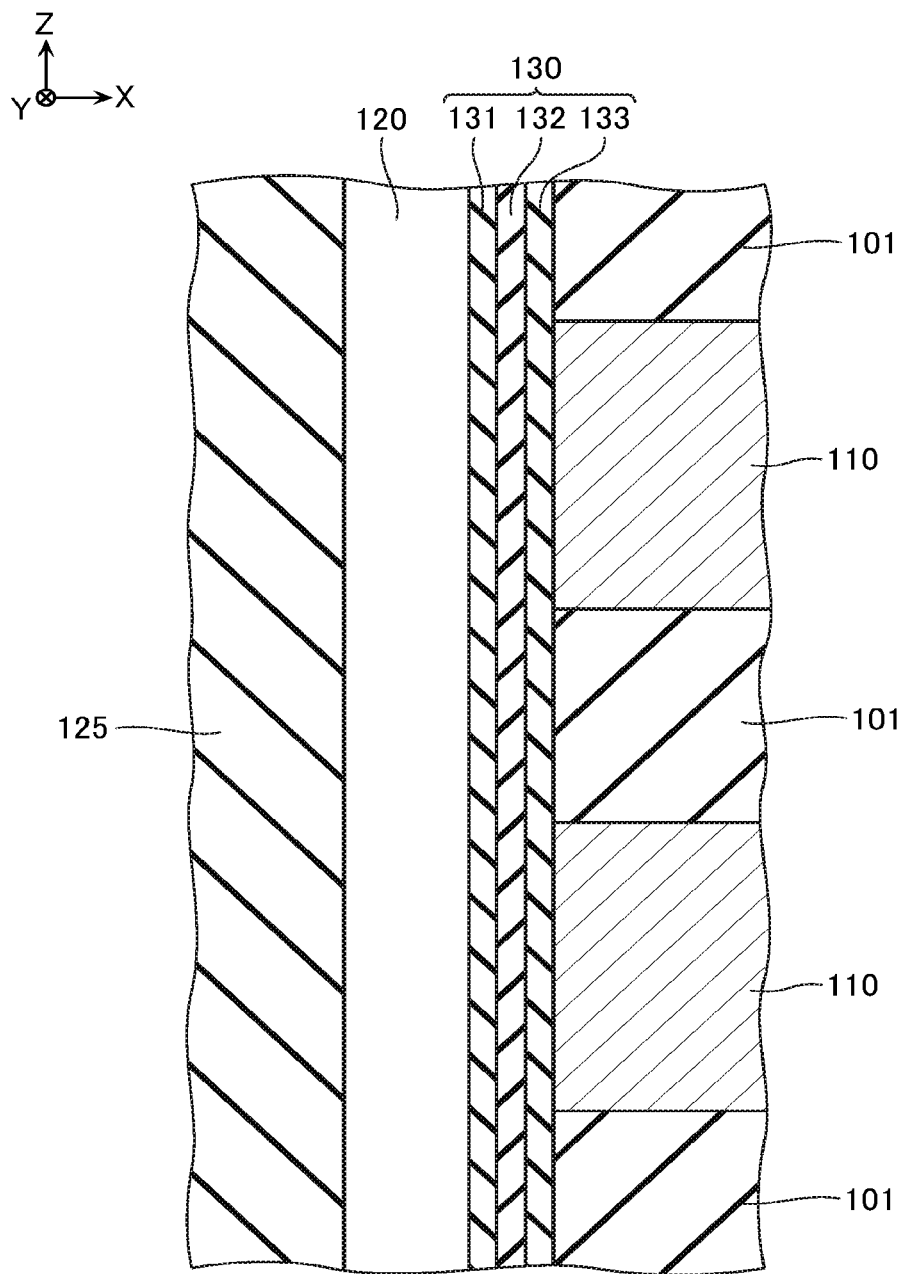
FIG. 12 is a schematic enlarged view of a part indicated by B in FIG. 9.
Figure 13:
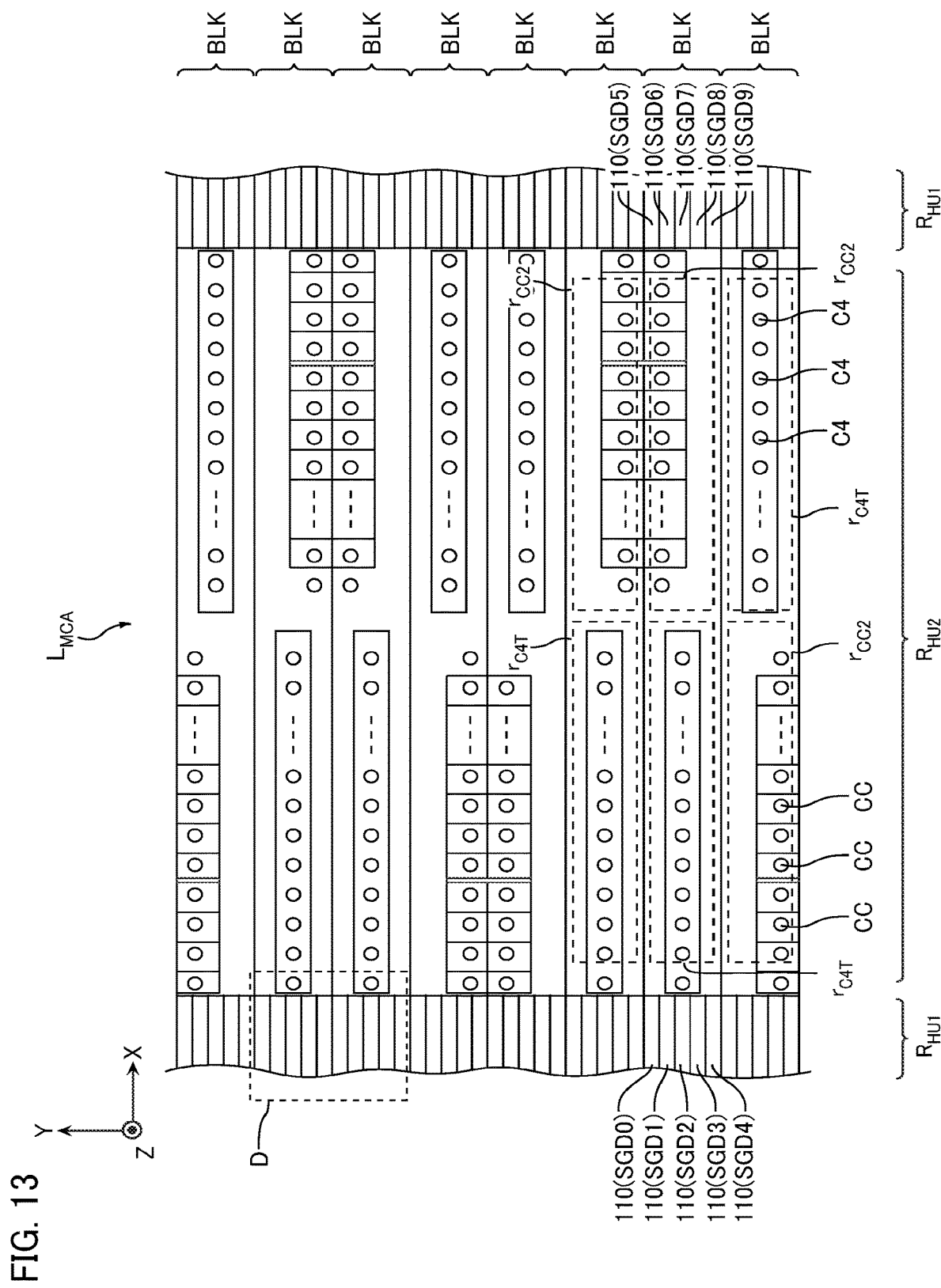
FIG. 13 is a schematic enlarged view of a part indicated by C in FIG. 8.

FIG. 8 is a schematic plan view of the memory die MD. FIG. 9 and FIG. 10 are schematic cross-sectional views of the memory die MD. FIG. 11 is a schematic enlarged view of a part indicated by A in FIG. 8. FIG. 12 is a schematic enlarged view of a part indicated by B in FIG. 9. FIG. 13 is a schematic enlarged view of a part indicated by C in FIG. 8. FIG. 14 to FIG. 17 are schematic plan views illustrated with a part of a configuration omitted from FIG. 13. FIG. 18 is a schematic enlarged view of a part indicated by D in FIG. 13.

For example, as illustrated in FIG. 8, the memory die MD includes a semiconductor substrate 100. In the illustrated example, the semiconductor substrate 100 includes four memory cell array regions $R_{MCA}$ arranged in the X-direction and the Y-direction. The memory cell array region $R_{MCA}$ includes two memory hole regions $R_{MH}$ arranged in the X-direction. Two first hook-up regions $R_{HU1}$ arranged in the X-direction and a second hook-up region $R_{HU2}$ disposed between the first hook-up regions $R_{HU1}$ are disposed between the two memory hole regions $R_{MH}$. Additionally, a peripheral region $R_P$ is disposed in an end portion in the Y-direction of the semiconductor substrate 100. The peripheral region $R_P$ extends in the X-direction along the end portion in the Y-direction of the semiconductor substrate 100.

For example, as illustrated in FIG. 9, the memory die MD includes a transistor layer $L_{TR}$ disposed on the semiconductor substrate 100, a wiring layer D0 disposed above the transistor layer $L_{TR}$, a wiring layer D1 disposed above the wiring layer D0, and a wiring layer D2 disposed above the wiring layer D1. Additionally, the memory die MD includes a memory cell array layer $L_{MCA}$ disposed above the wiring layer D2 and a wiring layer M0 disposed above the memory cell array layer $L_{MCA}$. Although FIG. 9 omits the illustration, a plurality of wiring layers are further disposed above the wiring layer M0.

[Structure of Semiconductor Substrate 100]

For example, the semiconductor substrate 100 is made of P-type silicon (Si) containing P-type impurities, such as boron (B). On a surface of the semiconductor substrate 100, an N-type well region containing N-type impurities, such as phosphorus (P), a P-type well region containing P-type impurities, such as boron (B), a semiconductor substrate region in which the N-type well region or the P-type well region is not disposed, and an insulating region 100I of silicon oxide (SiO$_2$) or the like are disposed.

[Structure of Transistor Layer $L_{TR}$]

For example, as illustrated in FIG. 9, a wiring layer GC is disposed above an upper surface of the semiconductor substrate 100 via an insulating layer (not illustrated). The wiring layer GC includes a plurality of electrodes gc opposed to the surface of the semiconductor substrate 100. The respective regions of the semiconductor substrate 100 and the plurality of electrodes gc included in the wiring layer GC are each connected to a contact CS.

The respective N-type well region, P-type well region, and semiconductor substrate region of the semiconductor substrate 100 function as channel regions of the plurality of transistors Tr, one of electrodes of a plurality of capacitors, and the like constituting the peripheral circuit PC.

The respective plurality of electrodes gc included in the wiring layer GC function as the gate electrodes of the plurality of transistors Tr, the other electrodes of the plurality of capacitors, and the like constituting the peripheral circuit PC.

The contact CS extends in the Z-direction and is connected to the semiconductor substrate 100 or an upper surface of the electrode gc at a lower end. In a connection part between the contact CS and the semiconductor substrate 100, an impurity region containing N-type impurities or P-type impurities is disposed. For example, the contact CS may include a stacked film of a barrier conductive film, such as titanium nitride (TiN), and a metal film, such as tungsten (W), or the like.

[Structures of Wiring Layers D0, D1, and D2]

For example, as illustrated in FIG. 9, the plurality of wirings included in the wiring layers D0, D1, and D2 are electrically connected to at least one of the configuration in the memory cell array layer $L_{MCA}$, the configuration in the transistor layer $L_{TR}$, and the semiconductor substrate 100.

The wiring layers D0, D1, and D2 include a plurality of wirings d0, d1, and d2, respectively. For example, the plurality of wirings d0, d1, and d2 may include a stacked film of a barrier conductive film, such as titanium nitride (TiN) and tantalum nitride (TaN), and a metal film, such as tungsten (W), copper (Cu), and aluminum (Al), or the like.

[Structure of Memory Cell Array Layer $L_{MCA}$ in Memory Hole Region $R_{MH}$]

For example, as illustrated in FIG. 8, the memory cell array layer $L_{MCA}$ includes a plurality of memory blocks BLK arranged in the Y-direction.

For example, as illustrated in FIG. 11, the memory block BLK includes the five string units SU arranged in the Y-direction. The string units SU0 to SU4 are disposed at one side in the X-direction (for example, the negative side in the X-direction in FIG. 11) of the memory hole region $R_{MH}$. Although the illustration is omitted, the string units SU5 to SU9 (FIG. 7) are disposed at the other side in the X-direction (for example, the positive side in the X-direction in FIG. 11) of the memory hole region $R_{MH}$. As illustrated in FIG. 11, between the two memory blocks BLK adjacent in the Y-direction, an inter-block insulating layer ST, such as silicon oxide ($SiO_2$), is disposed. Between the two string units adjacent in the Y-direction of the string units SU0 to SU4, an inter-string unit insulating layer SHE, such as silicon oxide ($SiO_2$), is disposed.

For example, as illustrated in FIG. 9, the memory block BLK includes a plurality of conductive layers 110 arranged in the Z-direction and a plurality of semiconductor columns 120 extending in the Z-direction. For example, as illustrated in FIG. 12, the memory block BLK includes a plurality of respective gate insulating films 130 disposed between the plurality of conductive layers 110 and the plurality of semiconductor columns 120.

The conductive layer 110 is a substantially plate-shaped conductive layer extending in the X-direction. The conductive layers 110 include a plurality of through-holes provided corresponding to the semiconductor columns 120. Respective inner circumferential surfaces of the plurality of through-holes are opposed to outer circumferential surfaces of the semiconductor columns 120 via the gate insulating films 130. The conductive layer 110 may include a stacked film of a barrier conductive film, such as titanium nitride (TiN), and a metal film, such as tungsten (W), or the like. For example, the conductive layer 110 may contain polycrystalline silicon containing impurities, such as phosphorus (P) or boron (B), or the like. Between the respective adjacent plurality of conductive layers 110 arranged in the Z-direction, insulating layers 101, such as silicon oxide ($SiO_2$), are disposed.

As illustrated in FIG. 9, a conductive layer 112 is disposed below the conductive layers 110. For example, the conductive layer 112 may include polycrystalline silicon containing impurities, such as phosphorus (P) or boron (B), or the like. The conductive layer 112 may include, for example, any conductive layer including a conductive layer of a metal, such as tungsten (W), or tungsten silicide. Between the conductive layer 112 and the conductive layers 110, an insulating layer of silicon oxide ($SiO_2$) or the like is disposed.

The conductive layer 112 functions as the source line SL (FIG. 6). For example, the conductive layer 112 is disposed across the whole memory cell array region $R_{MCA}$ (FIG. 8). The conductive layer 112 is disposed in common to all of the memory blocks BLK included in the memory cell array region $R_{MCA}$ (FIG. 8).

Among the plurality of conductive layers 110, one or a plurality of conductive layers 110 positioned as the lowermost layers function as the source-side select gate lines SGSB0 and SGSB1 and the gate electrodes of the plurality of source-side select transistors STSB connected to them. These plurality of conductive layers 110 are electrically independent in every memory block BLK. Note that in the example of FIG. 9, the first and second conductive layers 110 counted from the lower side function as the source-side select gate lines SGSB0 and SGSB1 and the like.

One or a plurality of conductive layers 110 positioned above them function as the source-side select gate lines SGS0 and SGS1 (FIG. 6) and the gate electrodes of the plurality of source-side select transistors STS connected to them. These plurality of conductive layers 110 are electrically independent in every memory block BLK. Note that in the example of FIG. 9, the third and fourth conductive layers 110 counted from the lower side function as the source-side select gate lines SGS0 and SGS1 and the like.

Three conductive layers 110 positioned above them function as gate electrodes of the dummy word lines DWL0 to DWL2 and the dummy memory cells DMC0 to DMC2 connected to them. These plurality of conductive layers 110 are electrically independent in every memory block BLK. Note that in the example of FIG. 9, the fifth to seventh conductive layers 110 counted from the lower side function as the dummy word lines DWL0 to DWL2 and the like.

A plurality of conductive layers 110 positioned above them function as the word lines WL (FIG. 6) and the gate electrodes of the plurality of memory cells MC (FIG. 6) connected to them. These plurality of conductive layers 110 are each electrically independent in every memory block BLK. Note that in the example of FIG. 9, the eighth conductive layer 110 counted from the lower side to the eighth conductive layer 110 counted from the upper side function as the word lines WL and the plurality of memory cells MC connected to them.

Three conductive layers 110 positioned above them function as the dummy word lines DWL3 to DWL5 and the gate electrodes of the dummy memory cells DMC3 to DMC5 connected to them. These plurality of conductive layers 110 are electrically independent in every memory block BLK. Note that in the example of FIG. 9, the seventh to fifth conductive layers 110 counted from the upper side function as the dummy word lines DWL3 to DWL5 and the like.

One or a plurality of conductive layers 110 positioned above them functions as the drain-side select gate lines SGD0 to SGD9 and the gate electrodes of the plurality of drain-side select transistor STD (FIG. 6) connected to them. As illustrated in FIG. 11, a width $Y_{SGD}$ in the Y-direction of these plurality of conductive layers 110 is smaller than a width $Y_{WL}$ in the Y-direction of the conductive layers 110 that function as the word lines WL, the dummy word lines DWL0 to DWL5, or the source-side select gate lines SGS0, SGS1, SGSB0, and SGSB1, and the like. Between the two conductive layers 110 adjacent in the Y-direction, the inter-string unit insulating layer SHE is disposed. Note that in the example of FIG. 9, the fourth and third conductive layers 110 counted from the upper side function as the drain-side select gate lines SGD0 to SGD9 and the like.

One or a plurality of conductive layers 110 positioned above them function as the drain-side select gate lines SGDT0 and SGDT1 and the gate electrodes of the plurality of drain-side select transistors STDT (FIG. 6) connected to them. A width in the Y-direction of these plurality of conductive layers 110 is equal to the width $Y_{SGD}$ in the Y-direction of the conductive layers 110 that function as the drain-side select gate lines SGD0 to SGD9 and the like. Between the two conductive layers 110 adjacent in the Y-direction, the inter-string unit insulating layer SHE is disposed. Note that in the example of FIG. 9, the second and first conductive layers 110 counted from the upper side function as the drain-side select gate lines SGDT0 and SGDT1, and the like.

For example, as illustrated in FIG. 11, the semiconductor columns 120 are arranged in a predetermined pattern in the X-direction and the Y-direction. The semiconductor columns 120 function as channel regions of the plurality of memory cells MC, the dummy memory cells DMC0 to DMC5, and the select transistors (STDT, STD, STS, and STSB) included in one memory string MS (FIG. 6). The semiconductor column 120 is, for example, a semiconductor layer of polycrystalline silicon (Si). The semiconductor column 120 has, for example, an approximately cylindrical shape, and includes an insulating layer 125 (FIG. 12) of silicon oxide or the like in the center part. The outer circumferential surfaces of the semiconductor columns 120 are each surrounded by the conductive layers 110 and opposed to the conductive layers 110.

An impurity region containing N-type impurities, such as phosphorus (P), is disposed in an upper end portion of the semiconductor column 120. This impurity region is connected to the bit line BL0 or the bit line BL1 via a contact Ch and a contact Vy (FIG. 9).

An impurity region containing N-type impurities, such as phosphorus (P), is disposed in a lower end portion of the semiconductor column 120. This impurity region is connected to the conductive layer 112 (FIG. 9).

The gate insulating film 130 (FIG. 12) has an approximately cylindrical shape and covers the outer circumferential surface of the semiconductor column 120. For example, as illustrated in FIG. 12, the gate insulating film 130 includes a tunnel insulating film 131, an electric charge accumulating film 132, and a block insulating film 133 stacked between the semiconductor column 120 and the conductive layers 110. The tunnel insulating film 131 and the block insulating film 133 are, for example, insulating films, such as silicon oxide ($SiO_2$). The electric charge accumulating film 132 is, for example, a film of silicon nitride ($Si_3N_4$) or the like that can accumulate electric charge. The tunnel insulating film 131, the electric charge accumulating film 132, and the block insulating film 133 have approximately cylindrical shapes, and extend in the Z-direction along the outer circumferential surface of the semiconductor column 120.

Note that FIG. 12 illustrates an example of the gate insulating film 130 including the electric charge accumulating film 132 of silicon nitride or the like. However, the gate insulating film 130 may include a floating gate of polycrystalline silicon or the like containing N-type or P-type impurities.

[Structure of Memory Cell Array Layer $L_{MCA}$ in First Hook-Up Region $R_{HU1}$]

As illustrated in FIG. 13, in the first hook-up region $R_{HU1}$ disposed at one side in the X-direction (for example, the negative side in the X-direction in FIG. 13), end portions in the X-direction of the conductive layers 110 that function as the drain-side select gate lines SGD0 to SGD4 are disposed. Additionally, although omitted in FIG. 13, in this first hook-up region $R_{HU1}$, end portions in the X-direction of the conductive layers 110 that function as the drain-side select gates line SGDT0 are disposed.

As illustrated in FIG. 13, in the first hook-up region $R_{HU1}$ disposed at the other side in the X-direction (for example, the positive side in the X-direction in FIG. 13), end portions in the X-direction of the conductive layers 110 that function as the drain-side select gate lines SGD5 to SGD9 are disposed. Although omitted in FIG. 13, in this first hook-up region $R_{HU1}$, end portions in the X-direction of the conductive layers 110 that function as the drain-side select gate lines SGDT1 are disposed.

As illustrated in FIG. 18, in the first hook-up region $R_{HU1}$, a contact connection sub-region $r_{CC1}$ is disposed corresponding to each of the memory blocks BLK.

In the contact connection sub-region $r_{CC1}$, end portions in the X-direction of the plurality of conductive layers 110 that function as the drain-side select gate lines SGDT0 and SGD0 to SGD4, or end portions in the X-direction of the plurality of conductive layers 110 that function as the drain-side select gate lines SGDT1 and SGD5 to SGD9 are disposed. In the contact connection sub-region $r_{CC1}$, a plurality of contacts CC arranged in a matrix viewed in the Z-direction are disposed. For example, as illustrated in FIG. 10, these plurality of contacts CC extend in the Z-direction and have lower ends connected to the conductive layers 110. The contact CC may include a stacked film of a barrier conductive film, such as titanium nitride (TiN), and a metal film, such as tungsten (W), or the like.

Among the plurality of contacts CC arranged in the X-direction, the contact CC closest to the memory hole region $R_{MH}$ is connected to the first conductive layer 110 counted from the upper side. The contact CC second closest to the memory hole region $R_{MH}$ is connected to the second conductive layer 110 counted from the upper side. Hereinafter, similarly, the contact CC a-th (a is a positive integer of 1 or more) closest to the memory hole region $R_{MH}$ is connected to the a-th conductive layer 110 counted from the upper side. These plurality of contacts CC are connected to the drain electrodes of the transistors Tr via wirings m0 in the wiring layer M0, the wirings d0, d1, and d2 in the wiring layers D0, D1, and D2, and the contacts CS.

For example, as illustrated in FIG. 18, in the first hook-up region $R_{HU1}$, supporting structures HR disposed at the proximity of the contacts CC are disposed. The supporting structure HR extends in the Z-direction and has a lower end connected to the conductive layer 112. The supporting structure HR includes an insulating layer, such as silicon oxide ($SiO_2$).

[Structure of Memory Cell Array Layer $L_{MCA}$ in Second Hook-Up Region $R_{HU2}$]

As illustrated in FIG. 13, in a region at one side in the X-direction of the second hook-up region $R_{HU2}$, a plurality of contact connection sub-regions $r_{CC}$ and a plurality of contact connection sub-regions $r_{C4T}$ are disposed. The plurality of contact connection sub-regions $r_{CC2}$ are, for example, disposed at positions corresponding to 4n+1st (n is an integer of 0 or more) and 4n+4th memory blocks BLK counted from one side in the Y-direction. The plurality of contact connection sub-regions $r_{C4T}$ are, for example, disposed at positions corresponding to the 4n+2nd to the 4n+3rd memory blocks BLK counted from one side in the Y-direction (for example, the negative side in the Y-direction in FIG. 11).

As illustrated in FIG. 13, the plurality of contact connection sub-regions $r_{CC2}$ and the plurality of contact connection sub-regions $r_{C4T}$ are disposed also in regions at the other side in the X-direction of the second hook-up region $R_{HU2}$. The plurality of contact connection sub-regions $r_{CC2}$ are, for example, disposed at positions corresponding to the 4n+2nd and 4n+3rd memory blocks BLK counted from one side in the Y-direction (for example, the negative side in the Y-direction in FIG. 11). The plurality of contact connection sub-regions $r_{C4T}$ are, for example, disposed at positions corresponding to the 4n+1st and 4n+4th memory blocks BLK counted from one side in the Y-direction (for example, the negative side in the Y-direction in FIG. 11).

As illustrated in FIG. 10, in the contact connection sub-region $r_{CC2}$, a part of the plurality of conductive layers 110 that function as the word lines WL, the dummy word lines DWL0 to DWL5, or the source-side select gate lines SGS0, SGS1, SGSB0, and SGSB1 are disposed. Additionally, in the contact connection sub-region rac, the plurality of contacts CC arranged in the X-direction are disposed. These plurality of contacts CC extend in the Z-direction and have lower ends connected to the conductive layers 110. The contact CC may include a stacked film of a barrier conductive film, such as titanium nitride (TiN), and a metal film, such as tungsten (W), or the like.

Figure 14:
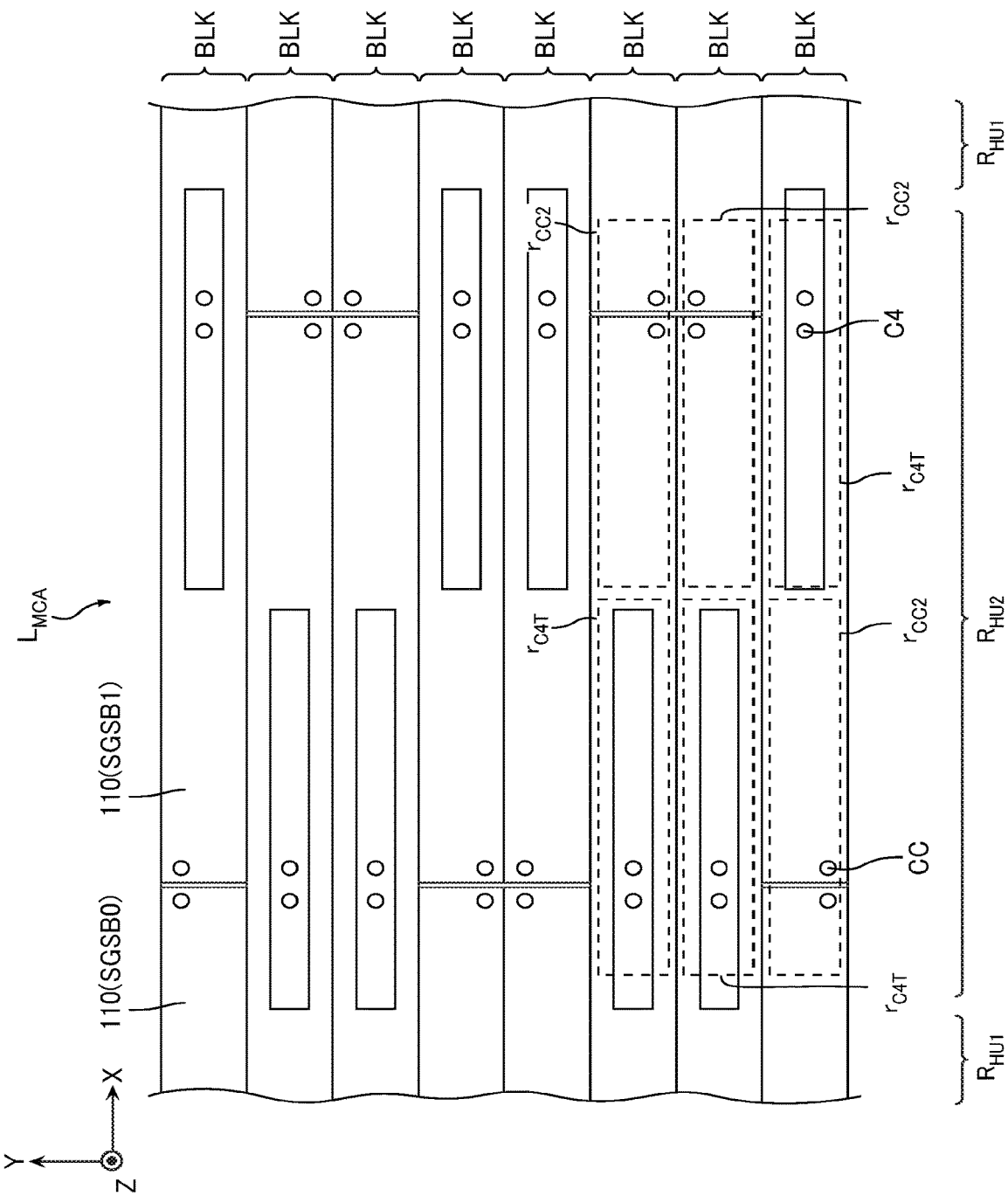
FIG. 14 is a schematic plan view illustrated with a part of a configuration omitted from FIG. 13.
Figure 15:
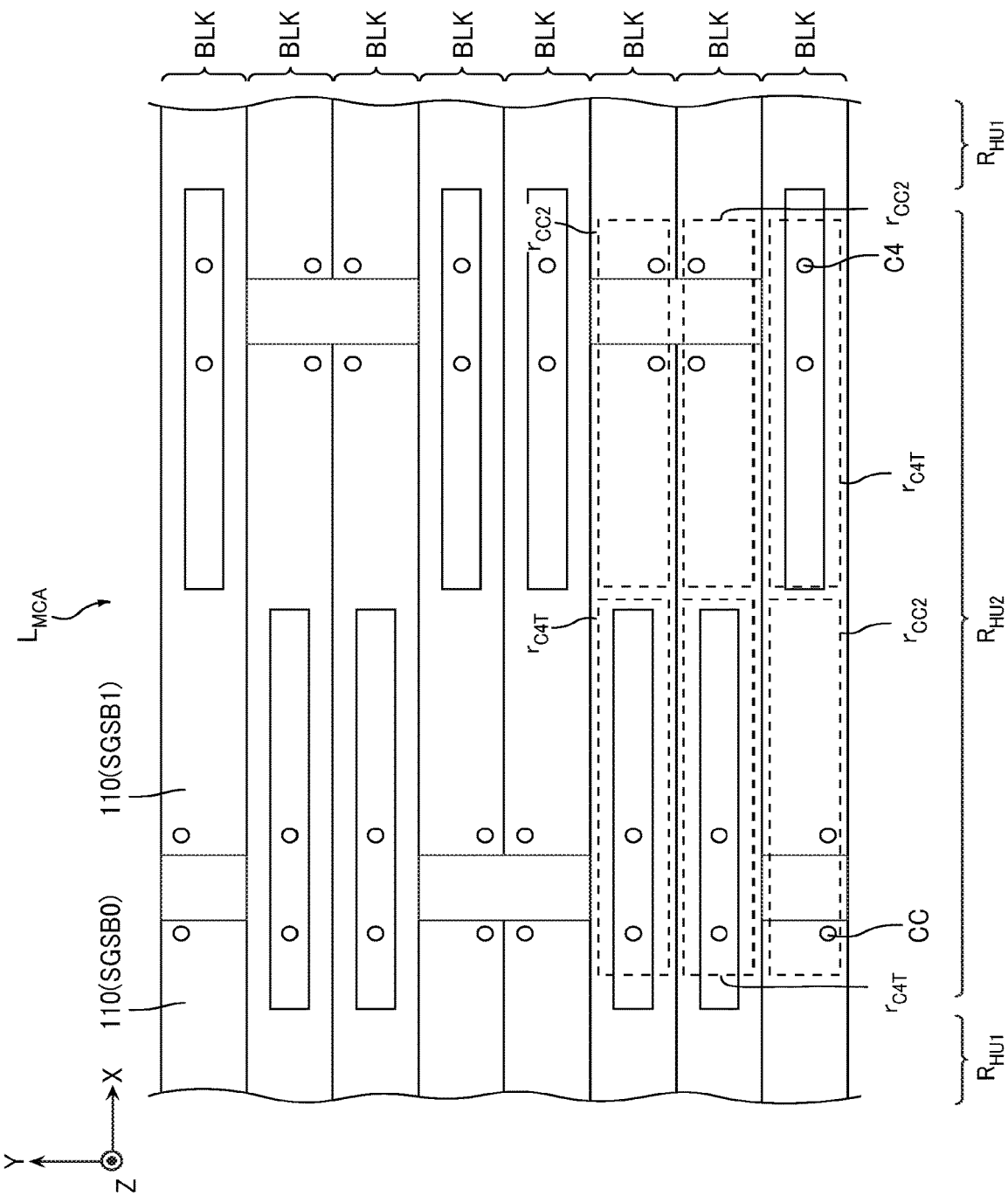
FIG. 15 is a schematic plan view illustrated with a part of a configuration omitted from FIG. 13.

Note that as illustrated in FIG. 14, the conductive layer 110 that functions as the source-side select gate line SGSB0 among the first conductive layers 110 counted from the lower side and the first conductive layer 110 that functions as the source-side select gate line SGSB1 among the first conductive layers 110 counted from the lower side are separated in the X-direction in the second hook-up region $R_{HU2}$. Additionally, as illustrated in FIG. 15, the conductive layer 110 that functions as the source-side select gate line SGSB0 among the second conductive layers 110 counted from the lower side and the conductive layer 110 that functions as the source-side select gate line SGSB1 among the second conductive layers 110 counted from the lower side are separated in the X-direction in the second hook-up region $R_{HU2}$. That is, the conductive layer 110 that functions as the source-side select gate lines SGSB0 and the conductive layer 110 that functions as the source-side select gate lines SGSB1 are arranged in the X-direction and spaced in the X-direction. These conductive layers 110 are connected to the respective contacts CC.

The conductive layers 110 that function as the source-side select gate lines SGS0 and SGS1 are also separated in the X-direction in the second hook-up region $R_{HU2}$. These conductive layers 110 are connected to the respective contacts CC (see FIG. 10).

Figure 16:
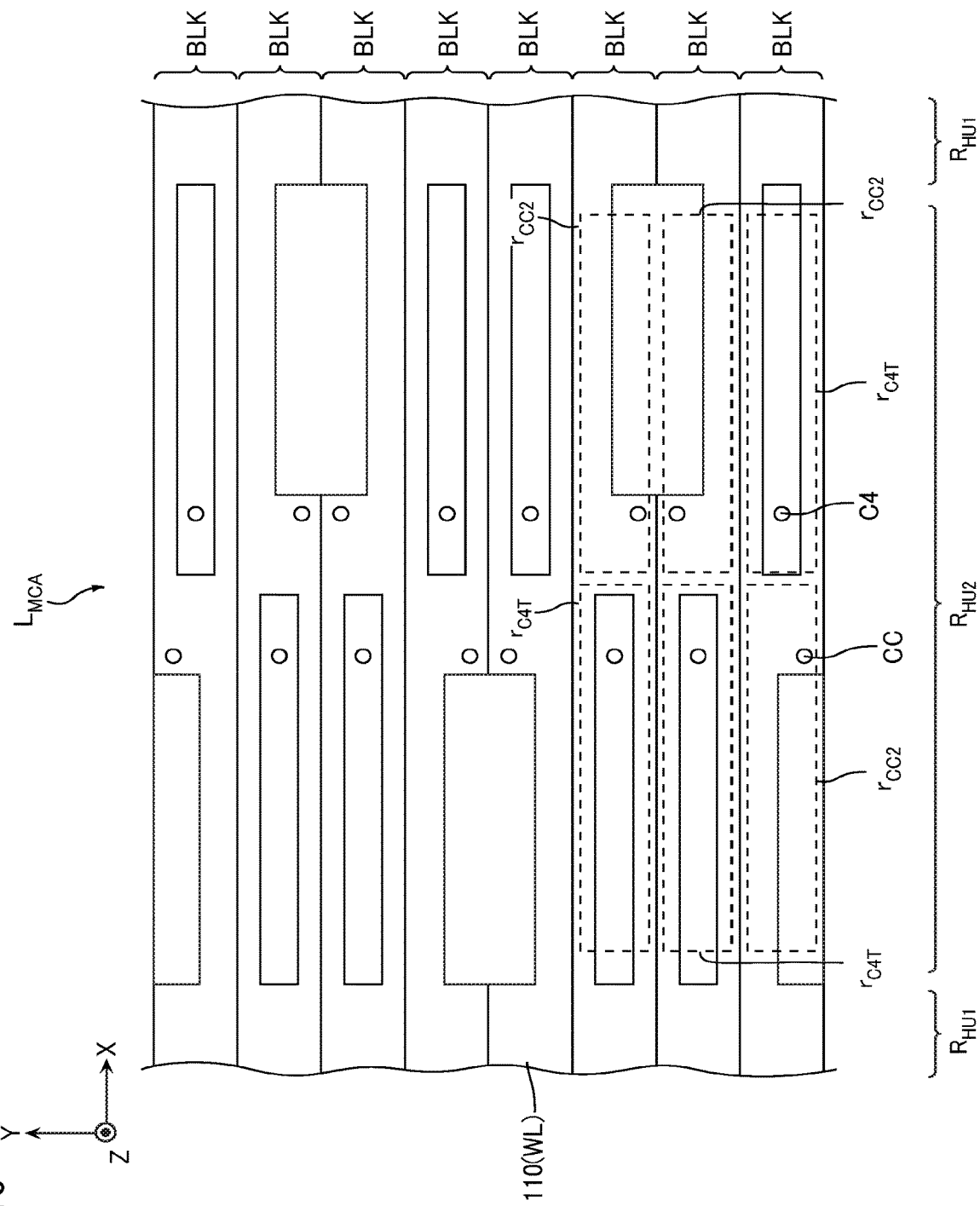
FIG. 16 is a schematic plan view illustrated with a part of a configuration omitted from FIG. 13.
Figure 17:
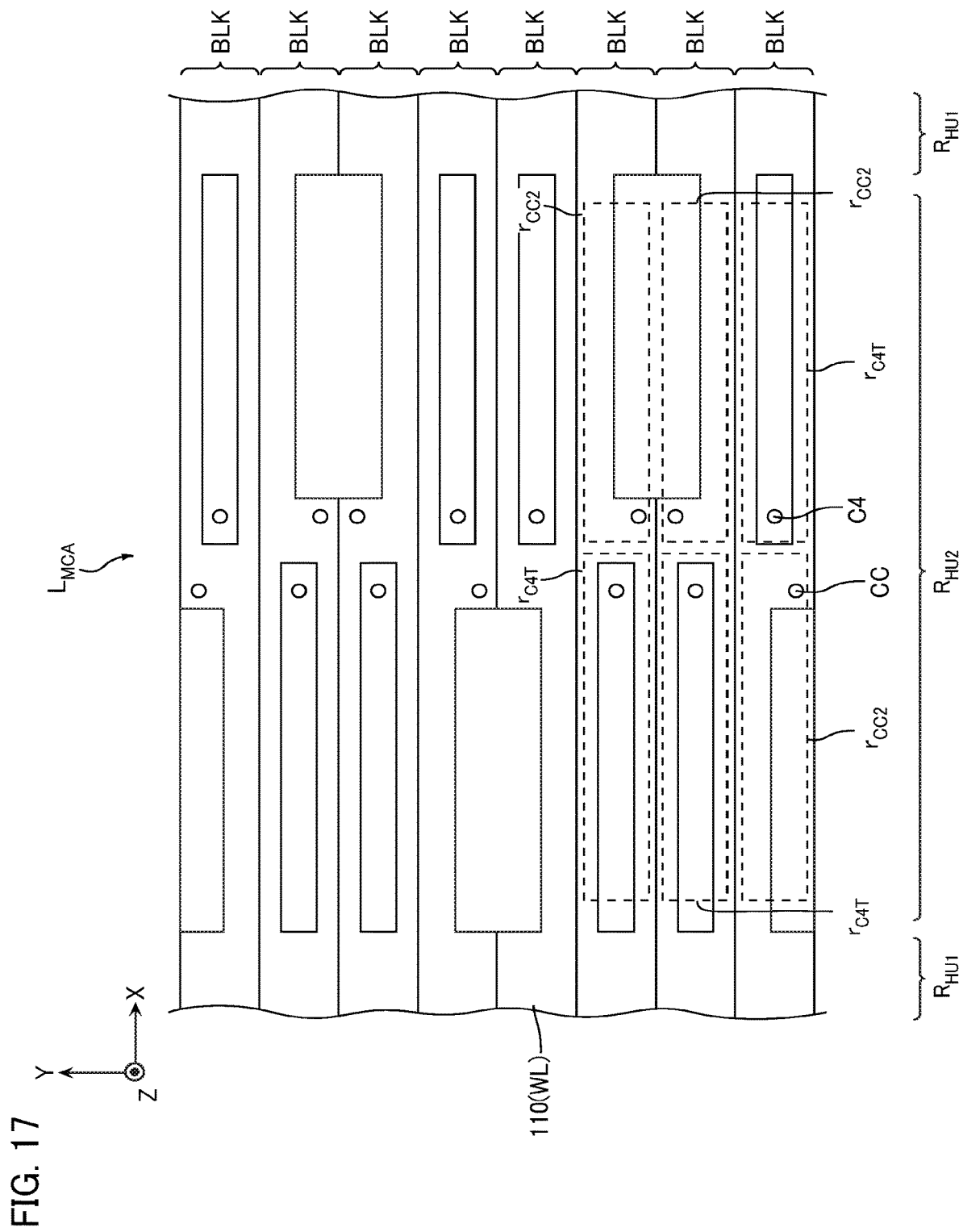
FIG. 17 is a schematic plan view illustrated with a part of a configuration omitted from FIG. 13.
Figure 18:
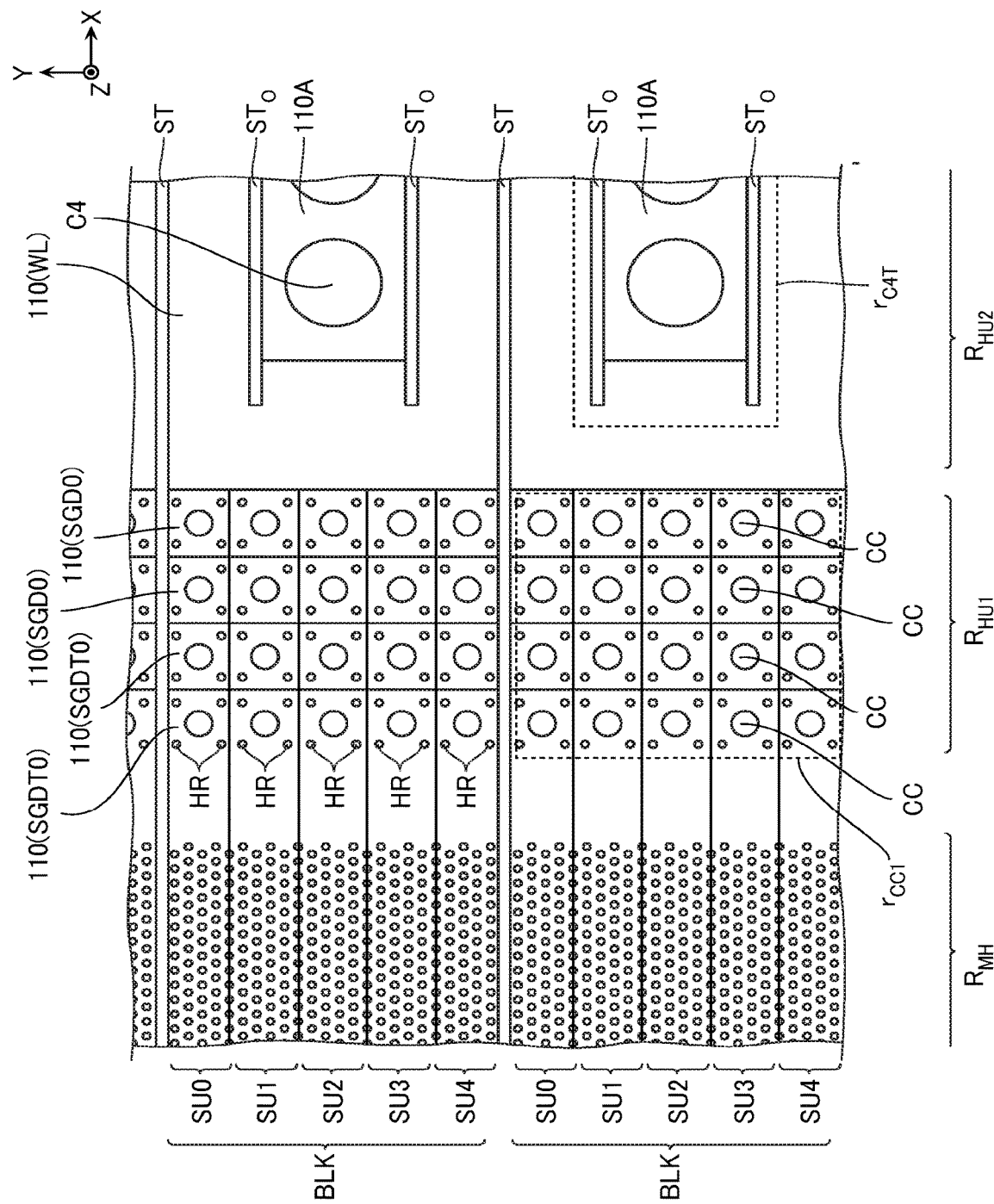
FIG. 18 is a schematic enlarged view of a part indicated by D in FIG. 13.

As illustrated in FIG. 16 and FIG. 17, the conductive layer 110 that functions as the word line WL is not separated in the X-direction in the second hook-up region $R_{HU2}$ and is continuously formed in the X-direction across the two memory hole regions $R_{MH}$, and the first hook-up region $R_{HU1}$ and the second hook-up region $R_{HU2}$ disposed between them, which are arranged in the X-direction. This conductive layer 110 is connected to one contact CC.

Although the illustration is omitted, the conductive layers 110 that function as the dummy word lines DWL0 to DWL5 are also not separated in the X-direction in the second hook-up region $R_{HU2}$. These conductive layers 110 are connected to one contact CC.

The plurality of contacts CC disposed in the contact connection sub-region $r_{CC2}$ are connected to the drain electrodes of the transistors Tr via the wirings m0 in the wiring layer M0, the wirings d0, d1, and d2 in the wiring layers D0, D1, and D2, and the contacts CS.

As illustrated in FIG. 18, in a contact connection sub-region $r_{C4T}$, two insulating layers $ST_O$ arranged in the Y-direction are disposed. These two insulating layers $ST_O$ are disposed between the two inter-block insulating layers ST arranged in the Y-direction. For example, as illustrated in FIG. 9, a plurality of insulating layers 110A arranged in the Z-direction and a plurality of contacts C4 extending in the Z-direction are disposed between these two insulating layers $ST_O$.

The insulating layers $ST_O$ (FIG. 18) extend in the X-direction and the Z-direction, and have lower ends connected to the conductive layer 112. The insulating layer $ST_O$ contains, for example, silicon oxide ($SiO_2$).

The insulating layer 110A is an approximately plate-shaped insulating layer extending in the X-direction. The insulating layer 110A may include an insulating layer, such as silicon nitride ($Si_3N_4$). Between the respective adjacent plurality of insulating layers 110A arranged in the Z-direction, insulating layers, such as silicon oxide ($SiO_2$), are disposed.

The plurality of contacts C4 are arranged in the X-direction. The contact C4 may include a stacked film of a barrier conductive film, such as titanium nitride (TiN), and a metal film, such as tungsten (W), or the like. For example, as illustrated in FIG. 9, each of the contacts C4 has an outer circumferential surface surrounded by the insulating layers 110A and connected to the insulating layers 110A. Note that, for example, as illustrated in FIG. 9, the contact C4 extends in the Z-direction, has an upper end connected to the wiring m0 in the wiring layer M0, and has a lower end connected to the wiring d2 in the wiring layer D2.

[Structure of Wiring Layer M0]

As illustrated in FIG. 9, the plurality of wirings m0 included in the wiring layer M0 are, for example, electrically connected to at least one of the configuration in the memory cell array layer $L_{MCA}$ and the configuration in the transistor layer $L_{TR}$. The plurality of wirings m0, for example, may include a stacked film of a barrier conductive film, such as titanium nitride (TiN) and tantalum nitride (TaN), and a metal film, such as tungsten (W) and copper (Cu). Note that a part of the plurality of wirings m0 function as the bit lines BL0 and BL1. For example, as illustrated in FIG. 11, the bit lines BL0 are arranged in the X-direction and extend in the Y-direction. These respective plurality of bit lines BL0 are connected to the five semiconductor columns 120 included in the respective string units SU0 to SU4. Although the illustration is omitted, similarly to the bit lines BL0, the bit lines BL1 are also arranged in the X-direction and extend in the Y-direction. Similarly to the bit lines BL0, the bit lines BL1 are also connected to the five semiconductor columns 120 included in the respective string units SU5 to SU9.

[Read Operation]

Figure 19:
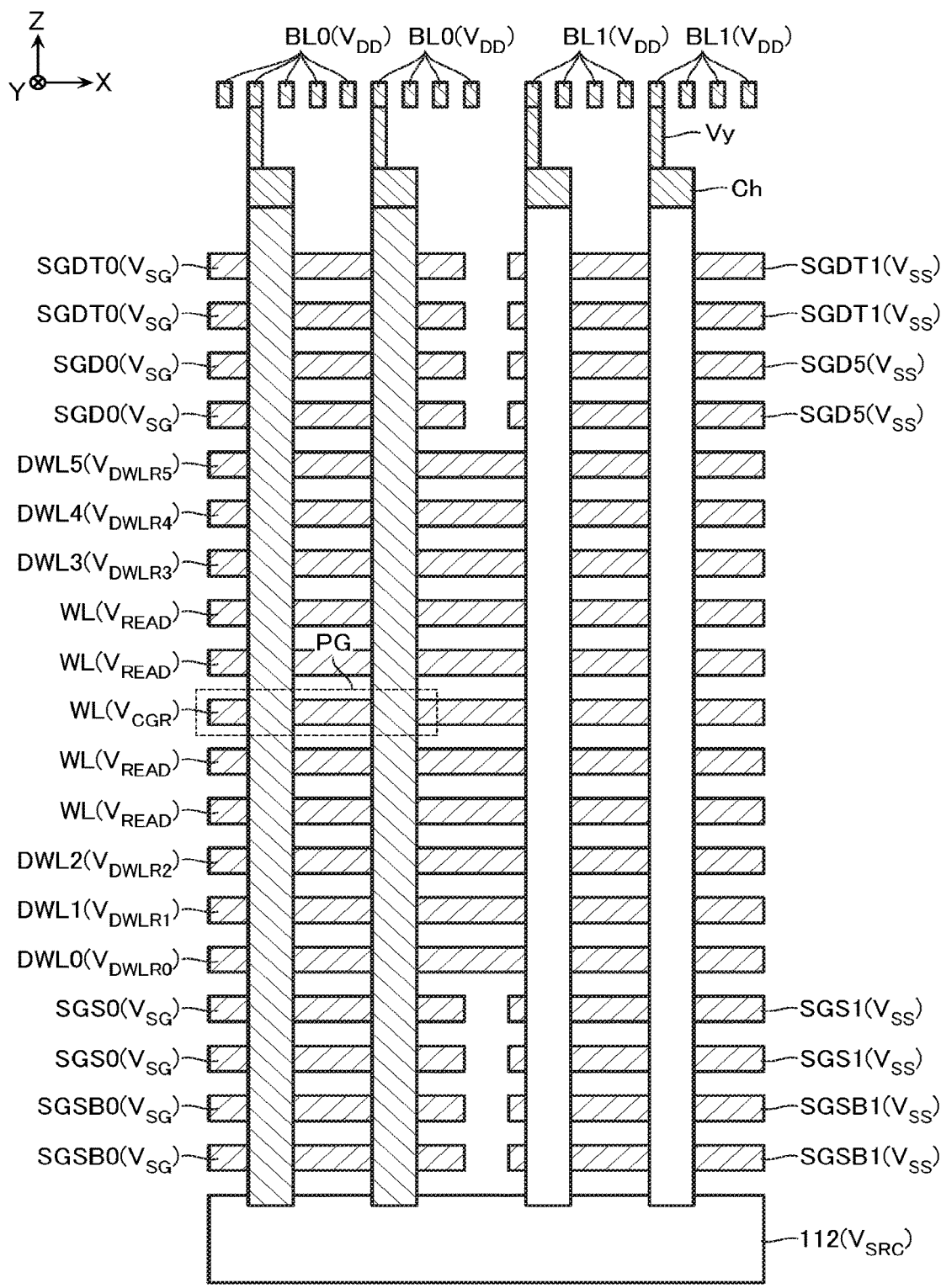
FIG. 19 is a schematic cross-sectional view to describe a read operation.

Next, with reference to FIG. 19, the read operation of the semiconductor memory device according to this embodiment will be described. FIG. 19 is a schematic cross-sectional view to describe the read operation.

Note that FIG. 19 is the schematic cross-sectional view to describe a voltage applied to each wiring or the like in the read operation, and does not strictly illustrate the position, the shape, and the like of the wiring. For example, FIG. 19 omits the configuration corresponding to the first hook-up region $R_{HU1}$ and the configuration corresponding to the second hook-up region $R_{HU2}$.

In the following description, an example of performing the read operation on the plurality of memory cells MC in the string unit SU0 will be described.

In the following description, a word line WL target for the operation is referred to as a selected word line WL and the word lines WL other than the selected word line WL are referred to as unselected word lines WL in some cases. In the following description, among the plurality of memory cells MC included in a string unit SU0 target for the operation, the memory cell MC connected to the selected word line WL is referred to as a selected memory cell MC in some cases.

Moreover, in the following description, an execution unit of the read operation or the write operation is referred to as a page in some cases. The range of the page is appropriately adjustable.

Note that, in the following description, an example in which the memory cell MC stores N-bit data, each of the string units SU0 to SU9 includes the number of pages N times of the number of word lines WL included in the memory block BLK will be shown. Additionally, an example in which these plurality of pages each store the data having the same number of bits as the number of memory strings MS included in one of the string units SU0 to SU9 will be shown.

In the following description, a page target for the operation will be referred to as a selected page PG in some cases. The selected page PG is one of the plurality of pages included in the string unit SU0 target for the operation. Gate electrodes of the plurality of memory cells MC corresponding to the selected page PG are connected to the selected word lines WL.

In the read operation, for example, a voltage $V_{DD}$ is applied to the plurality of bit lines BL0 and the plurality of bit lines BL1. Accordingly, the voltage $V_{DD}$ is transferred to the drain-side select transistor STDT.

In the read operation, for example, a voltage Vs is applied to the drain-side select gate lines SGDT0 and SGD0. The voltage $V_{SG}$ is larger than the voltage $V_{DD}$. A voltage difference between the voltage $V_{SG}$ and the voltage $V_{DD}$ is larger than a threshold voltage when the drain-side select transistors STDT and STD are caused to function as NMOS transistors. Therefore, electron channels are formed in channel regions of the drain-side select transistors STDT and STD. Accordingly, the voltage $V_{DD}$ is transferred to the dummy memory cell DMC5 in the string unit SU0.

In the read operation, for example, the ground voltage $V_{SS}$ is applied to the drain-side select gate lines SGDT1 and SGD1 to SGD9. The ground voltage $V_{SS}$ is smaller than the voltage $V_{DD}$. A voltage difference between the voltage $V_{DD}$ and the voltage $V_{SS}$ is smaller than the threshold voltage when the drain-side select transistors STDT and STD are caused to function as NMOS transistors. Therefore, a channel is not formed in the channel region of the drain-side select transistor STDT or STD. Therefore, the voltage $V_{DD}$ is not transferred to the dummy memory cells DMC5 in the string units SU1 to SU9.

In the read operation, for example, a voltage $V_{DWLR3}$ to a voltage $V_{DWLR5}$ are applied to the dummy word lines DWL3 to DWL5. The voltage $V_{DWLR3}$ is larger than a voltage $V_{DWLR4}$. The voltage $V_{DWLR4}$ is larger than the voltage $V_{DWLR5}$. The voltage $V_{DWLR5}$ is, for example, larger than the voltage $V_{SG}$. Voltage differences between the voltage $V_{DWLR3}$ to the voltage $V_{DWLR5}$ and the voltage $V_{DD}$ are larger than a threshold voltage when the dummy memory cells DMC3 to DMC5 are caused to function as NMOS transistors. Therefore, electron channels are formed in channel regions in the dummy memory cells DMC3 to DMC5. Accordingly, the voltage $V_{DD}$ is transferred to the memory cells MC in the string unit SU0.

In the read operation, for example, a voltage $V_{SRC}$ is applied to the source line SL. The voltage $V_{SRC}$ is larger than the ground voltage $V_{SS}$ and smaller than the voltage $V_{DD}$. The voltage $V_{SRC}$ may have a magnitude same extent to the ground voltage $V_{SS}$. Accordingly, the voltage $V_{SRC}$ is transferred to the source-side select transistor STSB.

In the read operation, for example, the voltage $V_{SG}$ is applied to the source-side select gate lines SGSB0 and SGS0. Thus, electron channels are formed in channel regions in the source-side select transistors STSB and STS. Thus, the voltage $V_{SRC}$ is transferred to the dummy memory cells DMC0 in the string units SU0 to SU4.

In the read operation, for example, the ground voltage $V_{SS}$ is applied to the source-side select gate lines SGSB1 and SGS1. Therefore, the channel is not formed in the channel region in the source-side select transistor STSB or STS. Therefore, the voltage $V_{SRC}$ is not transferred to the dummy memory cells DMC0 in the string units SU5 to SU9.

In the read operation, for example, a voltage $V_{DWLR0}$ to a voltage $V_{DWLR2}$ are applied to the dummy word lines DWL0 to DWL2. The voltage $V_{DWLR2}$ is larger than a voltage $V_{DWLR1}$. The voltage $V_{DWLR1}$ is larger than the voltage $V_{DWLR0}$. The voltage $V_{DWLR0}$ is, for example, larger than the voltage $V_{SG}$. Additionally, voltage differences between the voltage $V_{DWLR0}$ to the voltage $V_{DWLR2}$ and the voltage $V_{SR}c$ are larger than a threshold voltage when the dummy memory cells DMC0 to DMC2 are caused to function as NMOS transistors. Accordingly, electron channels are formed in the channel regions in the dummy memory cells DMC0 to DMC2. Thus, the voltage $V_{SRC}$ is transferred to the memory cells MC in the string units SU0 to SU4.

In the read operation, for example, a read pass voltage $V_{READ}$ is applied to the unselected word lines WL. The read pass voltage $V_{READ}$ is larger than the voltages $V_{DWLR2}$ and $V_{DWLR3}$. Voltage differences between the read pass voltage $V_{READ}$ and the voltages $V_{DD}$ and $V_{SRC}$ are larger than a threshold voltage when the unselected memory cells MC are caused to function as an NMOS transistor regardless of the data stored in the unselected memory cells MC. Therefore, electron channels are formed in channel regions in the unselected memory cells MC.

In the read operation, for example, a read voltage $V_{CGR}$ is applied to the selected word line WL. The read voltage $V_{CGR}$ is smaller than the read pass voltage $V_{READ}$.

Here, when the selected memory cell stores specific data, a voltage difference between the read voltage $V_{CGR}$ and the voltage $V_{SRC}$ is larger than the threshold voltage when the selected memory cell MC is caused to function as an NMOS transistor. Accordingly, in such a case, an electron channel is formed in a channel region in the selected memory cell MC, and the bit line BL0 is electrically conductive to the source line SL. Thus, a current flows through the bit line BL0.

On the other hand, when the selected memory cell does not store the specific data, a voltage difference between the read voltage $V_{CGR}$ and the voltage $V_{SRC}$ is smaller than the threshold voltage when the selected memory cell MC is caused to function as an NMOS transistor. Therefore, in such a case, an electron channel is not formed in the channel region in the selected memory cell MC, and the bit line BL0 is not electrically conductive to the source line SL. Therefore, the current does not flow through the bit line BL0.

Therefore, in the read operation, the sense amplifier module SAM (FIG. 4) measures the currents in the bit lines BL0 to ensure detecting the data stored in the memory cells MC in the selected page PG.

[Write Operation]

Figure 20:
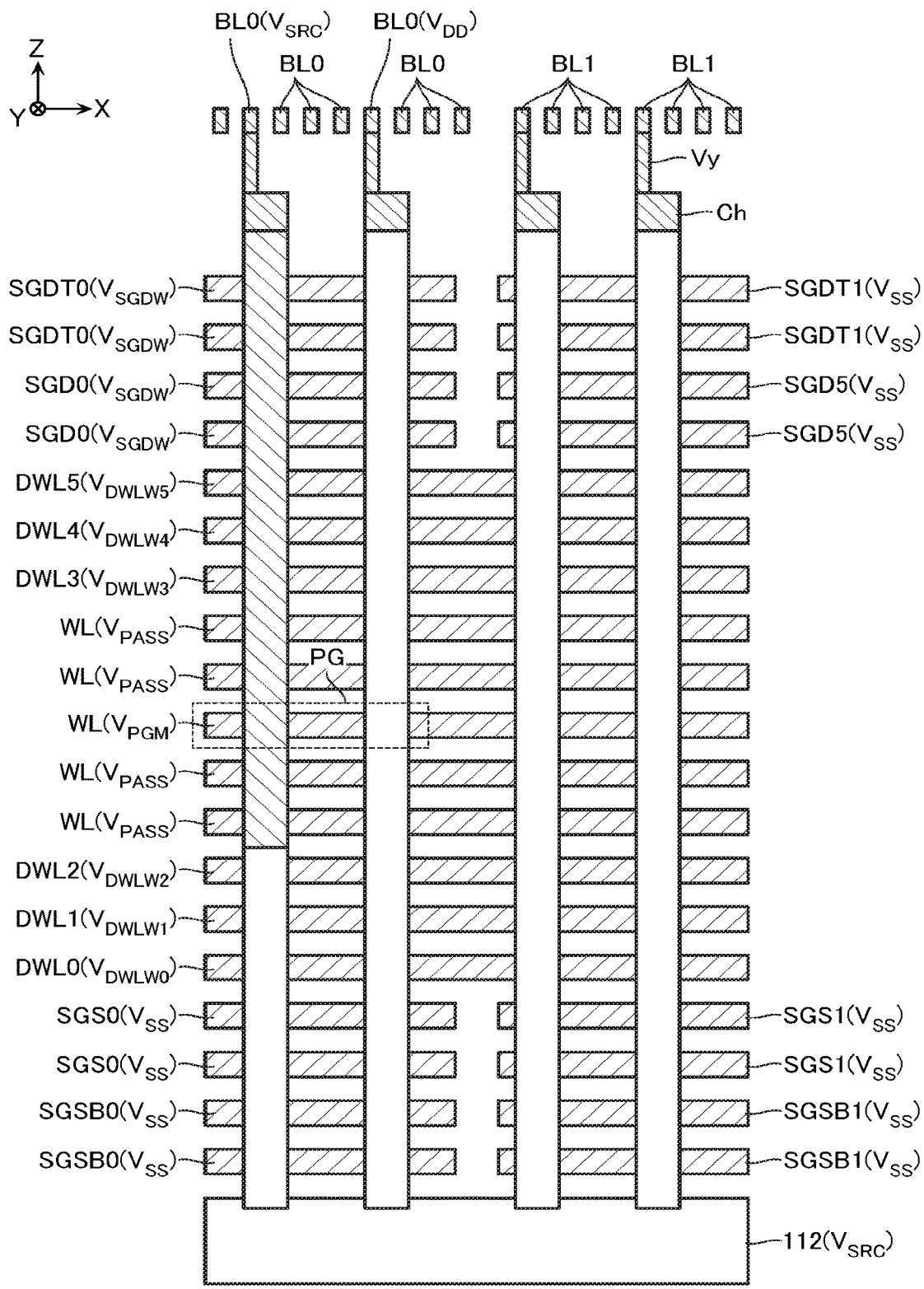
FIG. 20 is a schematic cross-sectional view to describe a write operation.

Next, with reference to FIG. 20, the write operation of the semiconductor memory device according to this embodiment will be described. FIG. 20 is a schematic cross-sectional view to describe the write operation.

Note that FIG. 20 is the schematic cross-sectional view to describe a voltage applied to each wiring or the like in the write operation, and does not strictly illustrate the position, the shape, and the like of the wiring. For example, FIG. 20 omits the configuration corresponding to the first hook-up region $R_{HU1}$ and the configuration corresponding to the second hook-up region $R_{HU2}$.

In the following description, an example of performing the read operation on the plurality of memory cells MC in the string unit SU0 will be described.

In the write operation, for example, the voltage $V_{SRC}$ is applied to the bit line BL0 connected to the selected memory cell MC subject to adjustment of the threshold voltage among the plurality of selected memory cells MC. Thus, the voltage $V_{SRC}$ is transferred to the drain-side select transistor STDT connected to this bit line BL0. Hereinafter, the memory cell MC subject to adjustment of the threshold voltage among the plurality of selected memory cells MC is referred to as a "write memory cell MC" in some cases.

In the write operation, for example, the voltage $V_{DD}$ is applied to the bit line BL0 connected to the selected memory cell MC not subject to adjustment of the threshold voltage among the plurality of selected memory cells MC. Thus, the voltage $V_{DD}$ is transferred to the drain-side select transistor STDT connected to this bit line BL0. Hereinafter, the selected memory cell MC not subject to adjustment of the threshold voltage among the plurality of selected memory cells MC is referred to as an "inhibited memory cell MC" in some cases.

In the write operation, for example, the voltage $V_{SRC}$ is applied to the plurality of bit lines BL1. Thus, the voltage $V_{SRC}$ is transferred to the drain-side select transistor STDT connected to the bit line BL1.

In the write operation, for example, a voltage $V_{SGDW}$ is applied to the drain-side select gate lines SGDT0 and SGD0. The voltage $V_{SGDW}$ is larger than the voltages $V_{SRC}$ and $V_{DD}$.

Here, a voltage difference between the voltage $V_{SGDW}$ and the voltage $V_{SRC}$ is larger than the threshold voltage when the drain-side select transistors STDT and STD are caused to function as NMOS transistors. Therefore, electron channels are formed in the channel regions in the drain-side select transistors STDT and STD electrically connected to the write memory cell MC. Thus, the voltage $V_{SRC}$ is transferred to the dummy memory cell DMC5 electrically connected to the write memory cell MC.

On the other hand, a voltage difference between the voltage $V_{SGDW}$ and the voltage $V_{DD}$ is smaller than the threshold voltage when the drain-side select transistors STDT and STD are caused to function as NMOS transistors. Accordingly, an electron channel is not formed in the channel region in the drain-side select transistor STDT or STD electrically connected to the inhibited memory cell MC. Accordingly, the voltage $V_{SRC}$ is not transferred to the dummy memory cell DMC5 electrically connected to the inhibited memory cells MC.

In the write operation, for example, the ground voltage $V_{SS}$ is applied to the drain-side select gate lines SGDT1 and SGD1 to SGD9. Accordingly, a channel is not formed in the channel region in the drain-side select transistor STDT or STD. Therefore, the voltage $V_{SRC}$ is not transferred to the dummy memory cells DMC5 in the string units SU1 to SU9.

In the write operation, for example, a voltage $V_{DWLW3}$ to a voltage $V_{DWLW5}$ are applied to the dummy word lines DWL3 to DWL5. The voltage $V_{DWLW3}$ is larger than the voltage $V_{DWLW4}$. The voltage $V_{DWLW4}$ is larger than the voltage $V_{DWLW5}$. The voltage $V_{DWLW5}$ is, for example, larger than the voltage VSG. Voltage differences between the voltage $V_{DWLW3}$ to the voltage $V_{DWLW5}$ and the voltage $V_{SRC}$ are larger than the threshold voltage when the dummy memory cells DMC3 to DMC5 are caused to function as NMOS transistors. Therefore, electron channels are formed in the channel regions in the dummy memory cells DMC3 to DMC5. Thus, the voltage $V_{SRC}$ is transferred to the memory cell MC electrically connected to the write memory cell MC.

In the write operation, for example, the voltage $V_{SRC}$ is applied to the source line SL. Thus, the voltage $V_{SRC}$ is transferred to the source-side select transistor STSB.

In the write operation, for example, the ground voltage $V_{SS}$ is applied to the source-side select gate lines SGSB0, SGS0, SGSB1, and SGS1. Therefore, a channel is not formed in the channel region in the source-side select transistor STSB or STS. Accordingly, the voltage $V_{SRC}$ is not transferred to the dummy memory cells DMC0 in the string units SU0 to SU9.

In the write operation, for example, a voltage $V_{DWLW0}$ to a voltage $V_{DWLW2}$ are applied to the dummy word lines DWL0 to DWL2. The voltage $V_{DWLW2}$ is larger than the voltage $V_{DWLW1}$. The voltage $V_{DWLW1}$ is larger than the voltage $V_{DWLW0}$.

In the write operation, for example, a write pass voltage $V_{PASS}$ is applied to the unselected word lines WL. The write pass voltage $V_{PASS}$ is larger than the voltages $V_{DWLW2}$ and $V_{DWLW3}$. A voltage difference between the write pass voltage $V_{PASS}$ and the voltage $V_{SRC}$ is larger than the threshold voltage when the unselected memory cells MC are caused to function as NMOS transistors, regardless of the data stored in the unselected memory cells MC. Accordingly, electron channels are formed in the channel regions in the unselected memory cells MC.

In the write operation, for example, a program voltage $V_{PGM}$ is applied to the selected word line WL. The program voltage $V_{PGM}$ is larger than the write pass voltage $V_{PASS}$.

Here, the voltage $V_{SRC}$ is applied to a channel in the write memory cell MC. A comparatively large electric field is generated between the channel and the selected word line WL. Thus, electrons in a channel in the semiconductor column 120 tunnel in the electric charge accumulating film 132 (FIG. 12) via the tunnel insulating film 131 (FIG. 12). Thus, the threshold voltage in the write memory cell MC increases.

A channel in the inhibited memory cell MC is in electrically floating state, and a voltage of this channel increases up to around the write pass voltage $V_{PASS}$ by capacitive coupling with the unselected word line WL. Between the channel and the selected word line WL, the large electric field as described above does not occur. Therefore, the electrons in the channel of the semiconductor column 120 do not tunnel in the electric charge accumulating film 132 (FIG. 12). Therefore, the threshold voltage in the inhibited memory cell MC does not increase.

Note that channels in the memory cells MC in the string units SU1 to SU9 are also in the electrically floating states. Therefore, electrons in the channels in the memory cells MC in the string units SU1 to SU9 do not tunnel in the electric charge accumulating films 132 (FIG. 12). Therefore, the threshold voltages in these memory cells MC do not increase.

[Erase Operation]

Figure 21:
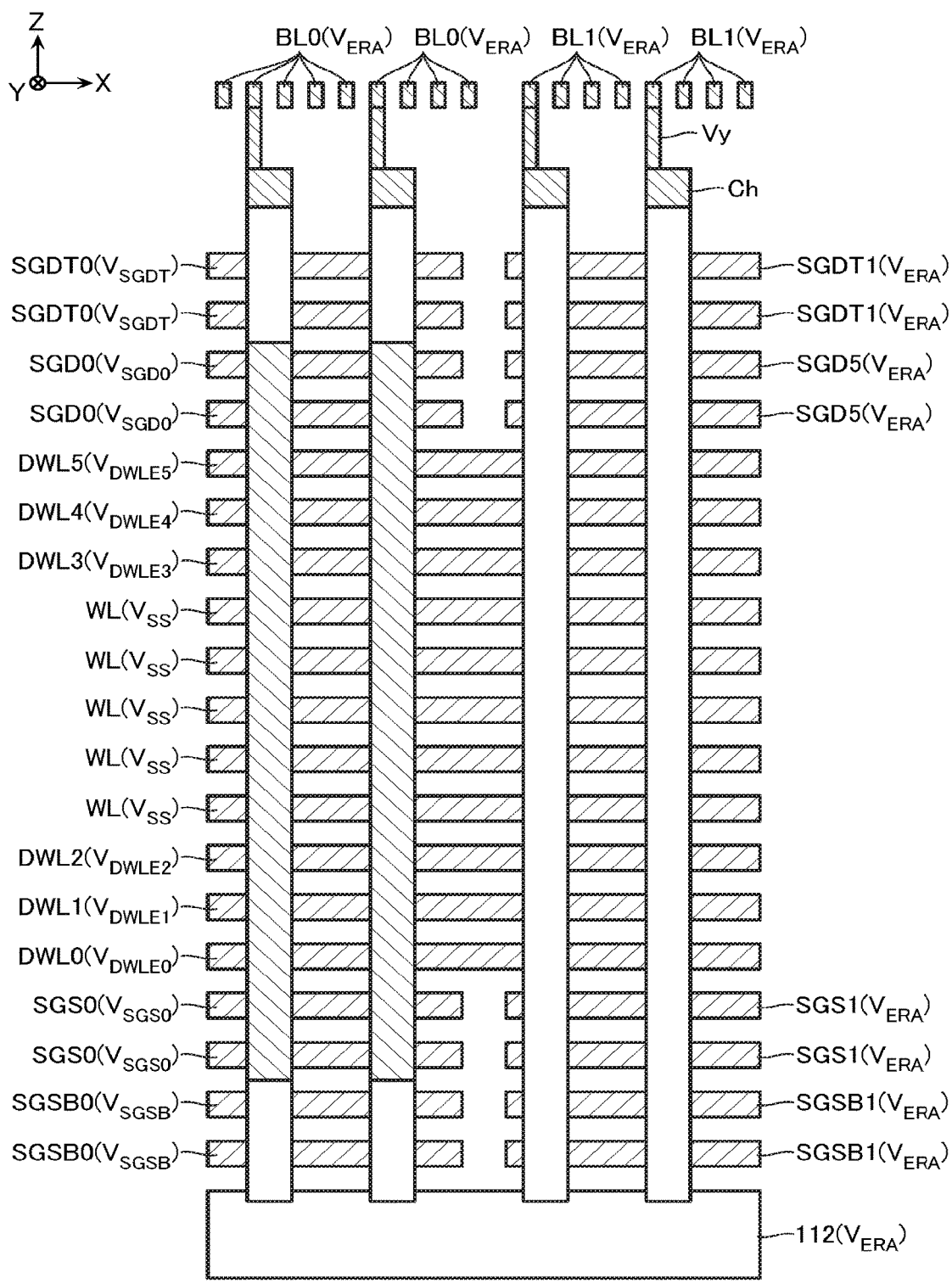
FIG. 21 is a schematic cross-sectional view to describe an erase operation.

Next, with reference to FIG. 21, the erase operation of the semiconductor memory device according to this embodiment will be described. FIG. 21 is a schematic cross-sectional view to describe the erase operation.

Note that FIG. 21 is the schematic cross-sectional view to describe a voltage applied to each wiring or the like in the erase operation, and does not strictly illustrate the position, the shape, and the like of the wiring. For example, FIG. 21 omits the configuration corresponding to the first hook-up region $R_{HU1}$ and the configuration corresponding to the second hook-up region $R_{HU2}$.

In the following description, an example of performing the erase operation on the plurality of memory cells MC in the string units SU0 to SU4 will be described.

In the erase operation, for example, an erase voltage $V_{ERA}$ is applied to the plurality of bit lines BL0 and the plurality of bit lines BL1. Thus, the erase voltage $V_{ERA}$ is transferred to the drain-side select transistor STDT. The erase voltage $V_{ERA}$ is larger than the write pass voltage $V_{PASS}$. The erase voltage $V_{ERA}$ may have a magnitude to the same extent of the program voltage $V_{PGM}$ or may be larger or smaller than the program voltage $V_{PGM}$.

In the erase operation, for example, a voltage $V_{SGDT}$ is applied to the drain-side select gate line SGDT0. The voltage $V_{SGDT}$ is smaller than the erase voltage $V_{ERA}$. Thus, in the channel region in the drain-side select transistor STDT corresponding to the drain-side select gate line SGDT0, a Gate Induced Drain Leakage (GIDL) occurs to generate an electron and hole pair. The electrons move to the bit line BL0 side and the holes move to the memory cells MC side.

In the erase operation, for example, a voltage $V_{SGD0}$ is applied to the drain-side select gate lines SGD0 to SGD4. The voltage $V_{SGD0}$ is smaller than the erase voltage $V_{ERA}$. The voltage $V_{SGD0}$ may be equal to the voltage $V_{SGDT}$ or may be larger than the voltage $V_{SGDT}$. A voltage difference between the erase voltage $V_{ERA}$ and the voltage $V_{SGD0}$ is larger than an absolute value of a threshold voltage when the drain-side select transistor STD is caused to function as a PMOS transistor. Therefore, hole channels are formed in the channel region in the drain-side select transistor STD. Thus, the holes are supplied to the dummy memory cells DMC5 in the string units SU0 to SU4.

In the erase operation, for example, the erase voltage $V_{ERA}$ is applied to the drain-side select gate line SGDT1. Accordingly, the GIDL does not occur in the channel region in the drain-side select transistor STDT corresponding to the drain-side select gate line SGDT1, and the electron and hole pair does not occur.

In the erase operation, for example, the erase voltage $V_{ERA}$ is applied to the drain-side select gate lines SGD5 to SGD9.

In the erase operation, for example, a voltage $V_{DWLE3}$ to a voltage $V_{DWLE5}$ are applied to the dummy word lines DWL3 to DWL5. The voltage $V_{DWLE3}$ is smaller than the voltage $V_{DWLE4}$. The voltage $V_{DWLE4}$ is smaller than the voltage $V_{DWLE5}$. The voltage $V_{DWLE5}$ is, for example, smaller than the voltage $V_{SGD0}$. Voltage differences between the voltage $V_{DWLE3}$ to the voltage $V_{DWLE5}$ and the erase voltage $V_{ERA}$ are larger than an absolute value of a threshold voltage when the dummy memory cells DMC3 to DMC5 are caused to function as PMOS transistors. Accordingly, hole channels are formed in the channel regions in the dummy memory cells DMC3 to DMC5. Thus, the holes are transferred to the memory cells MC in the string units SU0 to SU4.

In the erase operation, for example, the erase voltage $V_{ERA}$ is applied to the source line SL. Thus, the erase voltage $V_{ERA}$ is transferred to the source-side select transistor STSB.

In the erase operation, for example, a voltage $V_{SGSB}$ is applied to the source-side select gate line SGSB0. The voltage $V_{SGSB}$ is smaller than the erase voltage $V_{ERA}$. Thus, a GIDL occurs in the channel region in the source-side select transistor STSB corresponding to the source-side select gate line SGSB0 to generate an electron and hole pair. The electrons move to the source line SL side and the holes move to the memory cells MC side.

In the erase operation, for example, a voltage $V_{SGS0}$ is applied to the source-side select gate line SGS0. The voltage $V_{SGS0}$ is smaller than the erase voltage $V_{ERA}$. The voltage $V_{SGS0}$ may be equal to the voltage $V_{SGSB}$ or may be larger than the voltage $V_{SGSB}$. A voltage difference between the erase voltage $V_{ERA}$ and the voltage $V_{SGS0}$ may be larger than an absolute value of a threshold voltage when the source-side select transistor STS is caused to function as a PMOS transistor. Therefore, hole channels are formed in the channel region in the source-side select transistor STS. Thus, the holes are supplied to the dummy memory cells DMC0 in the string units SU0 to SU4.

In the erase operation, for example, the erase voltage $V_{ERA}$ is applied to the source-side select gate line SGSB1. Therefore, the GIDL does not occur in the channel region in the source-side select transistor STSB corresponding to the source-side select gate line SGSB1, and the electron and hole pair does not occur.

In the erase operation, for example, the erase voltage $V_{ERA}$ is applied to the source-side select gate line SGS1.

In the erase operation, for example, a voltage $V_{DWLE0}$ to a voltage $V_{DWLE2}$ are applied to the dummy word lines DWL0 to DWL2. The voltage $V_{DWLE2}$ is smaller than the voltage $V_{DWLE1}$. The voltage $V_{DWLE1}$ is smaller than the voltage $V_{DWLE0}$. The voltage $V_{DWLE0}$ is, for example, smaller than the voltage $V_{SGS0}$. Voltage difference between the voltage $V_{DWLE0}$ to the voltage $V_{DWLE2}$ and the erase voltage $V_{ERA}$ are larger than an absolute value of a threshold voltage when the dummy memory cells DMC0 to DMC2 are caused to function as PMOS transistors. Accordingly, hole channels are formed in the channel regions in the dummy memory cells DMC0 to DMC2. Thus, the holes are transferred to the memory cells MC in the string unit SU0.

In the erase operation, for example, the ground voltage $V_{SS}$ is applied to the word line WL.

Here, holes are supplied to channel regions in the memory cells MC in the string units SU0 to SU4. A comparatively large electric field is generated between the channel and the word line WL. Thus, holes in the channel in the semiconductor column 120 tunnel in the electric charge accumulating film 132 (FIG. 12) via the tunnel insulating film 131 (FIG. 12). Thus, threshold voltages in the memory cells MC in the string units SU0 to SU4 decrease.

On the other hand, holes are not supplied to channel regions in the memory cells MC in the string units SU5 to SU9. Between the channel and the word line WL, the large electric field as described above does not occur. Therefore, threshold voltages in the memory cells MC in the string units SU5 to SU9 do not decrease.

Figure 22:
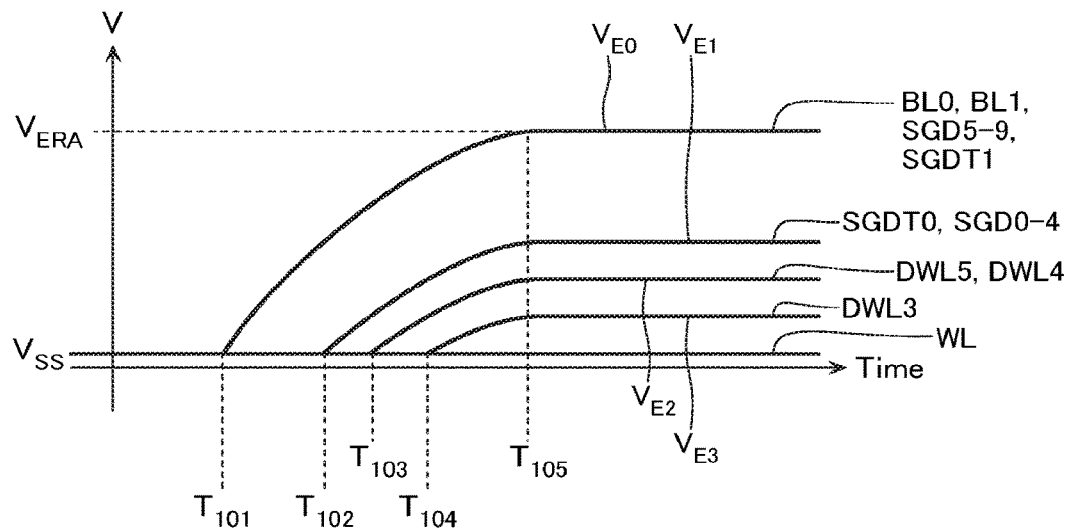
FIG. 22 is a schematic waveform diagram to describe the erase operation.
Figure 23:
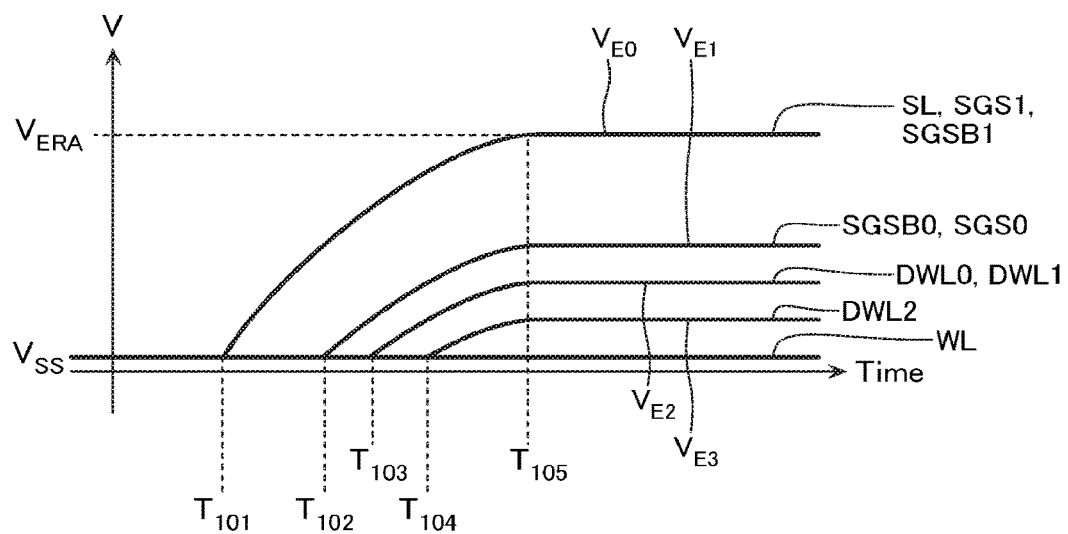
FIG. 23 is a schematic waveform diagram to describe the erase operation.

FIG. 22 and FIG. 23 are schematic waveform diagrams to describe the erase operation. FIG. 22 illustrates an example of voltages applied to the bit lines BL0 and BL1, the drain-side select gate lines SGDT0, SGDT1, and SGD0 to SGD9, the dummy word lines DWL3 to DWL5, and the word line WL. FIG. 23 illustrates an example of voltages applied to the source line SL, the source-side select gate lines SGSB0, SGSB1, SGS0, and SGS1, the dummy word lines DWL0 to DWL2, and the word line WL.

In the examples of FIG. 22 and FIG. 23, the ground voltage $V_{SS}$ is applied to each wiring at timing $T_{101}$ in the erase operation.

At timing $T_{101}$ in the erase operation, the application of the voltage to the bit lines BL0 and BL1, the drain-side select gate lines SGDT1 and SGD5 to SGD9, the source line SL, and the source-side select gate lines SGSB1 and SGS1 is started. In the following description, the voltage applied to these wirings is referred to as a voltage $V_{E0}$ in some cases.

At timing $T_{102}$, the application of the voltage to the drain-side select gate lines SGDT0 and SGD0 to SGD4, and the source-side select gate lines SGSB0 and SGS0 is started. In the following description, the voltage applied to these wirings is referred to as a voltage $V_{E1}$ in some cases. In the illustrated example, a voltage difference between the voltage $V_{E0}$ and the voltage $V_{E1}$ is maintained from timing $T_{102}$ to at and after timing $T_{105}$.

At timing $T_{103}$, the application of the voltage to the dummy word lines DWL5, DWL4, DWL1, and DWL0 is started. In the following description, the voltage applied to these wirings is referred to as a voltage $V_{E2}$ in some cases. In the illustrated example, voltage differences between the voltage $V_{E0}$, the voltage $V_{E1}$, and the voltage $V_{E2}$ are maintained from timing $T_{103}$ to at and after timing $T_{105}$.

At timing $T_{104}$, the application of the voltage to the dummy word lines DWL3 and DWL2 is started. In the following description, the voltage applied to these wirings is referred to as a voltage $V_{E3}$ in some cases. In the illustrated example, voltage differences between the voltage $V_{E0}$, the voltage $V_{E1}$, the voltage $V_{E2}$, and the voltage $V_{E3}$ are maintained from timing $T_{104}$ to at and after timing $T_{105}$.

At timing $T_{105}$, the voltage applied to each of the wirings reaches the magnitude described with reference to FIG. 21. At and after timing $T_{105}$, the voltage applied to each of the wirings is maintained at the magnitude described with reference to FIG. 21.

[Effects]

As described with reference to FIG. 9 and the like, the semiconductor memory device according to this embodiment includes the plurality of conductive layers 110 arranged in the Z-direction and the semiconductor columns 120 opposed to these plurality of conductive layers 110. As described with reference to FIG. 12 and the like, the semiconductor memory device includes the electric charge accumulating films 132 disposed between the conductive layers 110 and the semiconductor columns 120. In the semiconductor memory device, as the number of the conductive layers 110 arranged in the Z-direction increases, the number of the memory cells MC included in the memory blocks BLK increases. With this configuration, high integration can be achieved comparatively easily.

Here, in this semiconductor memory device, the page is the execution unit of the read operation and the write operation, and the memory block BLK is the execution unit of the erase operation in some cases. Here, for example, in a case where data that is not the erase target remains in the memory block BLK as the erase target, it is necessary to write this data to another memory block BLK, and erase the data in the memory block BLK after that. Hereinafter, this operation is referred to as a garbage collection in some cases.

Here, when the number of the memory cells MC included in the memory block BLK increases, the number of executions of the garbage collection increases in some cases. In this case, the number of executions of the write operation and the erase operation on the memory cells MC increases, and this leads to short service life of the memory cells MC in some cases.

To reduce the short service life of the memory cells MC, for example, it is considered that one memory block BLK is physically divided into the two memory blocks BLK. However, in this case, it is necessary to dispose the two second hook-up regions $R_{HU2}$ corresponding to the divided two memory blocks BLK, and this possibly results in reduction in integration degree.

Therefore, the semiconductor memory device according to this embodiment is configured to be able to independently erase the data in the memory cells MC in the circuit blk0 and the memory cells MC in the circuit blk1. This configuration allows reducing the short service life of the memory cells MC in association with the increase in the number of executions of the garbage collection while reducing the decrease in integration degree.

Additionally, with the semiconductor memory device according to this embodiment, the different voltages can be applied to the select gate lines SGDT0, SGD0 to SGD4, SGS0, and SGSB0 corresponding to the circuit blk0 and the select gate lines SGDT1, SGD5 to SGD9, SGS1, and SGSB1 corresponding to the circuit blk1. With this configuration, in the erase operation, a GIDL can be generated in both of the drain-side select transistor STDT and the source-side select transistor STSB. Thus, stabilization of the erase operation is possible.

[Designation Method of Erase Operation]

The erase operation described with reference to FIG. 21 erases only the data in the memory cells MC in the circuit blk0 or the circuit blk1 in the configuration in the memory block BLK. However, the semiconductor memory device according to the first embodiment may be configured to be able to perform the erase operation that collectively erases the data in the memory cells MC in the circuit blk0 and the circuit blk1, in addition to this erase operation.

Figure 24:
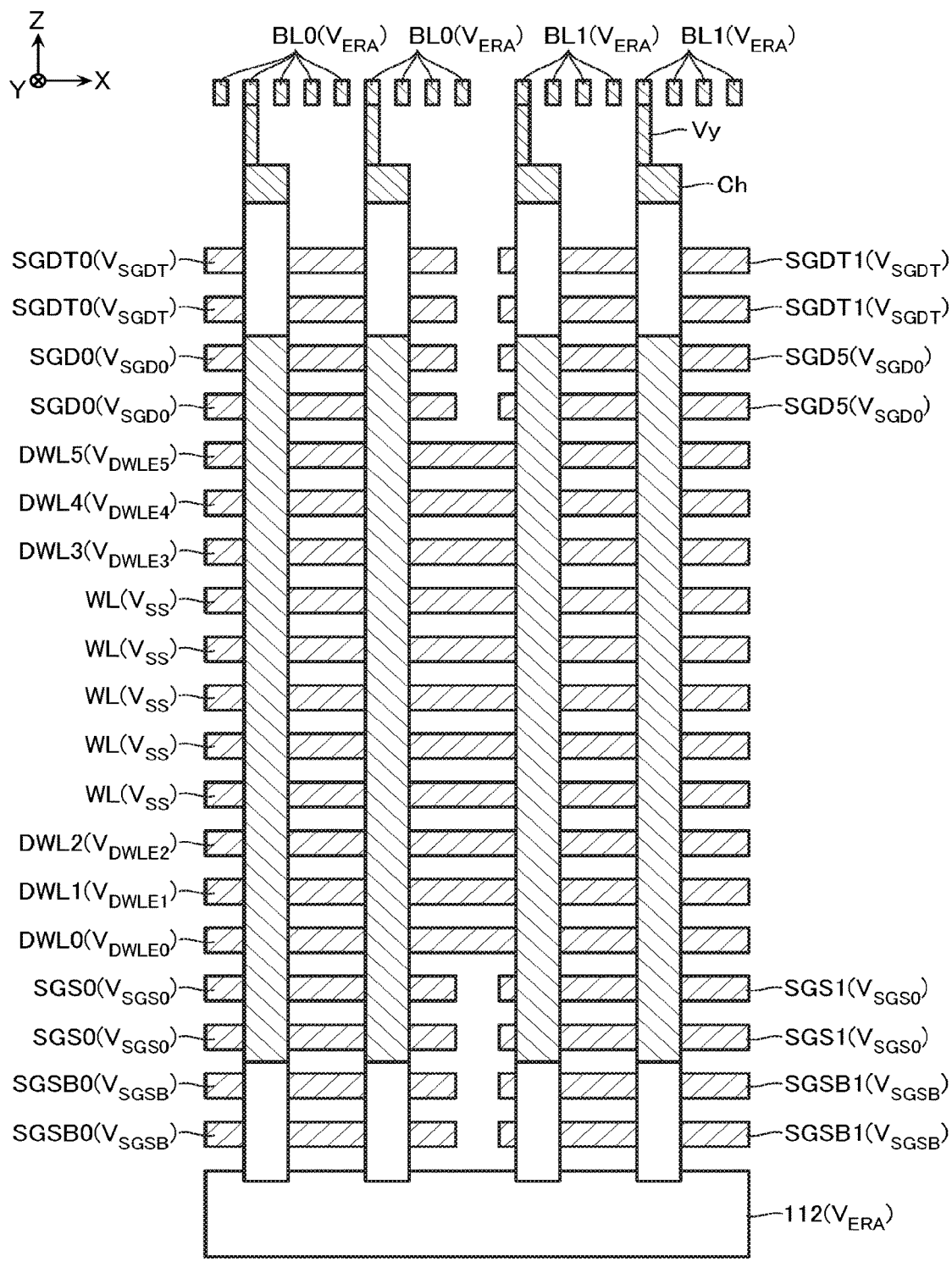
FIG. 24 is a schematic cross-sectional view to describe another erase operation.

Next, with reference to FIG. 24, this erase operation will be described. The erase operation corresponding to FIG. 24 is performed basically similarly to the erase operation described with reference to FIG. 21. However, in the erase operation corresponding to FIG. 24, for example, as illustrated in FIG. 24, the voltage $V_{SGDT}$ is applied to the drain-side select gate lines SGDT0 and SGDT1, and the voltage $V_{SGD0}$ is applied to the drain-side select gate lines SGD0 to SGD9. In this erase operation, the voltage $V_{SGSB}$ is applied to the source-side select gate lines SGSB0 and SGSB1, and the voltage $V_{SGS0}$ is applied to the source-side select gate lines SGS0 and SGS1.

In this case, the erase operation corresponding to FIG. 24 and the erase operation corresponding to FIG. 21 may be performed according to inputs of different command sets.

Figure 25:
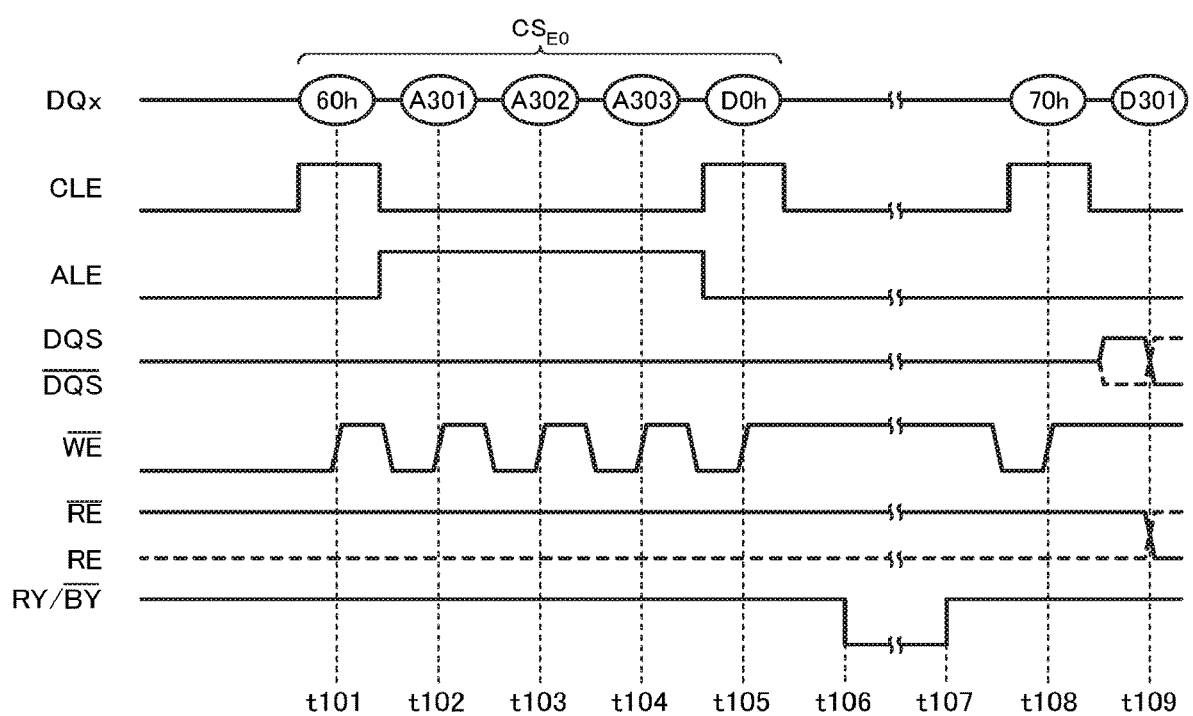
FIG. 25 is a timing chart to describe the erase operation corresponding to FIG. 24.

Next, with reference to FIG. 25, a command set $CS_{E0}$ and the like input to the memory die MD when the erase operation corresponding to FIG. 24 is performed will be described. FIG. 25 is a timing chart to describe the erase operation corresponding to FIG. 24.

Note that as described with reference to FIG. 4, the memory die MD includes the eight data signal input/output terminals DQ0 to DQ7. In the following description, 8-bit data input to these eight data signal input/output terminals DQ0 to DQ7 are expressed using two-digit hexadecimal in some cases. For example, when "0, 0, 0, 0, 0, 0, 0, 0" are input to the eight data signal input/output terminals DQ0 to DQ7, these pieces of data are expressed as, for example, data 00h and the like in some cases. Alternatively, when "1, 1, 1, 1, 1, 1, 1, 1" are input, these pieces of data are expressed as, for example, data FFh and the like in some cases.

FIG. 25 illustrates an example of the command set $CS_{E0}$ input to the memory die MD at the erase operation corresponding to FIG. 24. This command set $CS_{E0}$ includes data 60h, A301, A302, A303, and data D0h.

At timing t101, the controller die CD (FIG. 1) inputs the data 60h as the command data $D_{CMD}$ to the memory die MD. That is, in a state where the voltages of the data signal input/output terminals DQ0 to DQ7 are set to "H" or "L" according to the respective bits of the data 60h, "H" is input to the external control terminal CLE, and "L" is input to the external control terminal ALE, the external control terminal/ WE is risen from "L" to "H". The data 60h is a command input at the start of the erase operation.

At timing t102, the controller die CD inputs the data A301 to the memory die MD as address data $D_{ADD}$. That is, in a state where the voltages of the data signal input/output terminals DQ0 to DQ7 are set to "H" or "L" according to the respective bits of the data A301, "L" is input to the external control terminal CLE, and "H" is input to the external control terminal ALE, the external control terminal/WE is risen from "L" to "H". The data A301 is a part of the row address RA. The data A301 includes, for example, a block address to identify the memory block BLK (FIG. 5).

At timing t103, the controller die CD inputs the data A302 to the memory die MD as the address data $D_{ADD}$. The data A302 is a part of the row address RA. The data A302 includes, for example, the block address and a page address.

At timing t104, the controller die CD inputs the data A303 to the memory die MD as the address data $D_{ADD}$. The data A303 includes a chip address. The chip address is data to identify one memory die MD from the plurality of memory dies MD controlled by the controller die CD.

At timing t105, the controller die CD inputs the data D0h to the memory die MD as the command data $D_{CMD}$. The data D0h is a command indicative of the end of the input of the command set regarding the erase operation.

At timing t106, the terminal RY//BY enters the "L" state from the "H" state, and access to the memory die MD is inhibited. The erase operation is performed in the memory die MD.

At timing t107, the erase operation in the memory die MD ends. The terminal RY//BY enters the "H" state from the "L" state, and the access to the memory die MD is permitted.

At timing t108, the controller die CD inputs, for example, data 70h to the memory die MD as the command data $D_{CMD}$.

The data 70h is a command that requests an output of status data $D_{ST}$ latched in the status register STR (FIG. 4).

At timing t109, the controller die CD causes the memory die MD to output, for example, the data D301. That is, in a state where "L" is input to the external control terminal CLE and "L" is input to the external control terminal ALE, the external control terminal/RE falls from "H" to "L" and the external control terminal RE is risen from "L" to "H". In association with this, the voltages of the data signal input/ output terminals DQ0 to DQ7 are set to "H" or "L" according to the respective bits of the data D301. The controller die CD obtains the data D301 by the amount of eight bits. The data D301 is the status data DST.

Figure 26:
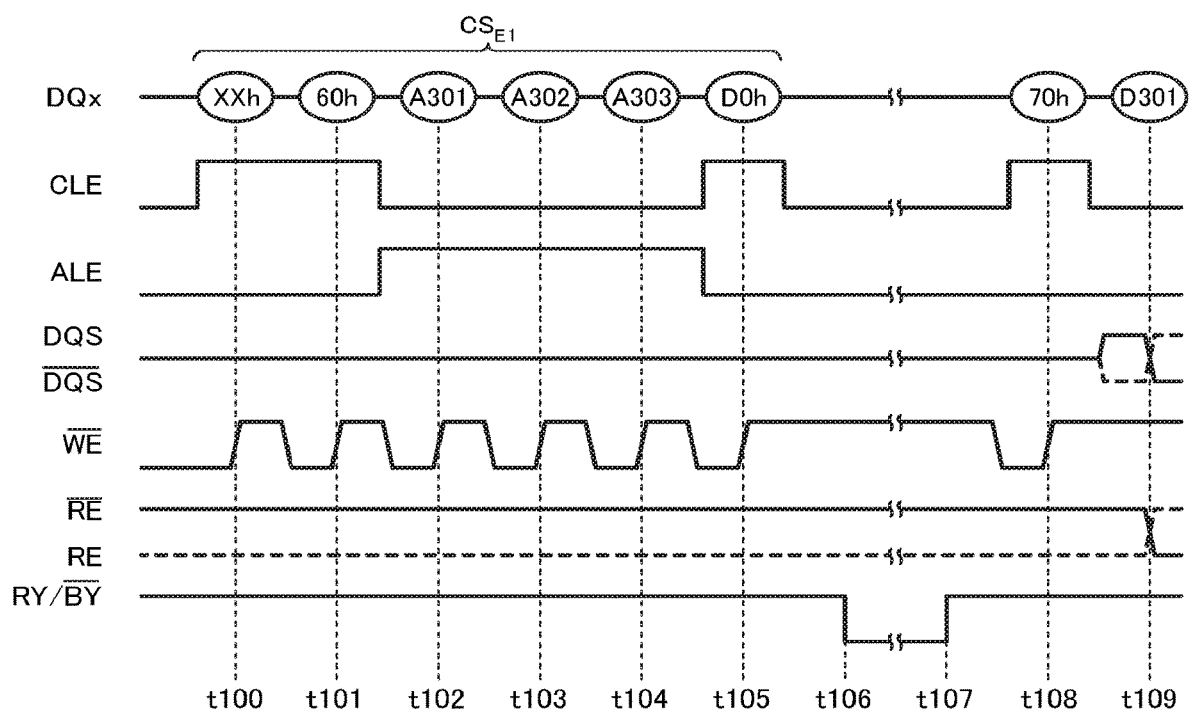
FIG. 26 is a timing chart to describe the erase operation corresponding to FIG. 21.

Next, with reference to FIG. 26, a command set $CS_{E1}$ and the like input to the memory die MD when the erase operation corresponding to FIG. 21 is performed will be described. FIG. 26 is a timing chart to describe the erase operation corresponding to FIG. 21.

FIG. 26 illustrates an example of the command set $CS_{E1}$ input to the memory die MD at the erase operation corresponding to FIG. 21. This command set $CS_{E1}$ includes the data XXh, 60h, A301, A302, A303, and the data D0h.

The erase operation corresponding to FIG. 21 is performed basically similarly to the erase operation corresponding to FIG. 24. However, when the erase operation corresponding to FIG. 21 is performed, at timing t100, the controller die CD (FIG. 1) inputs the data XXh to the memory die MD as the command data $D_{CMD}$ (FIG. 26). The data XXh is a command input when the erase operation corresponding to FIG. 21 is performed. The data XXh may include data indicative of designation of the circuit blk0 or the circuit blk1 as an execution target for the erase operation.

Note that the 8-bit data constituting the data XXh each may be "0" or may be "1". Among the 8-bit data constituting the data XXh, the data from the first bit to the fourth bit may be the same or may be different from the data from the fifth bit to the eighth bit.

Second Embodiment

Figure 27:
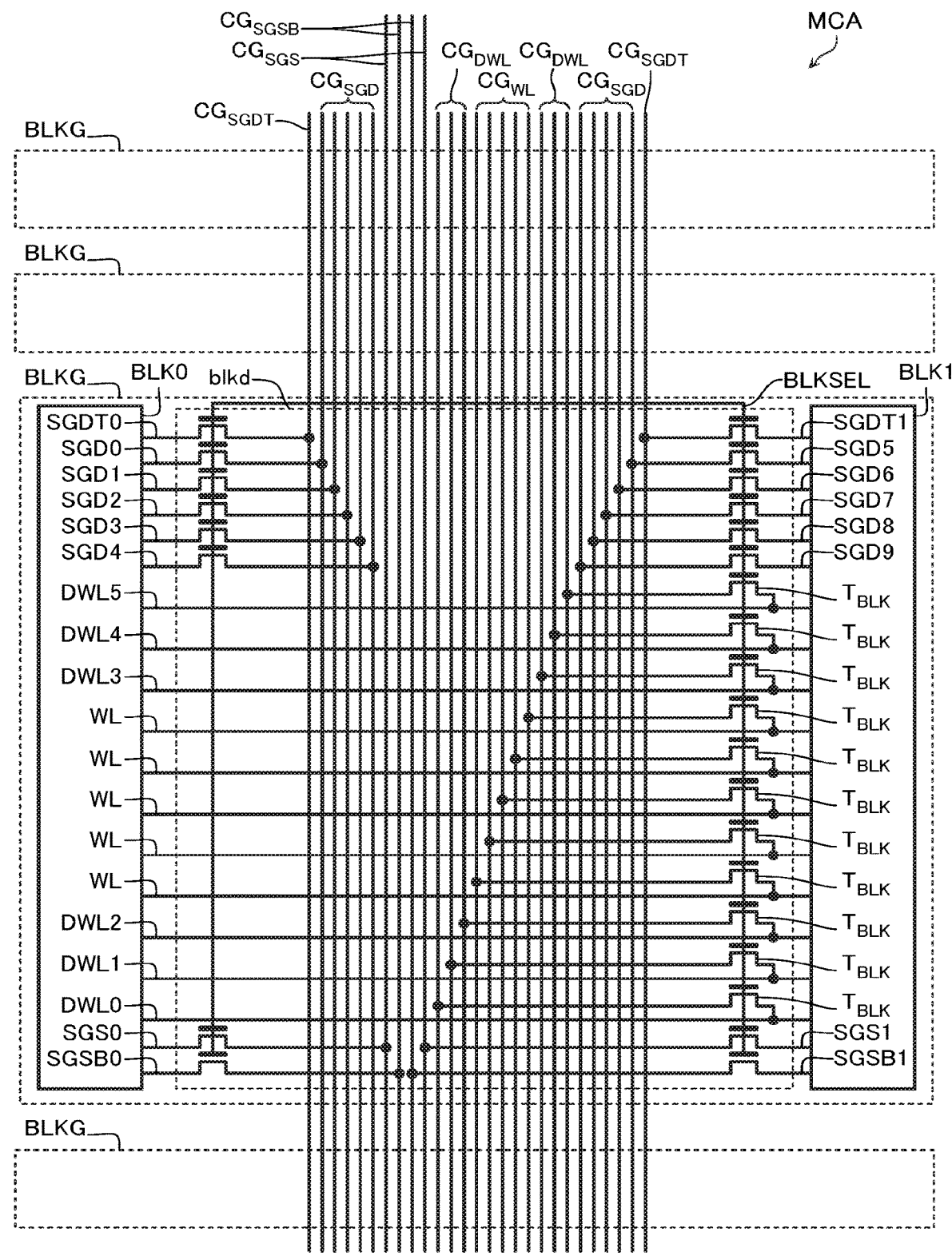
FIG. 27 is a schematic circuit diagram illustrating a configuration of a part of a semiconductor memory device according to a second embodiment.

Next, with reference to FIG. 27, a semiconductor memory device according to the second embodiment will be described. FIG. 27 is a schematic circuit diagram illustrating a configuration of a part of the semiconductor memory device according to the second embodiment.

The semiconductor memory device according to the second embodiment is basically configured similarly to the semiconductor memory device according to the first embodiment.

However, as illustrated in FIG. 27, with the semiconductor memory device according to the second embodiment, the configuration that functions as the circuit blk0 (FIG. 5) in the first embodiment functions as a memory block BLK0. Similarly to the circuit blk0 according to the first embodiment, the memory block BLK0 includes the string units SU0 to SU4.

As illustrated in FIG. 27, with the semiconductor memory device according to the second embodiment, the configuration that functions as the circuit blk1 (FIG. 5) in the first embodiment functions as a memory block BLK1. Similarly to the circuit blk1 according to the first embodiment, the memory block BLK1 includes the string units SU5 to SU9.

Note that FIG. 27 illustrates the configuration including the pair of memory blocks BLK0 and BLK1 as a memory block group BLKG. The different block addresses are allocated to all of the plurality of memory blocks BLK0 and BLK1 included in the plurality of memory block groups BLKG in the memory cell array MCA.

With the semiconductor memory device according to the second embodiment, when the erase operation is performed, the command set $CS_{E0}$ as described with reference to FIG. 25 is input from the controller die CD to the memory die MD.

Third Embodiment

Figure 28:
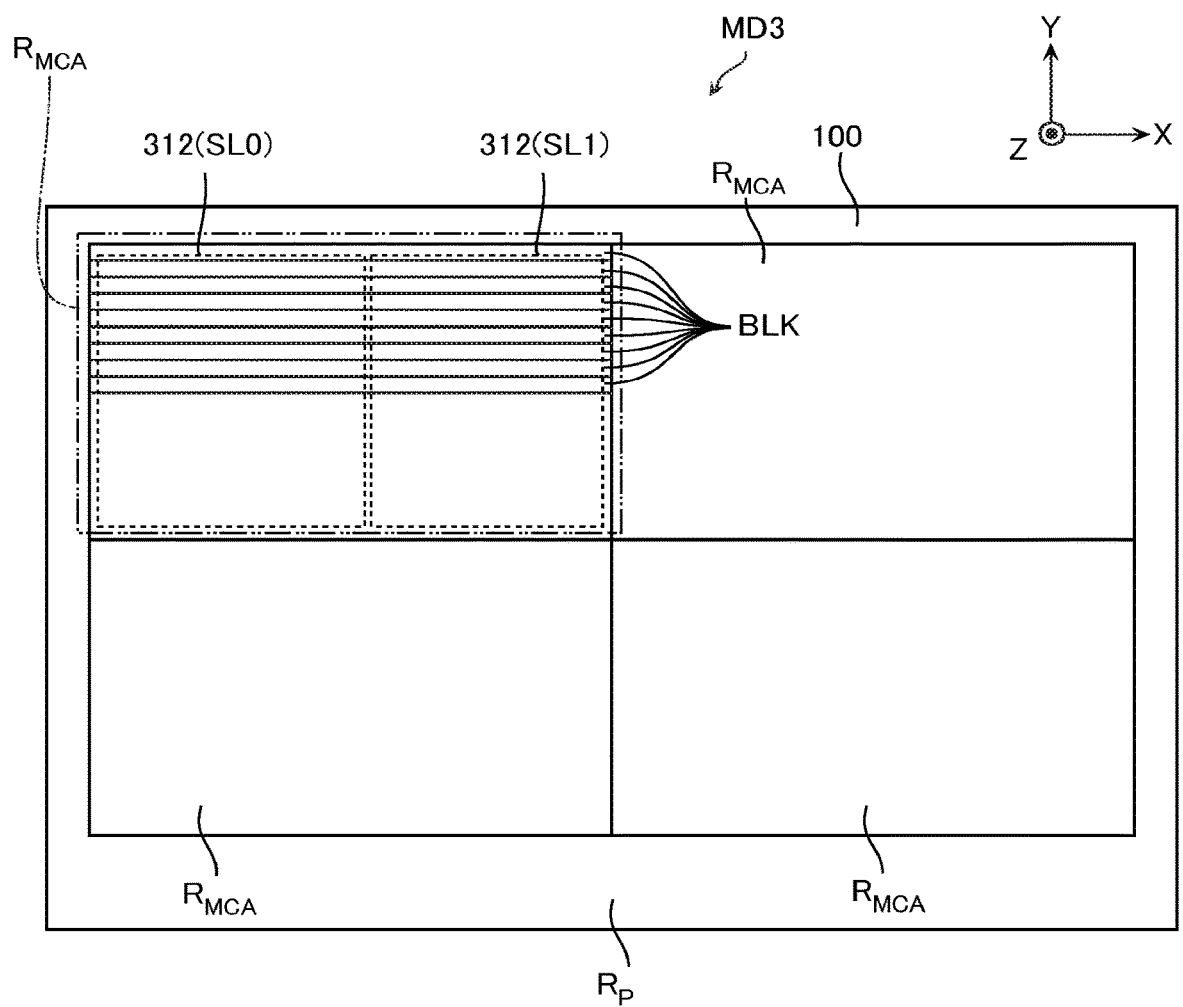
FIG. 28 is a schematic plan view illustrating a configuration of a part of a semiconductor memory device according to a third embodiment.
Figure 29:
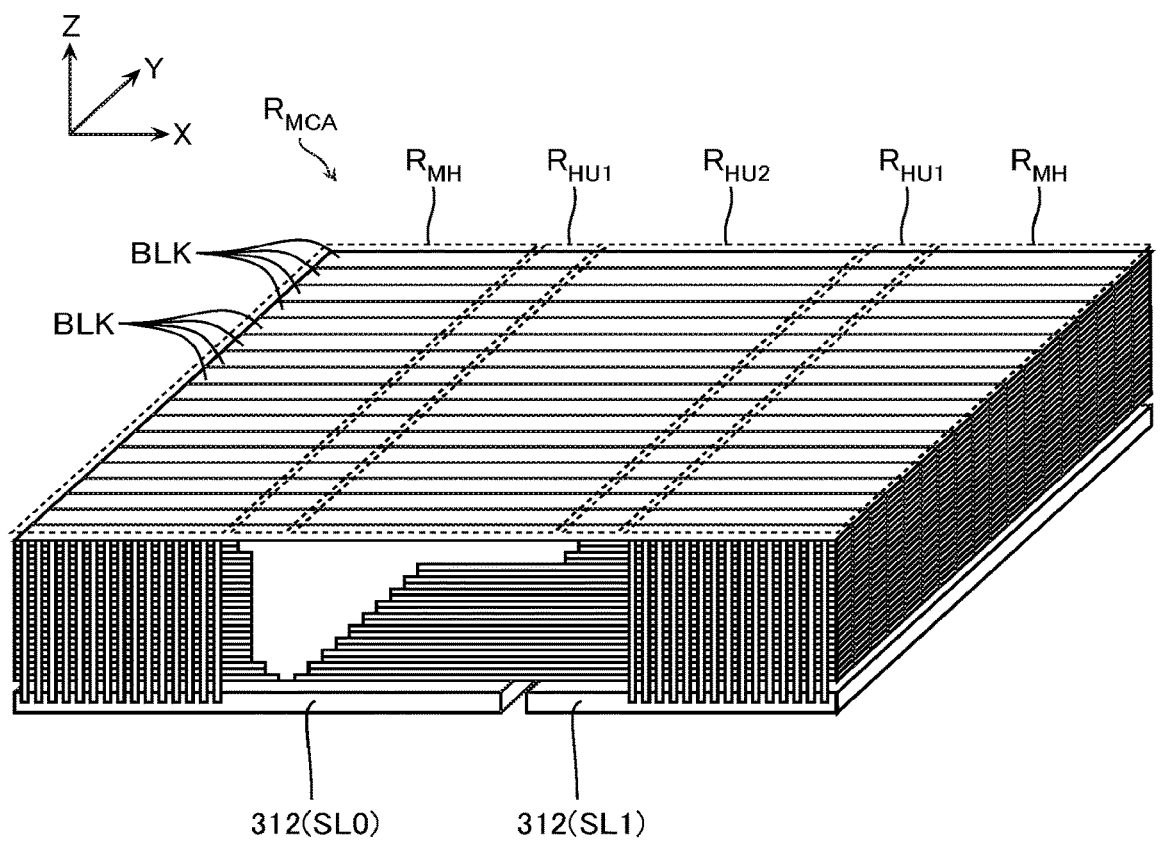
FIG. 29 is a schematic perspective view illustrating a configuration of a part of a semiconductor memory device according to the third embodiment.

Next, a semiconductor memory device according to the third embodiment will be described with reference to FIG. 28 and FIG. 29. FIG. 28 is a schematic plan view illustrating a configuration of a part of the semiconductor memory device according to the third embodiment. FIG. 29 is a schematic perspective view illustrating a configuration of a part of the semiconductor memory device according to the third embodiment.

The semiconductor memory device according to the third embodiment is basically configured similarly to the semiconductor memory device according to the first embodiment. However, as illustrated in FIG. 28, the semiconductor memory device according to the third embodiment includes a memory die MD3 instead of the memory die MD. The memory die MD3 is basically configured similarly to the memory die MD. However, in the memory die MD3, two conductive layers 312 are disposed in each of the memory cell array regions $R_{MCA}$ instead of one conductive layer 112.

As illustrated in FIG. 28 and FIG. 29, one conductive layer 312 is disposed across the whole memory hole region $R_{MH}$ at one side in the X-direction (for example, the negative side in the X-direction in FIG. 28 and FIG. 29), the whole first hook-up region $R_{HU1}$ at one side in the X-direction, and a part of the second hook-up region $R_{HU2}$. This conductive layer 312 functions as a source line SL0 corresponding to the circuit blk0 (FIG. 5).

The other conductive layer 312 is disposed across the whole memory hole region $R_{MH}$ at the other side in the X-direction (for example, the positive side in the X-direction in FIG. 28 and FIG. 29), the whole first hook-up region $R_{HU1}$ at the other side in the X-direction, and a part of the second hook-up region $R_{HU2}$. This conductive layer 312 functions as a source line SL1 corresponding to the circuit blk1 (FIG. 5).

The semiconductor memory device according to the third embodiment is configured to be able to apply different voltages to these two conductive layers 312.

Figure 30:
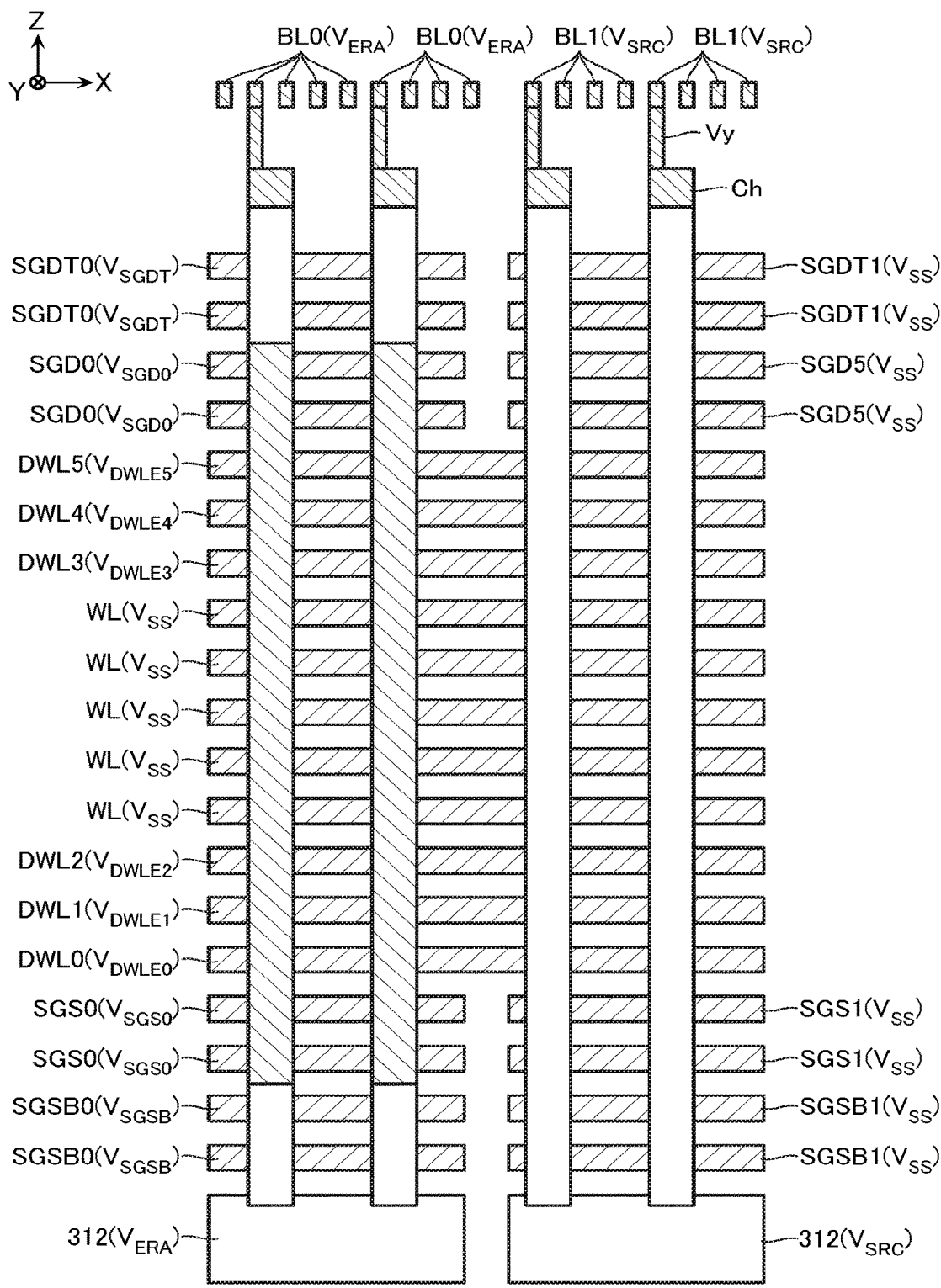
FIG. 30 is a schematic cross-sectional view illustrating a configuration of a part of the semiconductor memory device according to the third embodiment.

Next, with reference to FIG. 30, the erase operation of the semiconductor memory device according to the third embodiment will be described. FIG. 30 is a schematic cross-sectional view illustrating a configuration of a part of the semiconductor memory device according to the third embodiment.

Note that FIG. 30 is the schematic cross-sectional view to describe a voltage applied to each wiring or the like in the erase operation, and does not strictly illustrate the position, the shape, and the like of the wiring. For example, FIG. 30 omits the configuration corresponding to the first hook-up region $R_{HU1}$ and the configuration corresponding to the second hook-up region $R_{HU2}$.

The erase operation of the semiconductor memory device according to the third embodiment is basically performed similarly to the erase operation of the semiconductor memory device according to the first embodiment.

However, in the erase operation of the semiconductor memory device according to the third embodiment, for example, as illustrated in FIG. 30, the voltage $V_{SRC}$ is applied to the plurality of bit lines BL1. Thus, the voltage $V_{SRC}$ is transferred to the plurality of drain-side select transistors STDT connected to the plurality of bit lines BL1.

In this erase operation, for example, the ground voltage $V_{SS}$ is applied to the drain-side select gate line SGDT1. Therefore, a GIDL does not occur in the channel region in the drain-side select transistor STDT corresponding to the drain-side select gate line SGDT1, and an electron and hole pair does not occur.

In this erase operation, for example, the ground voltage $V_{SS}$ is applied to the drain-side select gate lines SGD5 to SGD9.

In this erase operation, for example, the erase voltage $V_{ERA}$ is applied to the source line SL0. Thus, the erase voltage $V_{ERA}$ is transferred to the source-side select transistor STSB connected to the source line SL0.

In this erase operation, for example, the voltage $V_{SRC}$ is applied to the source line SL1. Thus, the voltage $V_{SRC}$ is transferred to the source-side select transistor STSB connected to the source line SL1.

In this erase operation, for example, the ground voltage $V_{SS}$ is applied to the source-side select gate line SGSB1. Therefore, the GIDL does not occur in the channel region in the source-side select transistor STSB corresponding to the source-side select gate line SGSB1, and the electron and hole pair does not occur.

In this erase operation, for example, the ground voltage $V_{SS}$ is applied to the source-side select gate line SGS1.

Figure 31:
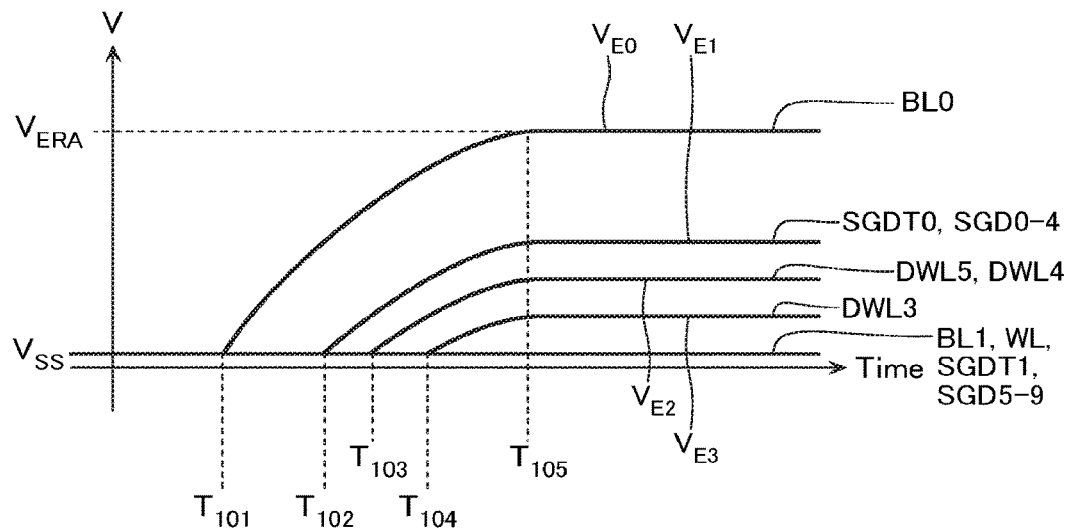
FIG. 31 is a schematic waveform diagram to describe an erase operation according to the third embodiment.
Figure 32:
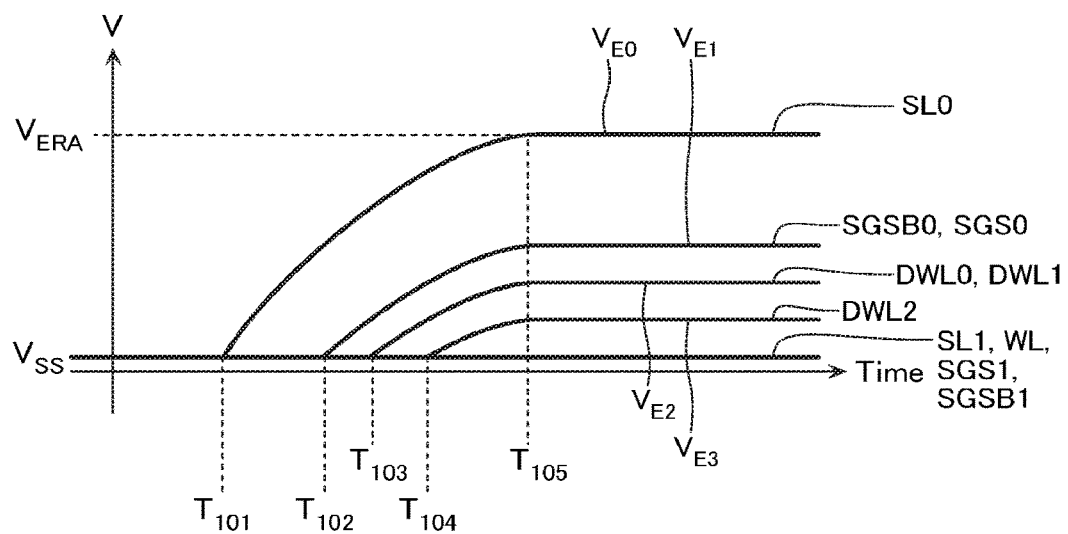
FIG. 32 is a schematic waveform diagram to describe the erase operation according to the third embodiment.

FIG. 31 and FIG. 32 are schematic waveform diagrams to describe the erase operation according to the third embodiment. FIG. 31 illustrates an example of the voltages applied to the bit lines BL0 and BL1, the drain-side select gate lines SGDT0, SGDT1, and SGD0 to SGD9, the dummy word lines DWL3 to DWL5, and the word line WL. FIG. 32 illustrates an example of the voltages applied to the source lines SL0 and SL1, the source-side select gate lines SGSB0, SGSB1, SGS0, and SGS1, the dummy word lines DWL0 to DWL2, and the word line WL.

The erase operation illustrated as an example in FIG. 31 and FIG. 32 is performed similarly to the erase operation described with reference to FIG. 22 and FIG. 23. However, in the erase operation illustrated as an example in FIG. 31 and FIG. 32, from the start of the erase operation to at and after timing $T_{105}$, the voltages of the drain-side select gate lines SGDT1 and SGD5 to SGD9 and the source-side select gate lines SGSB1 and SGS1 are maintained at the ground voltage $V_{SS}$. Moreover, the voltages of the bit line BL1 and the source line SL1 are maintained at the voltage $V_{SRC}$ (≈the ground voltage $V_{SS}$)

[Effects]

In the erase operation described with reference to FIG. 21 to FIG. 23, voltage differences between the drain-side select gate lines SGD5 to SGD9 and the dummy word line DWL5 comparatively increase in some cases. Additionally, a voltage difference between the source-side select gate line SGS1 and the dummy word line DWL0 comparatively increases in some cases. In this case, a leakage current or the like possibly occurs.

Therefore, the semiconductor memory device according to the third embodiment is configured to be able to apply different voltages to the source line SL0 corresponding to the circuit blk0 and the source line SL1 corresponding to the circuit blk1. Additionally, in the erase operation targeting the memory cells MC in the circuit blk0, not the erase voltage $V_{ERA}$ but the voltage $V_{SRC}$ is applied to the bit line BL1 and the source line SL1. Further, the ground voltage $V_{SS}$ is applied to the drain-side select gate lines SGDT1 and SGD5 to SGD9 and the source-side select gate lines SGSB1 and SGS1.

This method allows reducing the voltage differences between the drain-side select gate lines SGD5 to SGD9 and the dummy word line DWL5. Additionally, the voltage difference between the source-side select gate line SGS1 and the dummy word line DWL0 can be reduced, thus allowing reducing the leakage current as described above.

Fourth Embodiment

Figure 33:
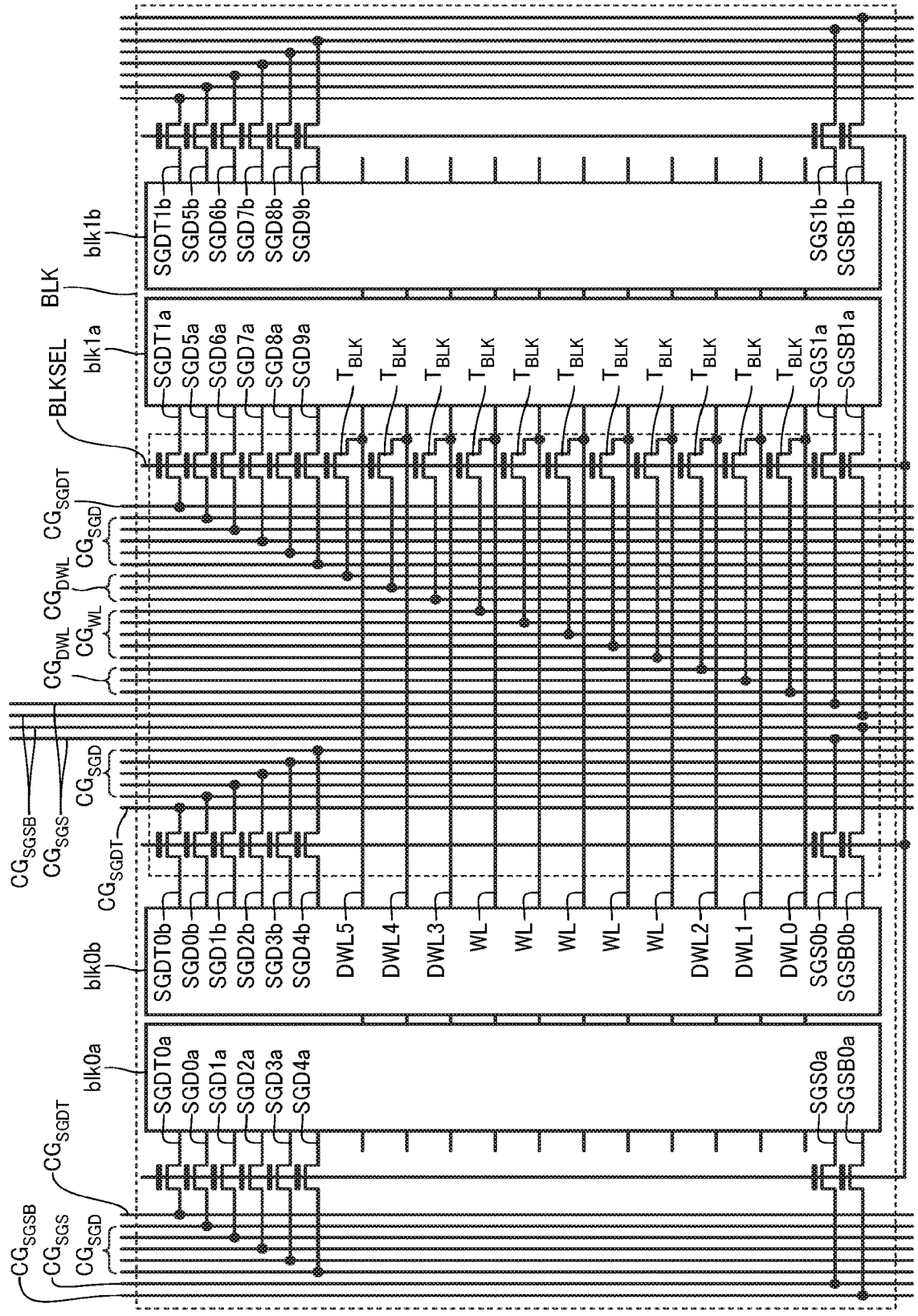
FIG. 33 is a schematic circuit diagram illustrating a configuration of a part of a semiconductor memory device according to a fourth embodiment.

Next, with reference to FIG. 33, a circuit configuration of a semiconductor memory device according to the fourth embodiment will be described. FIG. 33 is a schematic circuit diagram illustrating a configuration of a part of the semiconductor memory device according to the fourth embodiment.

The semiconductor memory device according to the fourth embodiment is basically configured similarly to the semiconductor memory device according to the first embodiment. However, as illustrated in FIG. 33, the memory block BLK according to the fourth embodiment includes circuits blk0a, blk0b, blk1a, and blk1b.

Each of the circuits blk0a, blk0b, blk1a, and blk1b includes five string units. Each of these five string units includes the plurality of memory strings MS.

In the example of FIG. 33, five drain-side select gate lines SGD0a to SGD4a are disposed corresponding to the five string units in the circuit blk0a. Additionally, a drain-side select gate line SGDT0a and source-side select gate lines SGS0a and SGSB0a are disposed corresponding to the circuit blk0a.

In the example of FIG. 33, five drain-side select gate lines SGD0b to SGD4b are disposed corresponding to the five string units in the circuit blk0b. Additionally, a drain-side select gate line SGDT0b and source-side select gate lines SGS0b and SGSB0b are disposed corresponding to the circuit blk0.

In the example of FIG. 33, five drain-side select gate lines SGD5a to SGD9a are disposed corresponding to the five string units in the circuit blk1a. Additionally, a drain-side select gate line SGDT1a and source-side select gate lines SGS1a and SGSB1a are disposed corresponding to the circuit blk1a.

In the example of FIG. 33, five drain-side select gate lines SGD5b to SGD9b are disposed corresponding to the five string units in the circuit blk1b. A drain-side select gate line SGDT1b and source-side select gate lines SGS1b and SGSB1b are disposed corresponding to the circuit blk1b.

Figure 34:
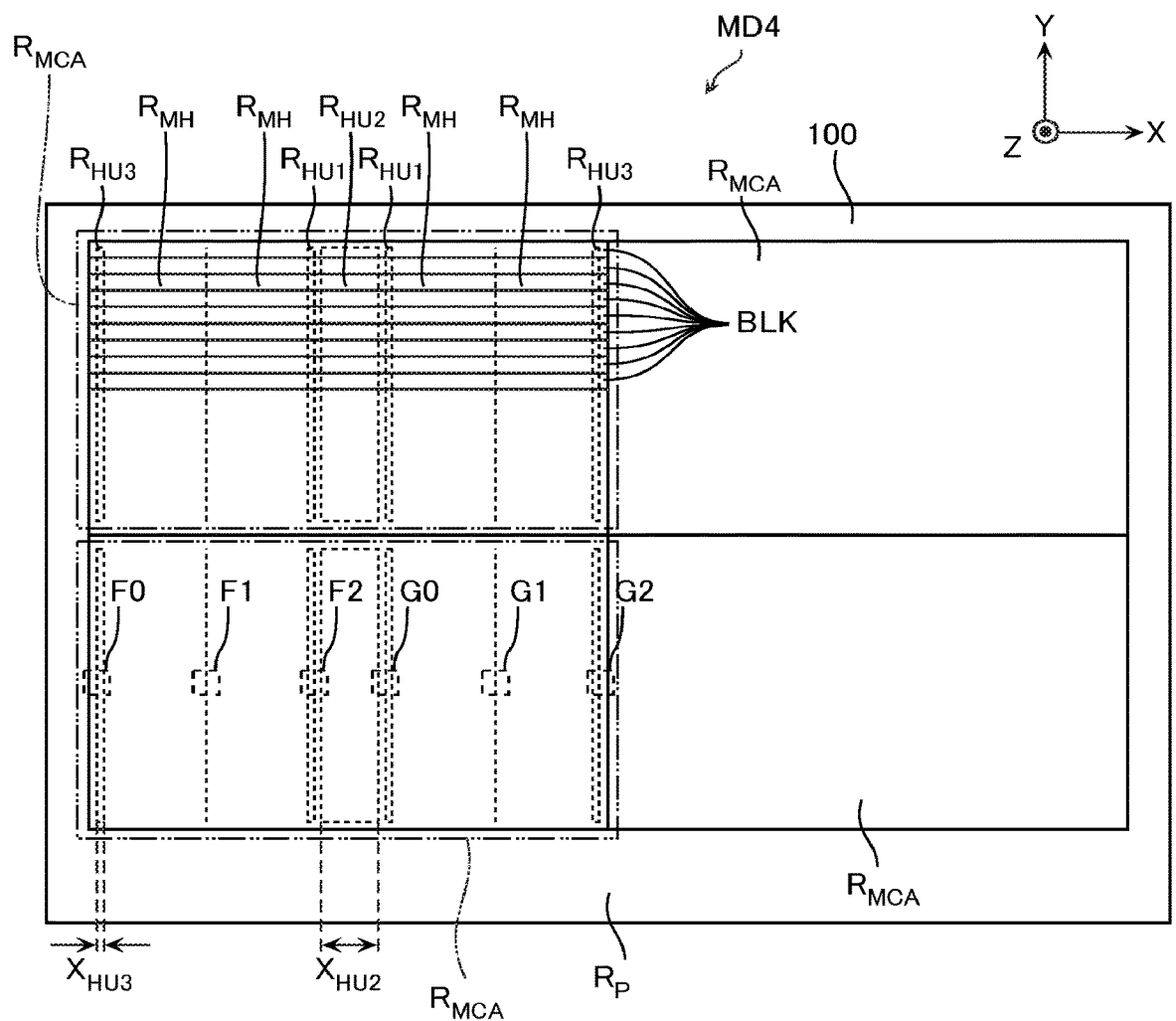
FIG. 34 is a schematic plan view illustrating a configuration of a part of the semiconductor memory device.
Figure 35:
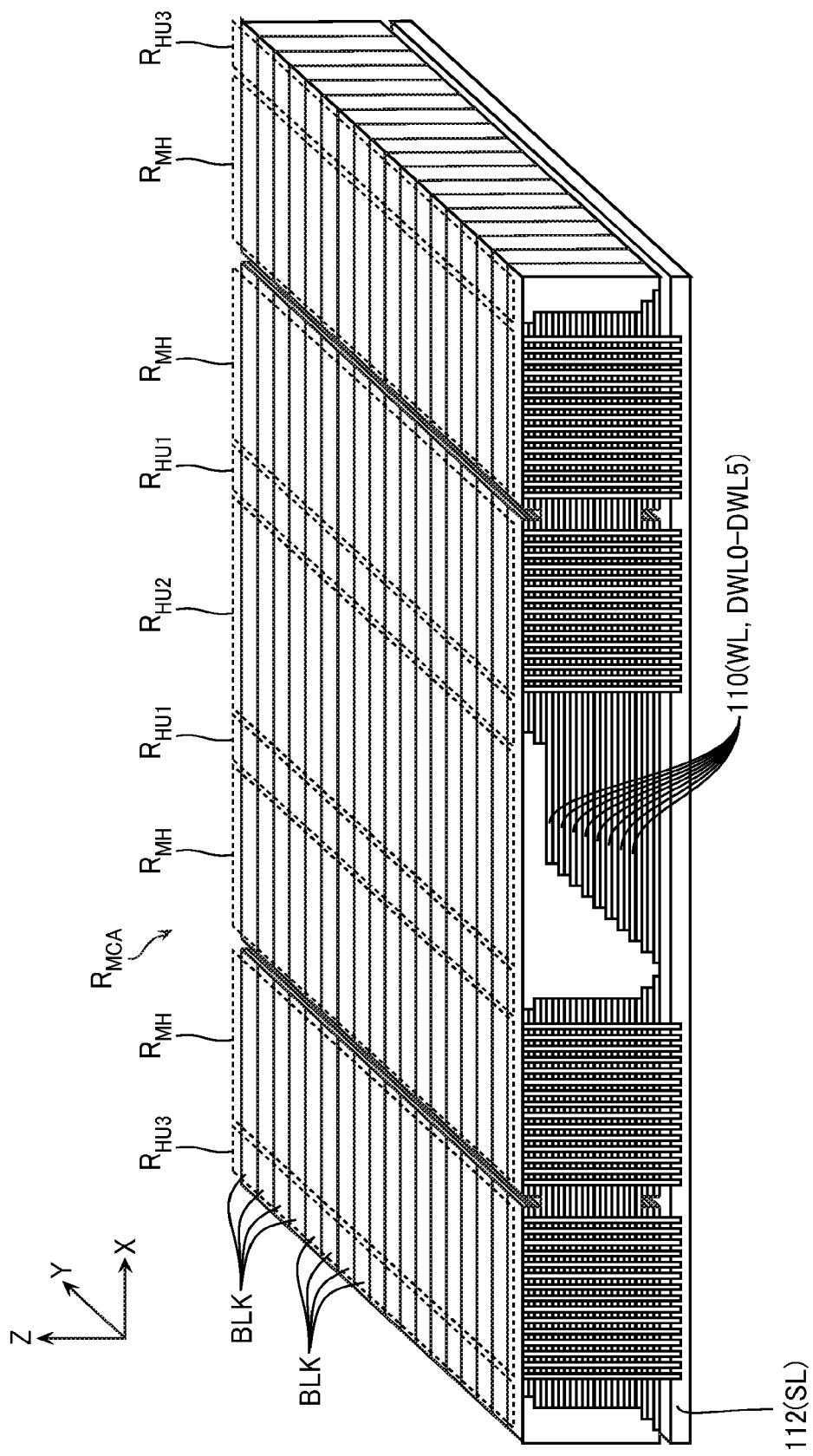
FIG. 35 is a schematic perspective view illustrating a configuration of a part of the semiconductor memory device.
Figure 36:
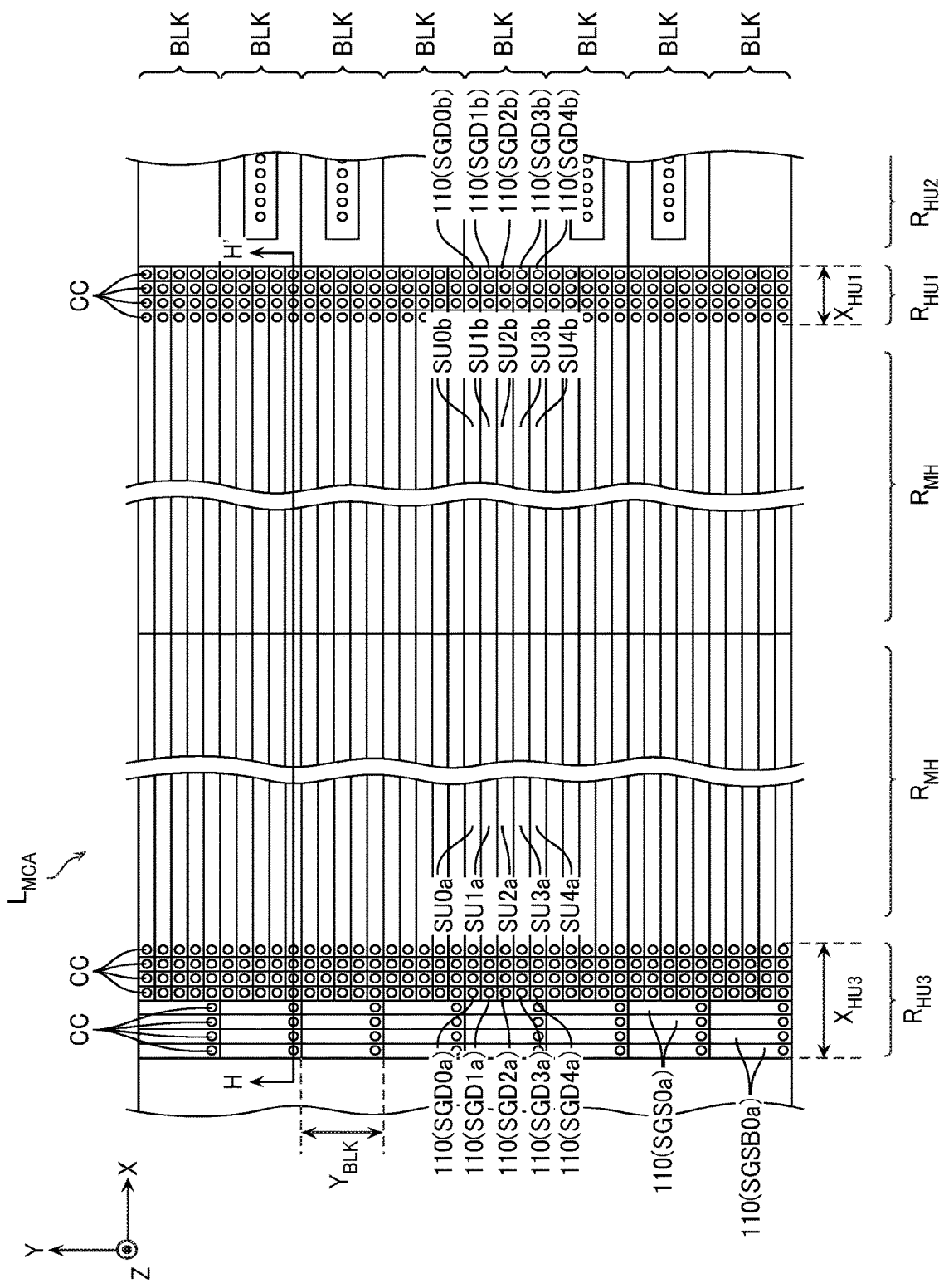
FIG. 36 is a schematic enlarged view of a part indicated by F0, F1, and F2 in FIG. 34.
Figure 37:
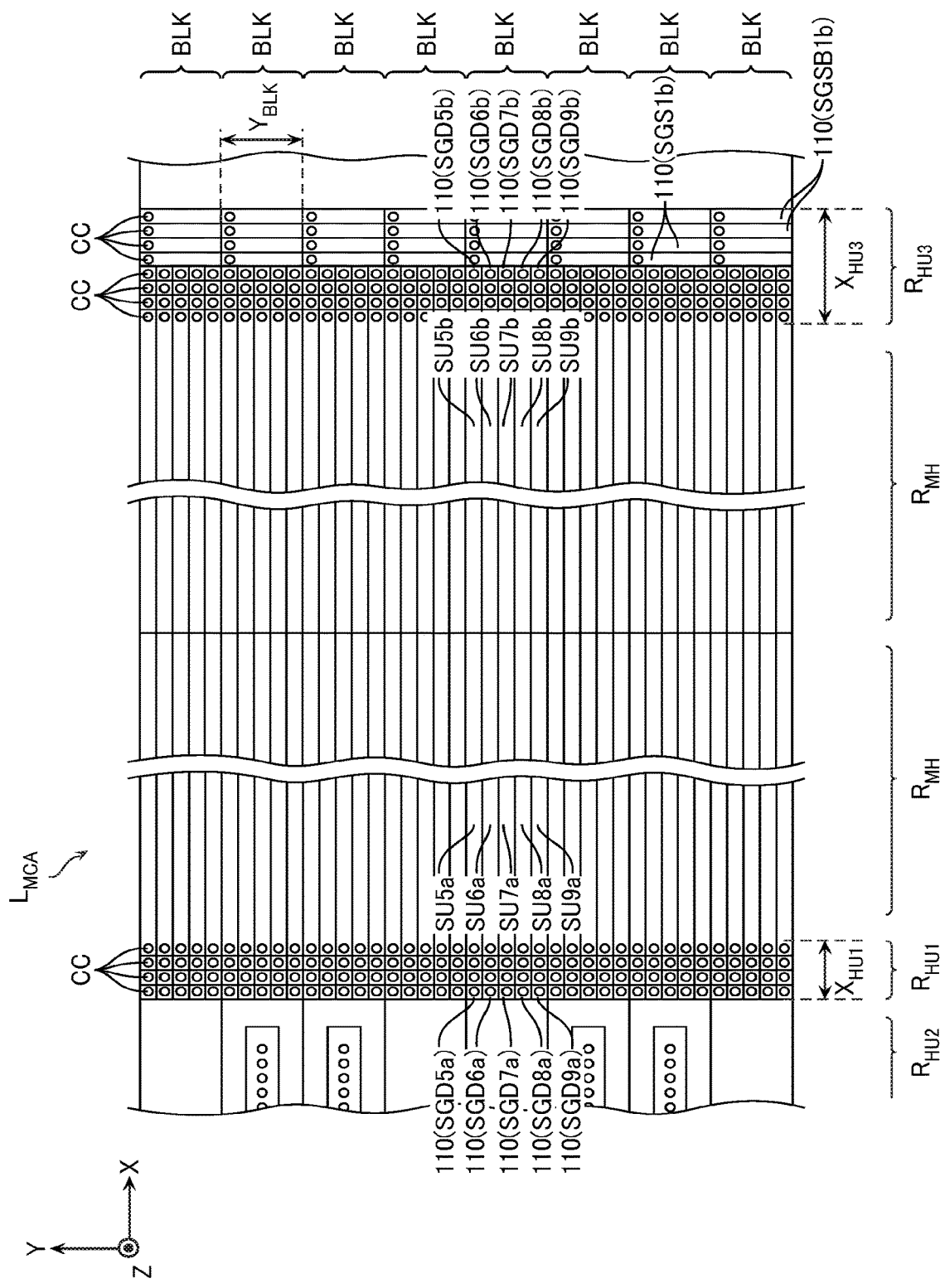
FIG. 37 is a schematic enlarged view of a part indicated by G0, G1, and G2 in FIG. 34.
Figure 38:
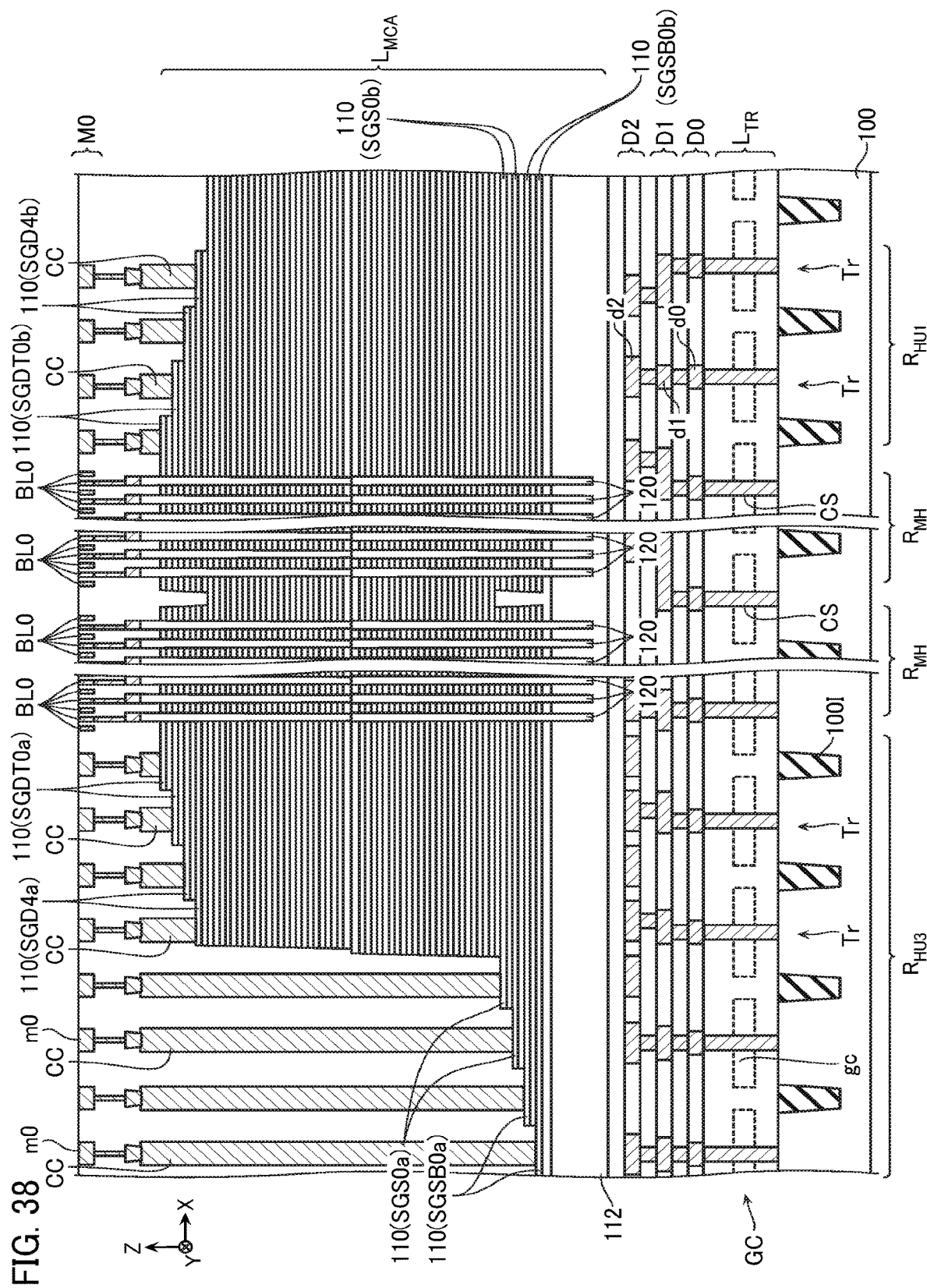
FIG. 38 is a schematic cross-sectional view when the structure illustrated in FIG. 36 is taken along H-H' and viewed in the arrow direction.

Next, with reference to FIG. 34 to FIG. 38, a structure of the semiconductor memory device according to the fourth embodiment will be described. FIG. 34 is a schematic plan view illustrating a configuration of a part of the semiconductor memory device. FIG. 35 is a schematic perspective view illustrating a configuration of a part of the semiconductor memory device according to the fourth embodiment. FIG. 36 is a schematic enlarged view of a part indicated by F0, F1, and F2 in FIG. 34. FIG. 37 is a schematic enlarged view of a part indicated by G0, G1, and G2 in FIG. 34. FIG. 38 is a schematic cross-sectional view when the structure illustrated in FIG. 36 is taken along H-H' and viewed in the arrow direction.

The semiconductor memory device according to the fourth embodiment is basically configured similarly to the semiconductor memory device according to the first embodiment. However, as illustrated in FIG. 34, the semiconductor memory device according to the fourth embodiment includes a memory die MD4 instead of the memory die MD.

The memory die MD4 is basically configured similarly to the memory die MD. For example, as described with reference to FIG. 8, the memory cell array region $R_{MCA}$ in the memory die MD includes the two memory hole regions $R_{MH}$ arranged in the X-direction, the two first hook-up regions $R_{HU1}$ disposed between these two memory hole regions $R_{MH}$, and the second hook-up region $R_{HU2}$ disposed between them.

On the other hand, for example, as illustrated in FIG. 34, the memory cell array region $R_{MCA}$ in the memory die MD4 includes the four memory hole regions $R_{MH}$ arranged in the X-direction. Additionally, between a second memory hole region $R_{MH}$ and the third memory hole region $R_{MH}$ counted from one side in the X-direction (for example, the negative side in the X-direction in FIG. 34), the two first hook-up regions $R_{HU1}$ arranged in the X-direction and the second hook-up region $R_{HU2}$ disposed between them are disposed. A third hook-up region $R_{HU3}$ is disposed in a region at one side in the X-direction with respect to first memory hole regions $R_{MH}$. Moreover, the third hook-up region $R_{HU3}$ is disposed in a region at the other side in the X-direction (for example, the positive side in the X-direction) with respect to a fourth memory hole region $R_{MH}$.

Note that as illustrated in FIG. 34, a length $X_{HU3}$ in the X-direction of the third hook-up region $R_{HU3}$ is shorter than a length $X_{HU2}$ in the X-direction of the second hook-up region $R_{HU2}$. Further, as illustrated in FIG. 36 and FIG. 37, the length $X_{HU3}$ in the X-direction of the third hook-up region $R_{HU3}$ is longer than a length $X_{HU1}$ in the X-direction of the first hook-up region $R_{HU1}$. Note that the length $X_{HU1}$ in the X-direction of the first hook-up region $R_{HU1}$ may be, for example, a length in the X-direction in the minimum range including all of the contacts CC disposed in the first hook-up region $R_{HU1}$. The length $X_{HU2}$ in the X-direction of the second hook-up region $R_{HU2}$ may be, for example, a length in the X-direction in the minimum range including all of the contacts CC disposed in the second hook-up region $R_{HU2}$. Additionally, the length $X_{HU3}$ in the X-direction of the third hook-up region $R_{HU3}$ may be, for example, a length in the X-direction in the minimum range including all of the contacts CC disposed in the third hook-up region $R_{HU3}$.

As illustrated in FIG. 35, the conductive layers 110 that function as the word lines WL and the dummy word lines DWL0 to DWL5 between the first memory hole region $R_{MH}$ and the second memory hole region $R_{MH}$ counted from one side in the X-direction are continuously formed in the X-direction. The conductive layers 110 that function as the word lines WL and the dummy word lines DWL0 to DWL5 between the third memory hole region $R_{MH}$ and the fourth memory hole region $R_{MH}$ counted from one side in the X-direction are continuously formed in the X-direction. As described with reference to FIG. 16 and FIG. 17, the conductive layers 110 that function as the word lines WL and the dummy word lines DWL0 to DWL5 are not separated in the X-direction in the second hook-up region $R_{HU2}$. That is, the conductive layers 110 that function as the word lines WL and the dummy word lines DWL0 to DWL5 between the second memory hole region $R_{MH}$ and the third memory hole region $R_{MH}$ counted from one side in the X-direction are continuously formed in the X-direction.

As illustrated in FIG. 36, the first memory hole region $R_{MH}$ counted from one side in the X-direction includes string units SU0a to SU4a. The second memory hole region $R_{MH}$ counted from one side in the X-direction includes string units SU0b to SU4b. The string units SU0a to SU4a and SU0b to SU4b are configured similarly to the string units SU0 to SU4.

As illustrated in FIG. 36 and FIG. 38, the conductive layers 110 that function as the drain-side select gate lines SGD0a to SGD4a, SGDT0a, SGD0b to SGD4b, and SGDT0b between the first memory hole region $R_{MH}$ and the second memory hole region $R_{MH}$ counted from one side in the X-direction are separated in the X-direction. That is, the conductive layers 110 that function as the drain-side select gate lines SGD0a to SGD4a and SGDT0a and the conductive layers 110 that function as the drain-side select gate lines SGD0b to SGD4b and SGDT0b are arranged in the X-direction and spaced in the X-direction. The conductive layers 110 that function as the drain-side select gate lines SGD0a to SGD4a and SGDT0a are each connected to the contact CC disposed in the third hook-up region $R_{HU3}$. The conductive layers 110 that function as the drain-side select gate lines SGD0b to SGD4b and SGDT0b are each connected to the contact CC disposed in the first hook-up region $R_{HU1}$.

As illustrated in FIG. 38, the conductive layers 110 that function as the source-side select gate lines SGS0a, SGSB0a, SGS0b, and SGSB0b between the first memory hole region $R_{MH}$ and the second memory hole region $R_{MH}$ counted from one side in the X-direction are separated in the X-direction. That is, the conductive layers 110 that function as the source-side select gate lines SGS0a and SGSB0a and the conductive layers 110 that function as the source-side select gate lines SGS0b and SGSB0b are arranged in the X-direction and spaced in the X-direction. The conductive layers 110 that function as the source-side select gate lines SGS0a and SGSB0a are each connected to the contact CC disposed in the third hook-up region $R_{HU3}$. For example, as illustrated as an example in FIG. 10, the conductive layers 110 that function as the source-side select gate lines SGS0b and SGSB0b are each connected to the contact CC disposed in the second hook-up region $R_{HU2}$.

As illustrated in FIG. 37, the third memory hole region $R_{MH}$ counted from one side in the X-direction includes string units SU5a to SU9a. The fourth memory hole region $R_{MH}$ counted from one side in the X-direction includes string units SU5b to SU9b. The string units SU5a to SU9a and SU5b to SU9b are configured similarly to the string units SU5 to SU9.

As illustrated in FIG. 37, the conductive layers 110 that function as the drain-side select gate lines SGD5a to SGD9a, SGDT1a, SGD5b to SGD9b, and SGDT1b between the third memory hole region $R_{MH}$ and the fourth memory hole region $R_{MH}$ counted from one side in the X-direction are separated in the X-direction. That is, the conductive layers 110 that function as the drain-side select gate lines SGD5a to SGD9a and SGDT1a and the conductive layers 110 that function as the drain-side select gate lines SGD5b to SGD9b and SGDT1b are arranged in the X-direction and spaced in the X-direction. The conductive layers 110 that function as the drain-side select gate lines SGD5a to SGD9a and SGDT1a are each connected to the contact CC disposed in the first hook-up region $R_{HU1}$. The conductive layers 110 that function as the drain-side select gate lines SGD5b to SGD9b and SGDT1b are each connected to the contact CC disposed in the third hook-up region $R_{HU3}$.

Although the illustration is omitted, the conductive layers 110 that function as the source-side select gate lines SGS1a, SGSB1a, SGS1b, and SGSB1b between the third memory hole region $R_{MH}$ and the fourth memory hole region $R_{MH}$ counted from one side in the X-direction are separated in the X-direction. That is, the conductive layers 110 that function as the source-side select gate lines SGS1a and SGSB1a and the conductive layers 110 that function as the source-side select gate lines SGS1b and SGSB1b are arranged in the X-direction and spaced in the X-direction. For example, as illustrated as an example in FIG. 10, the conductive layers 110 that function as the source-side select gate lines SGS1a and SGSB1a are each connected to the contact CC disposed in the second hook-up region $R_{HU2}$. For example, as illustrated as an example in FIG. 37, the conductive layers 110 that function as the source-side select gate lines SGS1b and SGSB1b are each connected to the contact CC disposed in the third hook-up region $R_{HU3}$.

Figure 39:
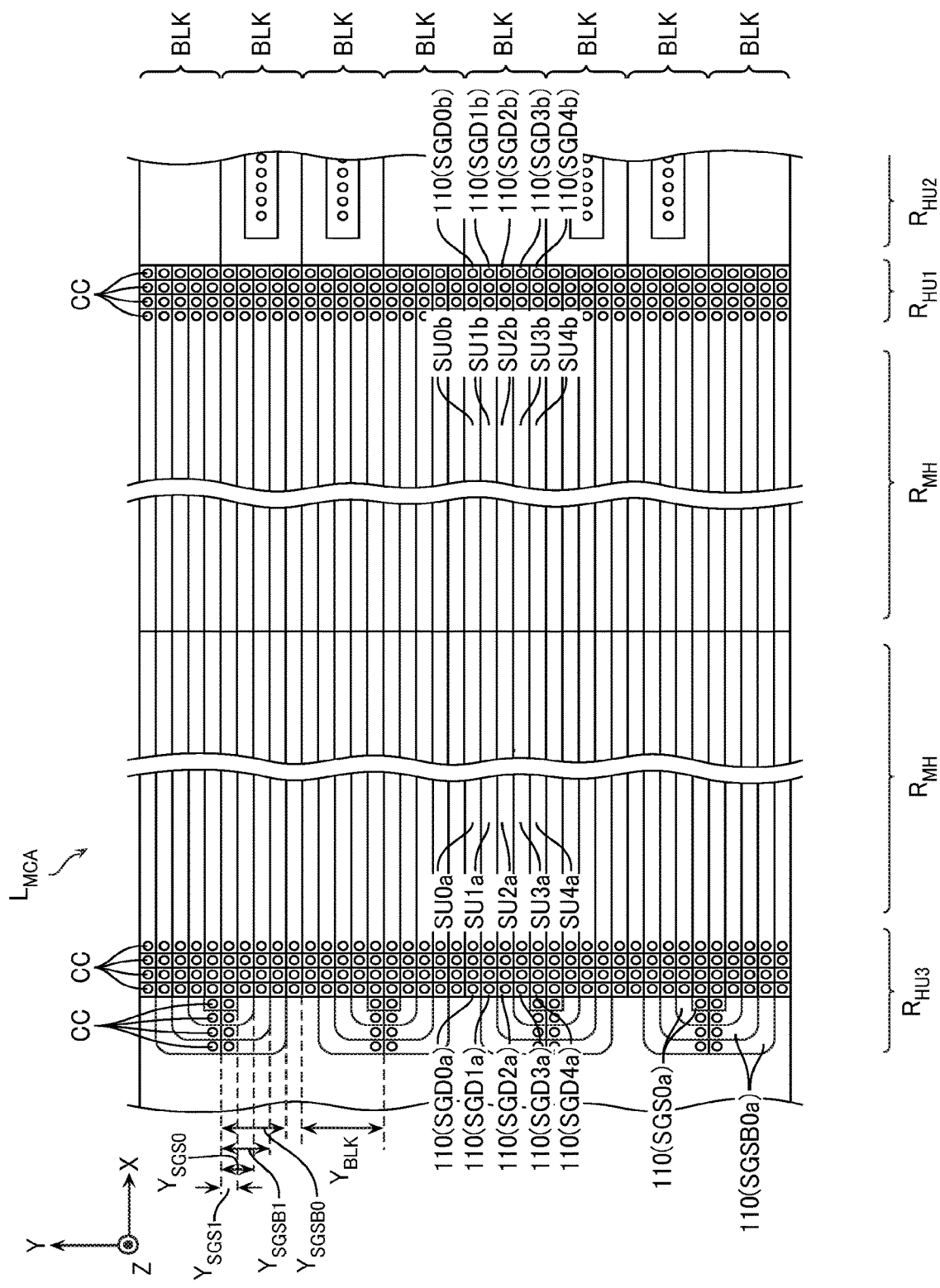
FIG. 39 is a schematic plan view illustrating a configuration of a part of another example of the semiconductor memory device according to the fourth embodiment.
Figure 40:
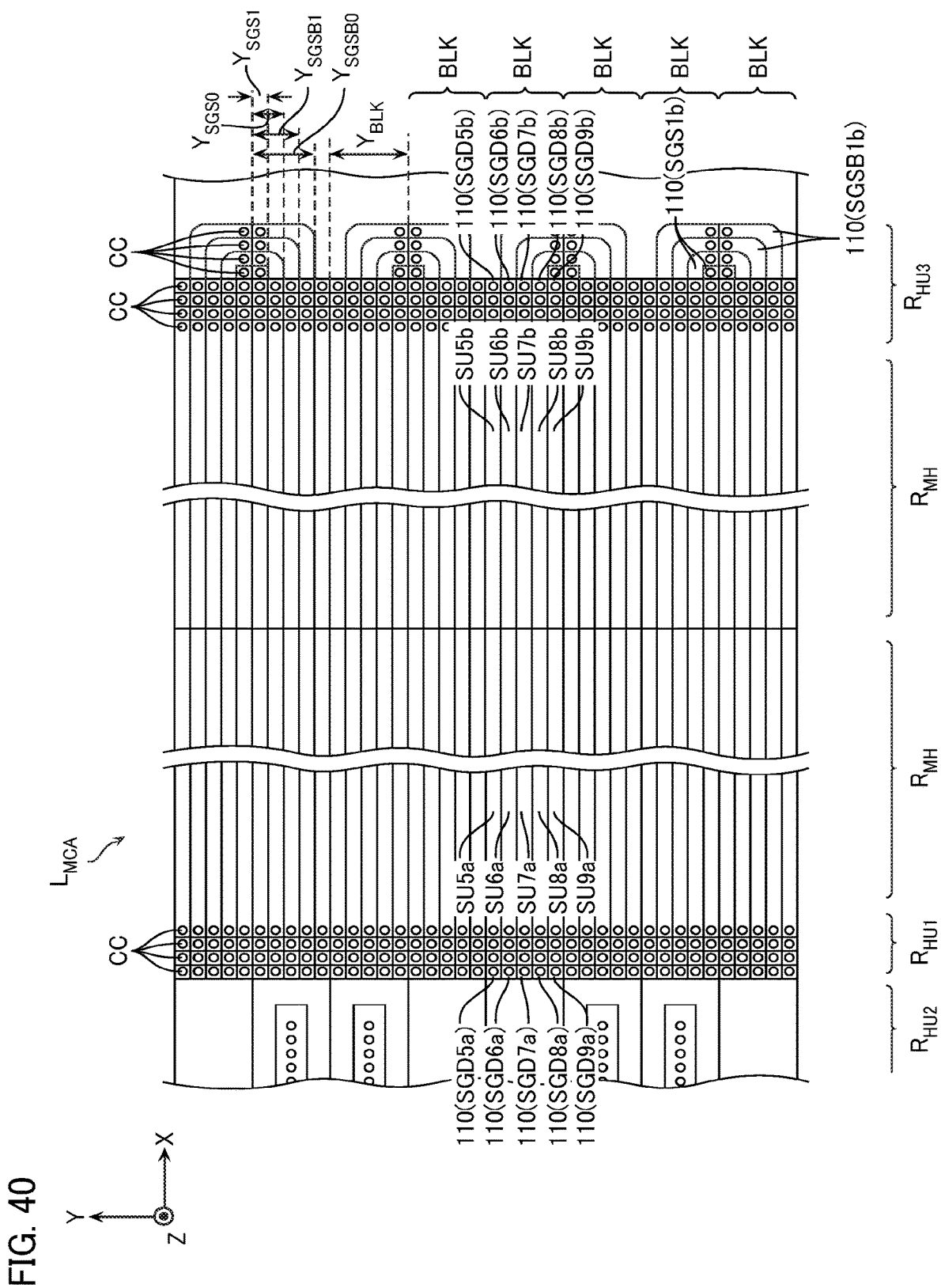
FIG. 40 is a schematic plan view illustrating a configuration of a part of another example of the semiconductor memory device according to the fourth embodiment.

Note that in the examples of FIG. 36 and FIG. 37, a connecting part between the conductive layer 110 that functions as the source-side select gate line SGS0a, SGSB0a, SGS1b, or SGSB1b and the contact CC has a Y-direction length equal to a Y-direction length $Y_{BLK}$ of the memory block BLK. However, for example, in the examples of FIG. 39 and FIG. 40, a connecting part between the lower one among the conductive layers 110 that function as the source-side select gate lines SGSB0a and SGSB1b and the contact CC has a Y-direction length $Y_{SGSB0}$ smaller than the Y-direction length $Y_{BLK}$. Additionally, a connecting part between the upper one among the conductive layers 110 that function as the source-side select gate lines SGS0a and SGS1b and the contact CC has a Y-direction length $Y_{SGSB1}$ smaller than the Y-direction length $Y_{SGSB0}$. Additionally, a connecting part between the lower one among the conductive layers 110 that function as the source-side select gate lines SGSB0a and SGSB1b and the contacts CC has a Y-direction length $Y_{SGS0}$ smaller than the Y-direction length $Y_{SGSB1}$. Additionally, a connecting part between the upper one among the conductive layers 110 that function as the source-side select gate lines SGS0a and SGS1b and the contact CC has a Y-direction lengths $Y_{SGS1}$ smaller than the Y-direction length $Y_{SGS0}$.

The semiconductor memory device according to the fourth embodiment is configured to be able to independently erase the data in the memory cells MC in the circuit blk0a, the memory cells MC in the circuit blk0b, the memory cells MC in the circuit blk1a, and the memory cells MC in the circuit blk1b.

[Effects]

The semiconductor memory device according to this embodiment allows further preferably reducing the short service life of the memory cells MC in association with the increase in the number of executions of the garbage collection while reducing the decrease in integration degree.

Fifth Embodiment

Figure 41:
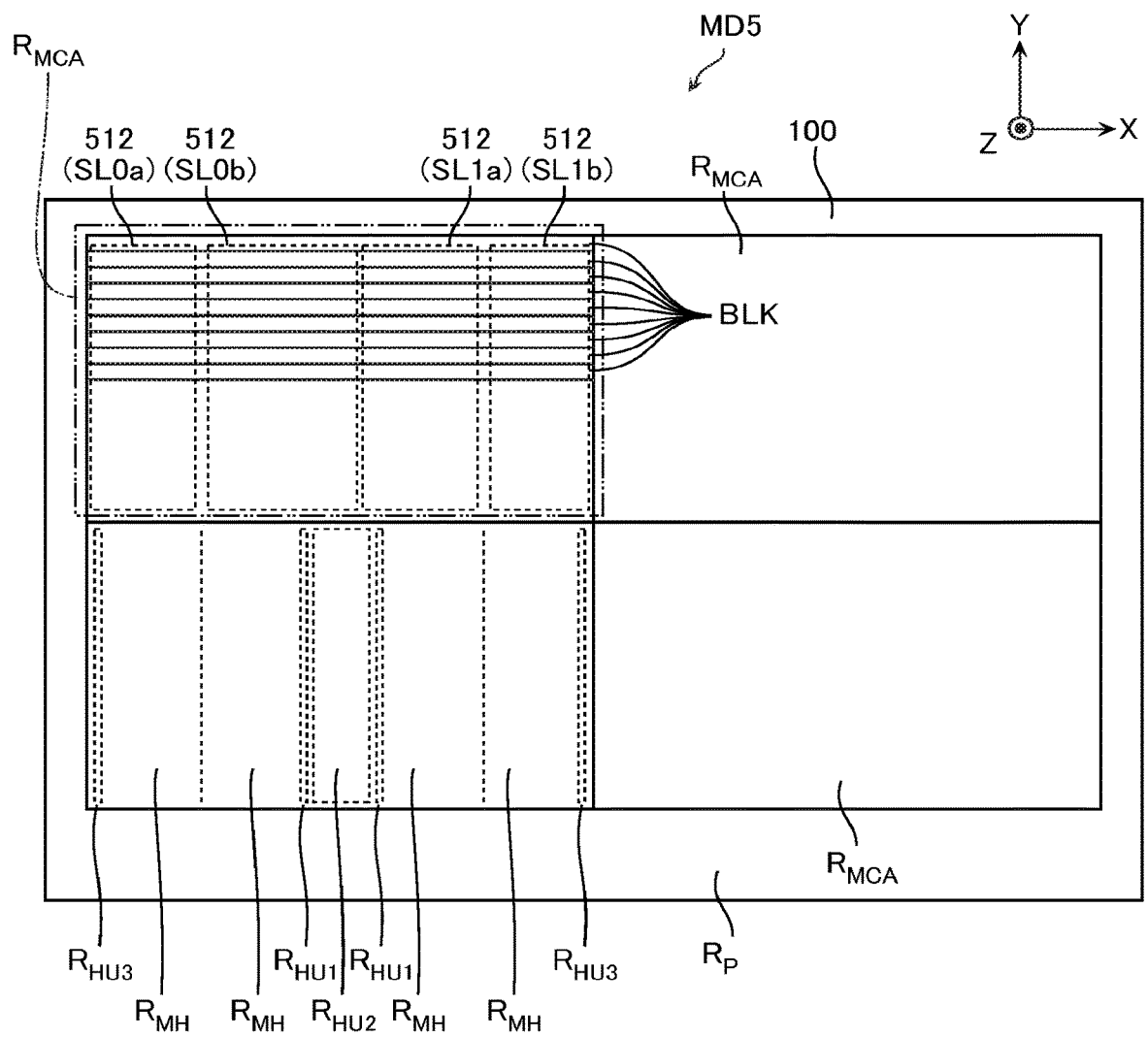
FIG. 41 is a schematic plan view illustrating a configuration of a part of a semiconductor memory device according to a fifth embodiment.
Figure 42:
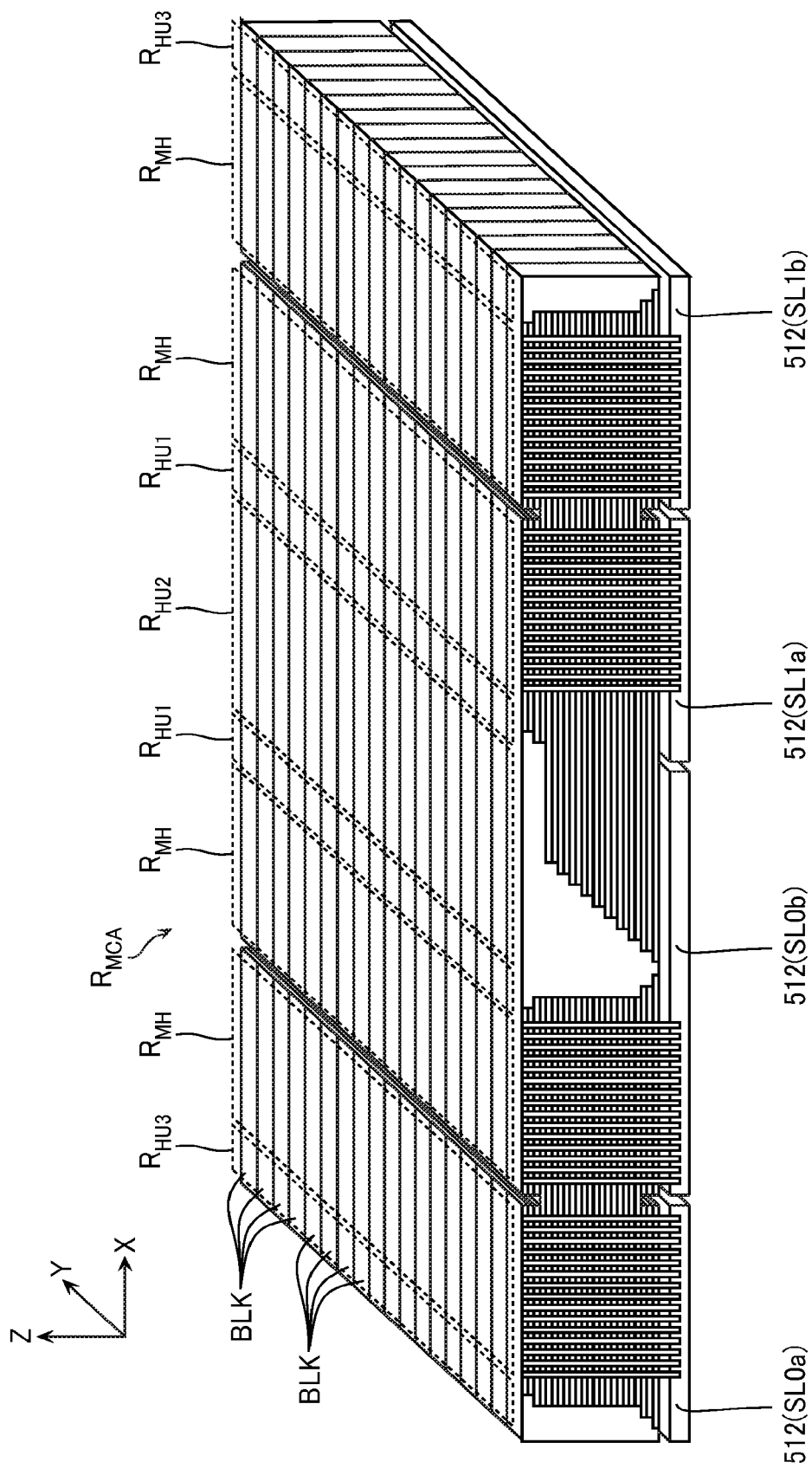
FIG. 42 is a schematic perspective view illustrating a configuration of a part of the semiconductor memory device according to the fifth embodiment.
Figure 43:
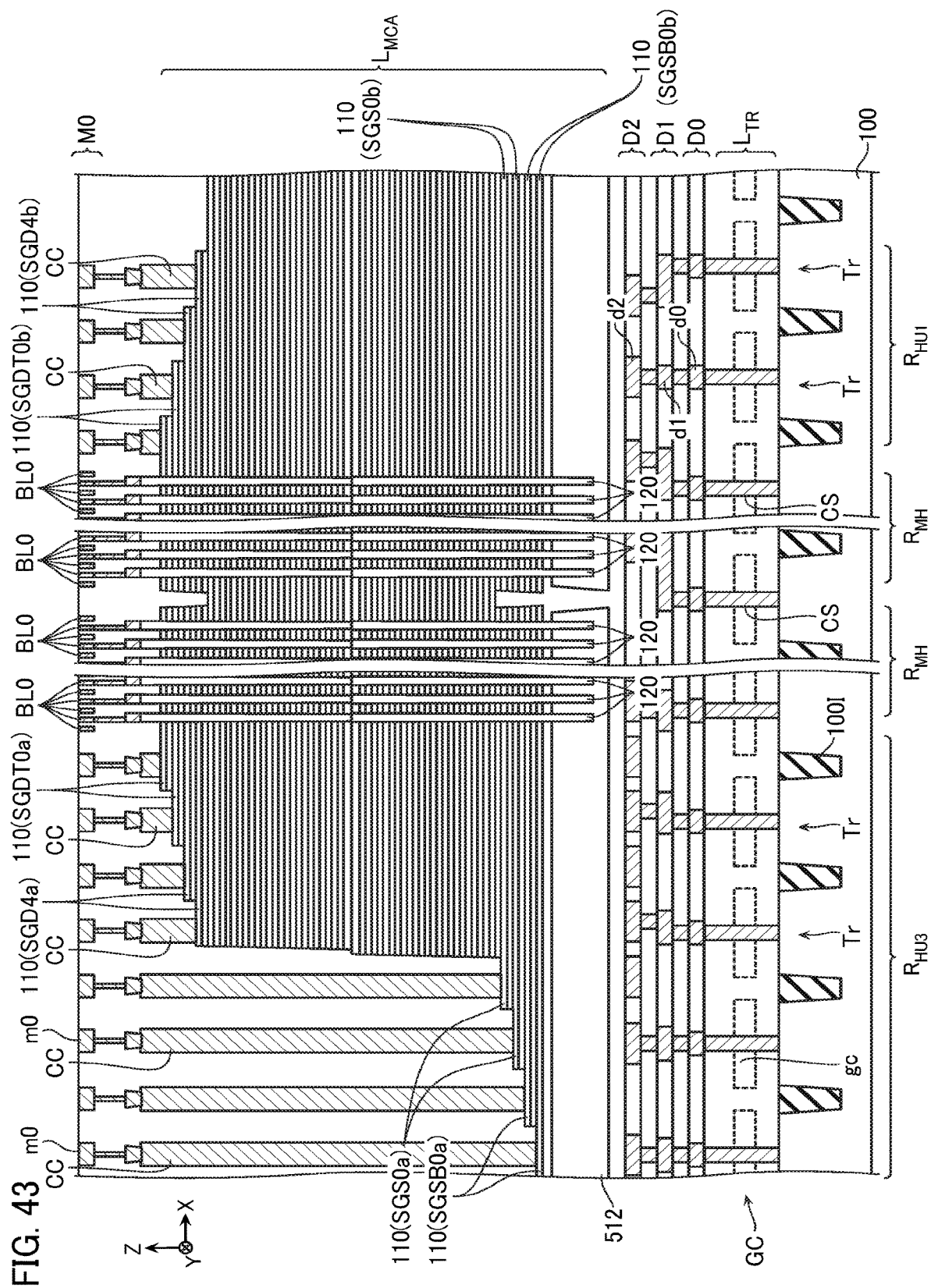
FIG. 43 is a schematic plan view illustrating a configuration of a part of the semiconductor memory device according to the fifth embodiment.

Next, with reference to FIG. 41 to FIG. 43, a semiconductor memory device according to the fifth embodiment will be described. FIG. 41 is a schematic plan view illustrating a configuration of a part of the semiconductor memory device according to the fifth embodiment. FIG. 42 is a schematic perspective view illustrating a configuration of a part of the semiconductor memory device according to the fifth embodiment. FIG. 43 is a schematic cross-sectional view illustrating a configuration of a part of the semiconductor memory device according to the fifth embodiment.

The semiconductor memory device according to the fifth embodiment is basically configured similarly to the semiconductor memory device according to the fourth embodiment. However, as illustrated in FIG. 41, the semiconductor memory device according to the fifth embodiment includes a memory die MD5 instead of the memory die MD4. The memory die MD5 is basically configured similarly to the memory die MD4. However, in the memory die MD5, each of the memory cell array regions $R_{MCA}$ includes four conductive layers 512 instead of one conductive layer 112. For example, as illustrated as examples in FIG. 42 and FIG. 43, these four conductive layers 512 are spaced from one another in the X-direction.

The first conductive layer 512 counted from one side in the X-direction (for example, the negative side in the X-direction in FIG. 41 and FIG. 42) is disposed across the whole first memory hole region $R_{MH}$ counted from one side in the X-direction and the whole third hook-up region $R_{HU3}$ corresponding to this. This conductive layer 512 functions as a source line SL0a corresponding to the circuit blk0a (FIG. 33).

The second conductive layer 512 counted from one side in the X-direction is disposed across the whole second memory hole region $R_{MH}$ counted from one side in the X-direction and the whole first hook-up region $R_{HU1}$ and a part of the second hook-up region $R_{HU2}$ corresponding to this. This conductive layer 512 functions as a source line SL0b corresponding to the circuit blk0b (FIG. 33).

The third conductive layer 512 counted from one side in the X-direction is disposed across the whole third memory hole region $R_{MH}$ counted from one side in the X-direction and the whole first hook-up region $R_{HU1}$ and a part of the second hook-up region $R_{HU2}$ corresponding to this. This conductive layer 512 functions as a source line SL1a corresponding to the circuit blk1a (FIG. 33).

The fourth conductive layer 512 counted from one side in the X-direction is disposed across the whole fourth memory hole region $R_{MH}$ counted from one side in the X-direction and the whole third hook-up region $R_{HU3}$ corresponding to this. This conductive layer 512 functions as a source line SL1b corresponding to the circuit blk1b (FIG. 33).

The semiconductor memory device according to the fifth embodiment can apply different voltages to these four conductive layers 512.

The semiconductor memory device according to the fifth embodiment is configured to be able to independently erase the data in the memory cells MC in the circuit blk0a, the memory cells MC in the circuit blk0b, the memory cells MC in the circuit blk1a, and the memory cells MC in the circuit blk1b.

[Effects]

The semiconductor memory device according to the fifth embodiment allows reducing the voltage difference between the drain-side select gate line corresponding to the memory cells MC that are not the targets for erase operation and the dummy word line DWL5 at the erase operation. Additionally, the voltage difference between the source-side select gate line corresponding to the memory cells MC that are not the targets for erase operation and the dummy word line DWL0 can be reduced, thus allowing reducing the leakage current as described above.

Other Embodiments

The semiconductor memory devices according to the first embodiment to the fifth embodiment have been described above. However, the semiconductor memory devices according to these embodiments are only examples and specific configurations, operations, and the like are adjustable as appropriate.

For example, the semiconductor memory device according to the first embodiment is configured to be able to perform the erase operation corresponding to FIG. 21 and the erase operation corresponding to FIG. 24. The command set $CS_{E0}$ (FIG. 25) used to perform the erase operation corresponding to FIG. 24 is different from the command set $CS_{E1}$ (FIG. 26) used to perform the erase operation corresponding to FIG. 21. This method may be applied to, for example, not only the erase operation but also the read operation and the write operation.

For example, as described with reference to FIG. 19 and FIG. 20, the semiconductor memory device according to the first embodiment is configured to be able to perform the read operation and the write operation in which any one of the string units SU0 to SU9 and one page corresponding to one selected word line WL are the execution unit. In addition to this, the semiconductor memory device according to the first embodiment may be configured to be able to perform the read operation and the write operation in which any one of the string units SU0 and SU5, the string units SU1 and SU6, the string units SU2 and SU7, the string units SU3 and SU8, and the string units SU4 and SU9 and two pages corresponding to one selected word line WL are the execution units.

For example, in the semiconductor memory device according to the first embodiment, the common string address may be allocated to the string unit SU0 and the string unit SU5 or the different string addresses may be allocated. Similarly, the common string address may be allocated to each of the string units SU1 and SU6, the string units SU2 and SU7, the string units SU3 and SU8, and the string units SU4 and SU9, or the different string addresses may be allocated.

When the common string address is allocated to each of the string units SU0 and SU5, the string units SU1 and SU6, the string units SU2 and SU7, the string units SU3 and SU8, and the string units SU4 and SU9, the page as the execution unit of the read operation and the write operation may be shared by the combination of these string units SU. For example, when the memory cell MC stores N-bit (N is an integer of one or more) data, the string units SU0 and SU5 may include the number of pages N times of the number of word lines WL included in the memory block BLK. In this case, these plurality of pages may each store the data having the same number of bits as the number of the memory strings MS included in the string units SU0 and SU5. Similarly, each of the string units SU1 and SU6, the string units SU2 and SU7, the string units SU3 and SU8, and the string units SU4 and SU9 may include the number of pages N times of the number of word lines WL included in the memory block BLK. In this case, these plurality of pages may each store the data having the same number of bits as the number of the memory strings MS included in the two string units SU.

In this case, for example, by inputting the predetermined command set to the memory die MD, the read operation and the write operation in which any one of the string units SU0 and SU5, the string units SU1 and SU6, the string units SU2 and SU7, the string units SU3 and SU8, and the string units SU4 and SU9 and the page corresponding to one selected word line WL are the execution unit of the operations may be performed. Moreover, by adding the data XXh as described with reference to FIG. 26 or the command data $D_{CMD}$ corresponding to this to this command set, the read operation and the write operation that target only one of the configuration in the circuit blk0 and the configuration in the circuit blk1 as described with reference to FIG. 19 and FIG. 20 may be performed.

When different string addresses are allocated to the respective string unit SU0 and SU5, string units SU1 and SU6, string units SU2 and SU7, string units SU3 and SU8, and string units SU4 and SU9, for example, by inputting the predetermined command set to the memory die MD, the read operation and the write operation as described with reference to FIG. 19 and FIG. 20 may be performed.

Additionally, the erase operation corresponding to FIG. 21 and the erase operation corresponding to FIG. 24 may be distinguished by means other than the command set. Similarly, the read operation and the write operation described with reference to FIG. 19 and FIG. 20, and the read operation and the write operation in which the configurations corresponding to any one of the string units SU0 and SU5, the string units SU1 and SU6, the string units SU2 and SU7, the string units SU3 and SU8, and the string units SU4 and SU9 and one selected word line WL are the execution unit of the operations may be distinguished by means other than the command set. As the means other than the command set, for example, disposing the pad electrodes P (FIG. 2 and FIG. 3) for distinction is considered. As the means other than the command set, for example, the semiconductor memory device may be configured to be operable in two patterns of operation modes, an operation mode of performing the erase operation or the like corresponding to FIG. 21 or the like and an operation mode of performing the erase operation or the like corresponding to FIG. 24 or the like. The semiconductor memory device may be configured to ensure switching the operation modes by selecting an operation parameter.

The voltages as shown in FIG. 21 to FIG. 23 as the examples are appropriately adjustable.

For example, the voltages applied to the bit line BL, the drain-side select gate lines SGD5 to SGD9 and SGDT1, the source line SL, and the source-side select gate lines SGS1 and SGSB1 may be voltages of different magnitudes. Similarly, the voltages applied to the dummy word lines DWL5 and DWL0 may have different magnitudes. Similarly, the voltages applied to the drain-side select gate line SGDT0, the dummy word lines DWL4 and DWL1, and the source-side select gate line SGSB0 may have different magnitudes. Similarly, the voltages applied to the dummy word lines DWL3 and DWL2 may have different magnitudes.

Figure 44:
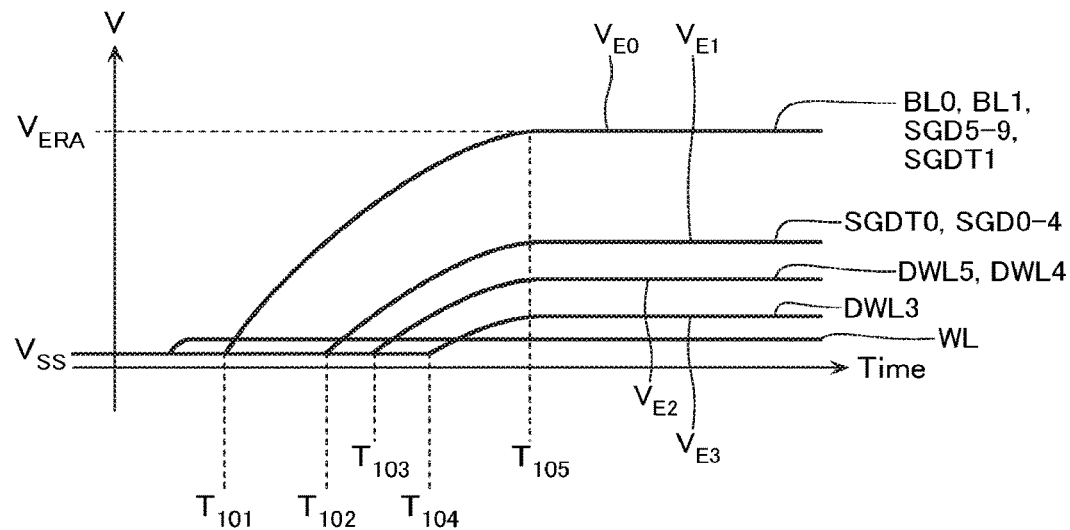
FIG. 44 is a schematic waveform diagram to describe an erase operation of a semiconductor memory device according to another embodiment.
Figure 45:
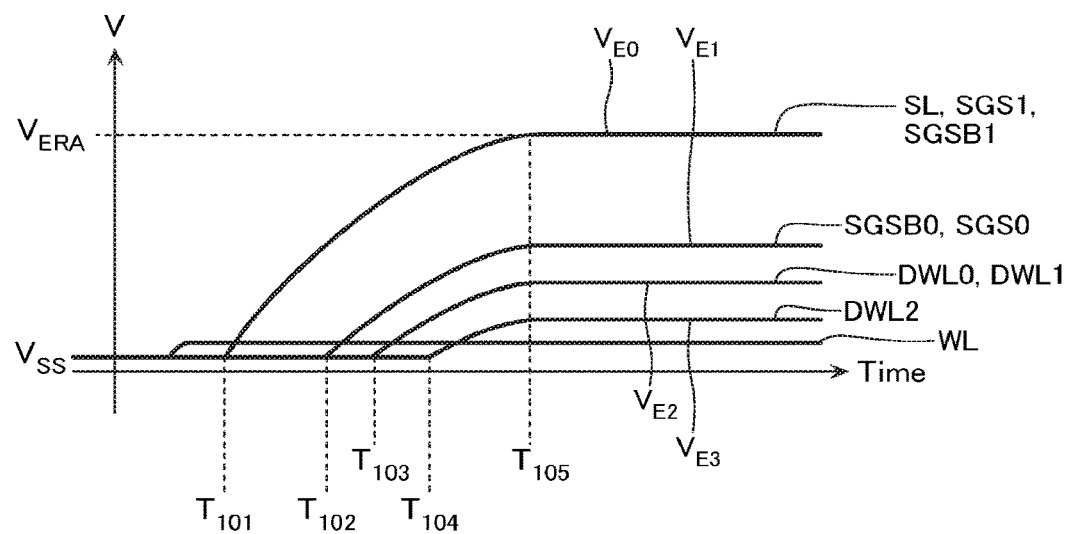
FIG. 45 is a schematic waveform diagram to describe an erase operation of a semiconductor memory device according to another embodiment.

For example, an initial voltage (the voltage at timing $T_{101}$ in FIG. 22 and FIG. 23) applied to each of the wirings need not be the ground voltage $V_{SS}$. For example, in the examples of FIG. 44 and FIG. 45, after the erase operation starts, the predetermined voltage is applied to the word line WL at the timing before timing $T_{101}$. The voltage of the word line WL is larger than the ground voltage $V_{SS}$. The voltage of the word line WL is smaller than the voltage applied to the dummy word lines DWL3 and DWL2 at and after timing $T_{105}$.

Moreover, the voltages shown in FIG. 30 to FIG. 32 as examples are appropriately adjustable.

At least one of the drain-side select transistor STDT and the source-side select transistor STSB can be omitted. In this case, at least one of the functions of the drain-side select transistor STDT and the source-side select transistor STSB may be achieved by at least one of the drain-side select transistor STD and the source-side select transistor STS.

Figure 46:
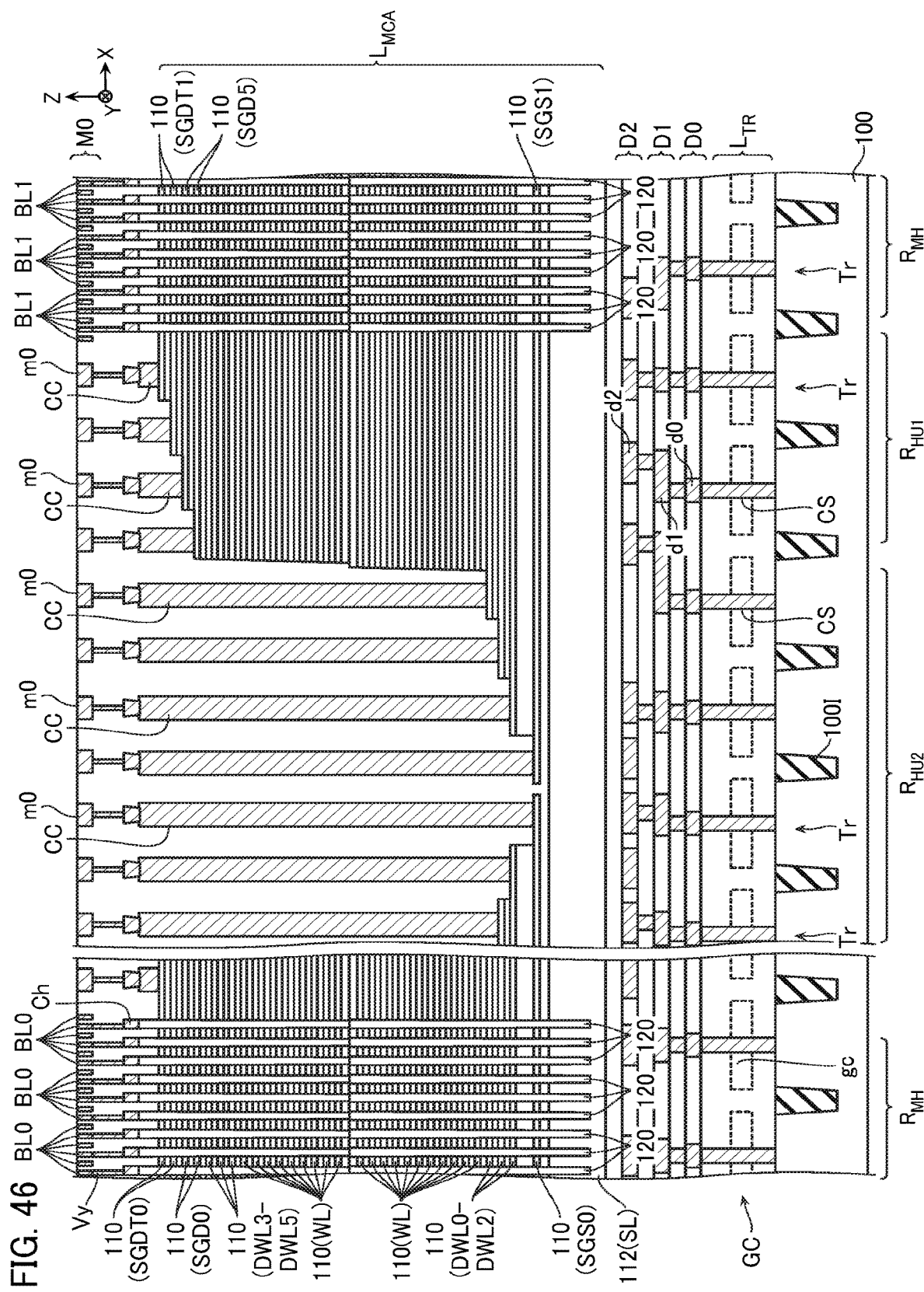
FIG. 46 is a schematic cross-sectional view illustrating a configuration of a part of a semiconductor memory device according to another embodiment.

For example, the example of FIG. 46 omits the source-side select transistor STSB. Among the plurality of conductive layers 110 stacked in the Z-direction, the conductive layer 110 disposed as the lowermost layer functions as the source-side select transistor STS.

Figure 47:
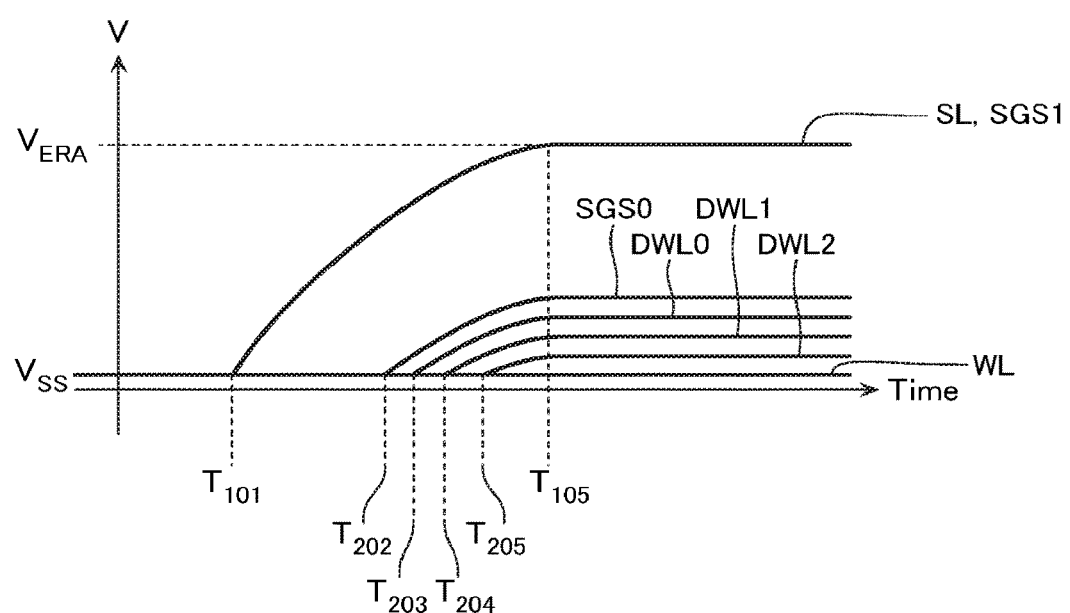
FIG. 47 is a schematic waveform diagram to describe an erase operation of a semiconductor memory device according to another embodiment.

FIG. 47 is a schematic waveform diagram to describe the erase operation of the semiconductor memory device as illustrated in FIG. 46. FIG. 47 illustrates an example of the voltages applied to the source line SL, the source-side select gate lines SGS0 and SGS1, the dummy word lines DWL0 to DWL2, and the word line WL.

In the example of FIG. 47, the ground voltage $V_{SS}$ is applied to each wiring at timing $T_{101}$ in the erase operation.

At timing $T_{101}$ in the erase operation, the application of the voltage to the source line SL and the source-side select gate line SGS1 is started.

At timing $T_{202}$, the application of the voltage to the source-side select gate line SGS0 is started. In the illustrated example, voltage differences between the source line SL and the source-side select gate lines SGS0 and SGS1 are maintained from timing $T_{202}$ to at and after timing $T_{105}$.

At timing $T_{203}$, the application of the voltage to the dummy word line DWL0 is started. In the illustrated example, from timing $T_{203}$ to at and after timing $T_{105}$, voltage differences between the source line SL, the source-side select gate lines SGS0 and SGS1, and the dummy word line DWL0 are maintained.

At timing $T_{204}$, the application of the voltage to the dummy word line DWL1 is started. In the illustrated example, from timing $T_{204}$ to at and after timing $T_{105}$, voltage differences between the source line SL, the source-side select gate lines SGS0 and SGS1, and the dummy word lines DWL0 and DWL1 are maintained.

At timing $T_{205}$, the application of the voltage to the dummy word line DWL2 is started. In the illustrated example, from timing $T_{205}$ to timing $T_{105}$, voltage difference between the source line SL, the source-side select gate lines SGS0 and SGS1 and the dummy word lines DWL0, DWL1, and DWL2 is maintained.

In the semiconductor memory device according to the third embodiment as well, the common string address may be allocated to each of the string units SU0 and SU5, the string units SU1 and SU6, the string units SU2 and SU7, the string units SU3 and SU8, and the string units SU4 and SU9, or the different string addresses may be allocated.

In the semiconductor memory device according to the third embodiment as well, similarly to the semiconductor memory device according to the second embodiment, the configuration corresponding to the circuit blk0 may be the memory block BLK0 and the configuration corresponding to the circuit blk1 may be the memory block BLK1, and the different block addresses may be allocated to these two memory blocks BLK0 and BLK1.

In the semiconductor memory devices according to the fourth embodiment and the fifth embodiment as well, the common string address may be allocated to the string units SU0a, SU0b, SU5a, and SU5b or the different string addresses may be allocated. Similarly, the common string address may be allocated to the string units SU1a, SU1b, SU6a, and SU6b, the string units SU2a, SU2b, SU7a, and SU7b, the string units SU3a, SU3b, SU8a, and SU8b, and the string units SU4a, SU4b, SU9a, and SU9b, or the different string addresses may be allocated.

In the semiconductor memory devices according to the fourth embodiment and the fifth embodiment as well, similarly the semiconductor memory device according to the second embodiment, the configurations corresponding to the circuits blk0a, blk0b, blk1a, and blk1b may be the four different memory blocks, and the different block addresses may be allocated to these four memory blocks.

In the semiconductor memory devices according to the first embodiment to the fifth embodiment, for example, as described with reference to FIG. 9, the transistor layer $L_{TR}$, the wiring layers D0 to D2, the memory cell array layer $L_{MCA}$, the wiring layer M0, and the plurality of wiring layers (not illustrated) are disposed in the order on the semiconductor substrate 100.

Figure 48:
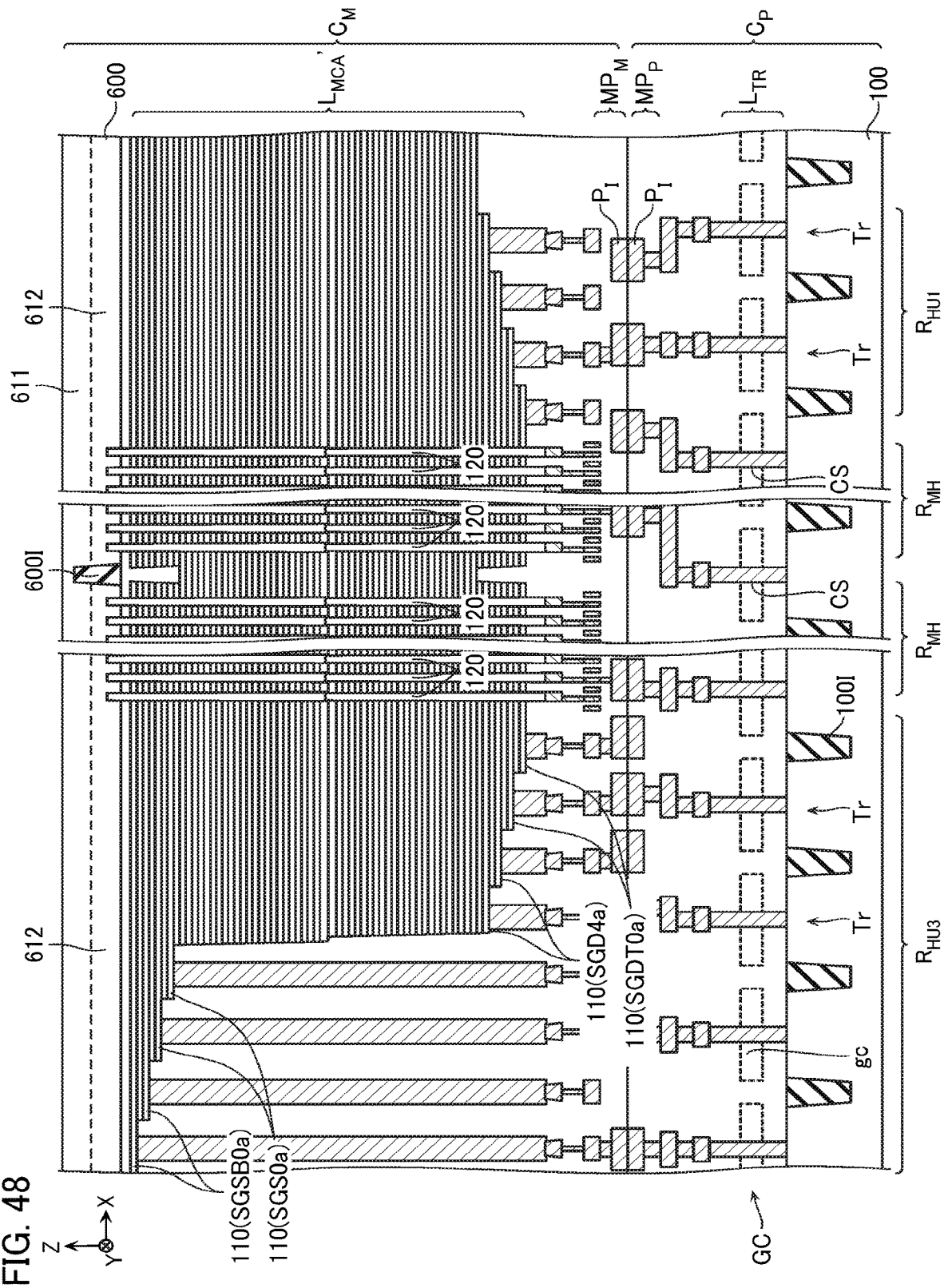
FIG. 48 is a schematic cross-sectional view illustrating a configuration of a part of a semiconductor memory device according to another embodiment.

However, for example, as illustrated in FIG. 48, the memory die included in the semiconductor memory device may include chips $C_M$ and CP.

The chip $C_M$ includes a semiconductor substrate 600, a memory cell array layer $L_{MCA}'$ disposed below the semiconductor substrate 600, a plurality of wiring layers disposed below the memory cell array layer $L_{MCA}'$, and a bonding electrode layer $MP_M$. Note that FIG. 48 omits the illustration of the plurality of wiring layers.

The semiconductor substrate 600 is, for example, a semiconductor substrate made of P-type silicon (Si) containing P-type impurities, such as boron (B). On a surface (a lower surface) of the semiconductor substrate 600, an N-type well region 611 containing N-type impurities, such as phosphorus (P), P-type well regions 612 containing P-type impurities, such as boron (B), a semiconductor substrate region on which the N-type well region 611 or the P-type well region 612 is not disposed, and an insulating region 6001 of, for example, silicon oxide ($SiO_2$) are disposed. The P-type well region 612 may be disposed in, for example, the region corresponding to the conductive layer 112 (FIG. 9), 312 (FIG. 28, and FIG. 29), or 512 (FIG. 41, and FIG. 42) on the semiconductor substrate 600. Note that in the illustrated example, between the respective regions corresponding to the source lines SL0a, SL0b, SL1a, and SL1b in FIG. 41 and FIG. 42, the P-type well region 612 is separated by the insulating region 6001.

The memory cell array layer $L_{MCA}'$ is basically configured similarly to the memory cell array layers $L_{MCA}$ according to the first embodiment to the fifth embodiment. However, the memory cell array layer $L_{MCA}'$ does not include the conductive layer 112, 312, or 512. The upper ends of the semiconductor columns 120 in the memory cell array layer $L_{MCA}'$ are connected to the P-type well regions 612 of the semiconductor substrate 600.

The bonding electrode layer $MP_M$ includes a plurality of bonding electrodes $P_I$. These plurality of bonding electrodes $P_I$ are, for example, electrically connected to at least one of the configurations in the plurality of chips $C_M$ and $C_P$. The plurality of wirings m0 may include, for example, a stacked film of a barrier conductive film, such as titanium nitride (TiN) and tantalum nitride (TaN), and a metal film, such as copper (Cu), or the like.

The chip $C_P$ includes the semiconductor substrate 100, the transistor layer $L_{TR}$ disposed above the semiconductor substrate 100, a plurality of wiring layers disposed above the transistor layer $L_{TR}$, and a bonding electrode layer $MP_P$ disposed above these plurality of wiring layers. Note that FIG. 48 omits the illustration of the plurality of wiring layers.

The bonding electrode layer $MP_P$ includes the plurality of bonding electrode $P_1$ similarly to the bonding electrode layer $MP_M$.

The chip $C_M$ and the chip $C_P$ are connected via the plurality of bonding electrodes $P_I$. The configuration in the chip $C_M$ and the configuration in the chip $C_P$ are electrically connected via the plurality of bonding electrodes $P_I$.

Figure 49:
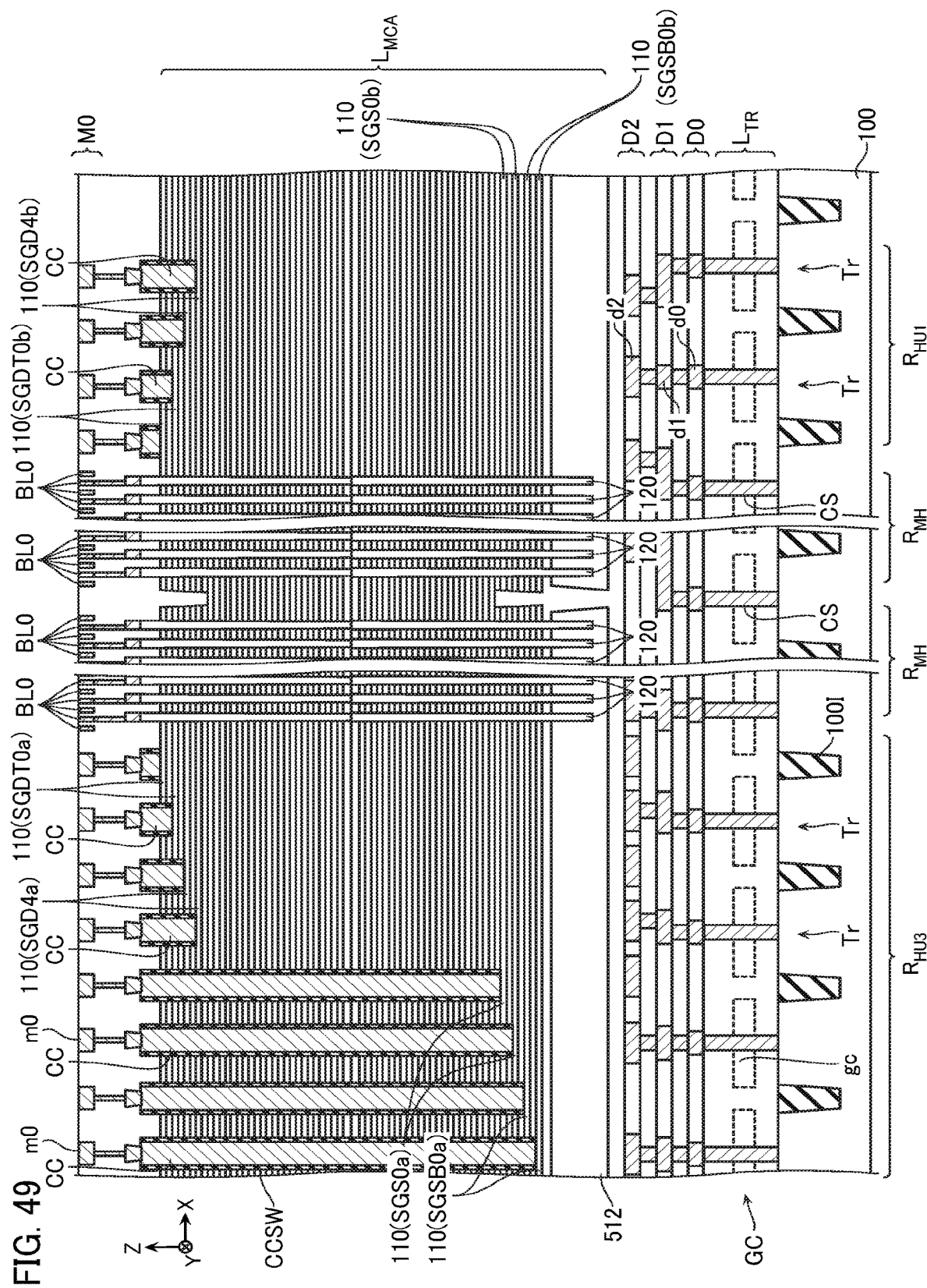
FIG. 49 is a schematic cross-sectional view illustrating a configuration of a part of a semiconductor memory device according to another embodiment.

As illustrated in FIG. 49, the contact CC may have a structure of passing through the plurality of conductive layers 110 and extending in the Z-direction. For example, as illustrated in FIG. 49, the contact CC may have insulating layers CCSW of, for example, silicon oxide ($SiO_2$) on its outer circumferential surface. The outer circumferential surface of the contact CC may be opposed to the one or plurality of conductive layers 110 via the insulating layers CCSW. Note that FIG. 49 illustrates an example of employing these contacts CC in the semiconductor memory device according to the fifth embodiment. However, these contacts CC may be employed to the semiconductor memory devices according to the first embodiment to the fourth embodiment.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a plurality of word lines extending over a first direction across a first region, a second region, a third region, a fourth region and a fifth region, the first region and the second region being arranged in the first direction, the third region being disposed between the first region and the second region, the fourth region being farther from the third region than the first region; the fifth region farther from the third region than the second region, and the plurality of word lines being arranged in a second direction intersecting with the first direction;
   a first select gate line that is disposed in the first region and farther from the substrate than the plurality of word lines;
   a second select gate line that is disposed in the first region and closer to the substrate than the plurality of word lines;
   a first semiconductor layer disposed in the first region, the first semiconductor layer extending in the second direction and penetrating the plurality of word lines, the first select gate line, and the second select gate line, the first semiconductor layer and one of the plurality of word lines forming a first memory cell;
   a first bit line extending in a third direction intersecting with the first direction and the second direction, the first bit line being disposed at a position overlapping with the first semiconductor layer viewed in the second direction;
   a third select gate line that is disposed in the second region and farther from the substrate than the plurality of word lines;
   a fourth select gate line that is disposed in the second region and closer to the substrate than the plurality of word lines;
   a second semiconductor layer disposed in the second region, the second semiconductor layer extending in the second direction and penetrating the plurality of word lines, the third select gate line, and the fourth select gate line, the second semiconductor layer and the one of the plurality of word lines forming a second memory cell;
   a second bit line extending in the third direction, the second bit line being disposed at a position overlapping with the second semiconductor layer viewed in the second direction;

a word line contact electrode disposed in the third region, the word line contact electrode extending in the second direction and being connected to one of the plurality of word lines;

a fifth select gate line that is disposed in the fourth region and farther from the substrate than the plurality of word lines;

a sixth select gate line that is disposed in the fourth region and closer to the substrate than the plurality of word lines;

a third semiconductor layer disposed in the fourth region, the third semiconductor layer extending in the second direction and being opposed to the plurality of word lines, the fifth select gate line, and the sixth select gate line;

a third bit line extending in the third direction, the third bit line being disposed at a position overlapping with the third semiconductor layer viewed in the second direction;

a seventh select gate line that is disposed in the fifth region and farther from the substrate than the plurality of word lines;

an eighth select gate line that is disposed in the fifth region and closer to the substrate than the plurality of word lines;

a fourth semiconductor layer disposed in the fifth region, the fourth semiconductor layer extending in the second direction and being opposed to the plurality of word lines, the seventh select gate line, and the eighth select gate line;

a fourth bit line extending in the third direction, the fourth bit line bein; disposed at a position overlapping with the fourth semiconductor layer viewed in the second direction;

a first circuit connected to the first select gate line and the second select gate line, the first circuit configured to supply voltages to the first select gate line and the second select gate line; and a second circuit connected to the third select gate line and the fourth gate line, the second circuit configured to supply voltages to the third select gate line and the fourth gate line.

2. The semiconductor memory device according to claim 1, further comprising:
a first transistor electrically connected to the first select gate line;
a second transistor electrically connected to the second select gate line;
a third transistor electrically connected to the third select gate line; and
a fourth transistor electrically connected to the fourth select gate line.

3. The semiconductor memory device according to claim 1, further comprising:
a first contact electrode disposed in the third region, the first contact electrode extending in the second direction and being connected to the first select gate line;
a second contact electrode disposed in the third region, the second contact electrode extending in the second direction and being connected to the second select gate line;
a third contact electrode disposed in the third region, the third contact electrode extending in the second direction and being connected to the third select gate line; and
a fourth contact electrode disposed in the third region, the fourth contact electrode extending in the second direction and being connected to the fourth select gate line.

4. The semiconductor memory device according to claim 1, further comprising
a source line connected to the first semiconductor layer and the second semiconductor layer.

5. The semiconductor memory device according to claim 1, further comprising a control circuit configured to perform a first erase operation by:
applying a first voltage to the first select gate line;
applying a second voltage to the second select gate line;
applying a third voltage to the third select gate line; and
applying a fourth voltage to the fourth select gate line, wherein
the first voltage is smaller than the third voltage, and
the second voltage is smaller than the fourth voltage.

6. The semiconductor memory device according to claim 5, further comprising
a source line connected to the first semiconductor layer and the second semiconductor layer, wherein
the control circuit configured to perform the first erase operation by:
applying a first erase voltage larger than the first voltage and the second voltage to the first bit line; and
applying a second erase voltage larger than the first voltage and the second voltage to the source line.

7. The semiconductor memory device according to claim 1, further comprising:
a first source line connected to the first semiconductor layer; and
a second source line connected to the second semiconductor layer.

8. The semiconductor memory device according to claim 1, further comprising a control circuit configured to perform a first erase operation by:
applying a first voltage to the first select gate line;
applying a second voltage to the second select gate line;
applying a third voltage to the third select gate line; and
applying a fourth voltage to the fourth select gate line, wherein
the first voltage is larger than the third voltage, and
the second voltage is larger than the fourth voltage.

9. The semiconductor memory device according to claim 8, further comprising:
a first source line connected to the first semiconductor layer; and
a second source line connected to the second semiconductor layer, wherein the control circuit configured to perform the first erase operation by:
applying a first erase voltage larger than the first voltage and the second voltage to the first bit line;
applying a fifth voltage smaller than the first erase voltage to the second bit line;
applying a second erase voltage larger than the first voltage and the second voltage to the first source line; and
applying a sixth voltage smaller than the second erase voltage to the second source line.

10. The semiconductor memory device according to claim 1, further comprising:
a fifth transistor electrically connected to the fifth select gate line;
a sixth transistor electrically connected to the sixth select gate line;
a seventh transistor electrically connected to the seventh select gate line; and
an eighth transistor electrically connected to the eighth select gate line.

11. The semiconductor memory device according to claim 1, wherein
the substrate includes:
a sixth region farther from the third region than the fourth region; and
a seventh region farther from the third region than the fifth region, and the semiconductor memory device comprises:
a fifth contact electrode disposed in the sixth region, the fifth contact electrode extending in the second direction and being connected to the fifth select gate line;
a sixth contact electrode disposed in the sixth region, the sixth contact electrode extending in the second direction and being connected to the sixth select gate line;
a seventh contact electrode disposed in the seventh region, the seventh contact electrode extending in the second direction and being connected to the seventh select gate line; and
an eighth contact electrode disposed in the seventh region, the eighth contact electrode extending in the second direction and being connected to the eighth select gate line.

12. The semiconductor memory device according to claim 1, further comprising
a source line connected to the third semiconductor layer and the fourth semiconductor layer.

13. The semiconductor memory device according to claim 1, further comprising:
a first source line connected to the first semiconductor layer;
a second source line connected to the second semiconductor layer;
a third source line connected to the third semiconductor layer; and
a fourth source line connected to the fourth semiconductor layer.

14. The semiconductor memory device according to claim 1, further comprising:
a plurality of first memory cells disposed between the first select gate line and the second select gate line;
a plurality of second memory cells disposed between the third select gate line and the fourth select gate line; and
a control circuit configured to perform a first erase operation corresponding to an input of a first command set, wherein
the first command set includes information to designate any one of the plurality of first memory cells or the plurality of second memory cells.

15. The semiconductor memory device according to claim 14, further comprising:
a first memory block that includes the plurality of first memory cells; and
a second memory block that includes the plurality of second memory cells.

16. The semiconductor memory device according to claim 1, further comprising:
a plurality of first memory cells disposed between the first select gate line and the second select gate line;
a plurality of second memory cells disposed between the third select gate line and the fourth select gate line;
a plurality of third memory cells disposed between the fifth select gate line and the sixth select gate line;
a plurality of fourth memory cells disposed between the seventh select gate line and the eighth select gate line; and
a control circuit configured to perform a first erase operation corresponding to an input of a first command set, wherein
the first command set includes information to designate any of the plurality of first memory cells, the plurality of second memory cells, the plurality of third memory cells, or the plurality of fourth memory cells.

17. The semiconductor memory device according to claim 16, further comprising:
a first memory block that includes the plurality of first memory cells;
a second memory block that includes the plurality of second memory cells;
a third memory block that includes the plurality of third memory cells; and
a fourth memory block that includes the plurality of fourth memory cells.

18. A semiconductor memory device comprising:
a substrate;
a plurality of word lines disposed over the substrate in a first region, a second region, a third region, a fourth region and a fifth region, the plurality of word lines extending in a first direction, the first region and the second region being arranged in the first direction, the third region being disposed between the first region and the second region, the fourth region being farther from the third region than the first region; the fifth region being farther from the third region than the second region, and the plurality of word lines being arranged in a second direction intersecting with the first direction;
a first select gate line that is disposed in the first region and farther from the substrate than the plurality of word lines;
a second select gate line that is disposed in the first region and closer to the substrate than the plurality of word lines;
a first semiconductor layer disposed in the first region, the first semiconductor layer extending in the second direction and penetrating the plurality of word lines, the first select gate line, and the second select gate line;
a first bit line extending in a third direction intersecting with the first direction and the second direction, the first bit line being disposed at a position overlapping with the first semiconductor layer viewed in the second direction;
a third select gate line that is disposed in the second region and farther from the substrate than the plurality of word lines;
a fourth select gate line that is disposed in the second region and closer to the substrate than the plurality of word lines;
a second semiconductor layer disposed in the second region, the second semiconductor layer extending in the second direction and penetrating being opposed to the plurality of word lines, the third select gate line, and the fourth select gate line;
a second bit line extending in the third direction, the second bit line being disposed at a position overlapping with the second semiconductor layer viewed in the second direction; and
a word line contact electrode disposed in the third region, the word line contact electrode extending in the second direction and being connected to one of the plurality of word lines;

a fifth select gate line that is disposed in the fourth region and farther from the substrate than the plurality of word lines;

a sixth select gate line that is disposed in the fourth region and closer to the substrate than the plurality of word lines;

a third semiconductor layer disposed in the fourth region, the third semiconductor layer extending in the second direction and being opposed to the plurality of word lines, the fifth select gate line, and the sixth select gate line;

a third bit line extending in the third direction, the third bit line being disposed at a position overlapping with the third semiconductor layer viewed in the second direction;

a seventh select gate line that is disposed in the fifth region and farther from the substrate than the plurality of word lines;

an eighth select gate line that is disposed in the fifth region and closer to the substrate than the plurality of word lines;

a fourth semiconductor layer disposed in the Fifth region, the fourth semiconductor layer extending in the second direction and being opposed to the plurality of word lines, the seventh select gate line, and the eighth select gate line; and a fourth bit line extending in the third direction, the fourth bit line being disposed at a position overlapping with the fourth semiconductor layer viewed in the second direction.

19. The semiconductor memory device according to claim 18, further comprising:

a first circuit connected to the first select gate line and the second select gate line, the first circuit configured to erase a first memory cell disposed in the first region; and a second circuit connected to the third select gate line and the fourth gate line, the second circuit configured to erase a second memory cell disposed in the second region.

20. The semiconductor memory device according to claim 18, further comprising:

first memory cells being disposed in the first region connected to the word lines; and second memory cells being disposed in the second region connected to the word lines.

* * * * *